(12) United States Patent
Watanabe et al.

(10) Patent No.: US 8,223,546 B2
(45) Date of Patent: Jul. 17, 2012

(54) MULTI-DOT FLASH MEMORY

(75) Inventors: Hiroshi Watanabe, Yokohama (JP); Makoto Mizukami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 12/870,495

(22) Filed: Aug. 27, 2010

(65) Prior Publication Data

US 2011/0032762 A1 Feb. 10, 2011

Related U.S. Application Data

(63) Continuation of application No. PCT/JP2008/053688, filed on Feb. 29, 2008.

(51) Int. Cl.
*G11C 5/02* (2006.01)
*G11C 5/06* (2006.01)
*G11C 16/02* (2006.01)
*H01L 29/788* (2006.01)
*H01L 29/66* (2006.01)

(52) U.S. Cl. ............ 365/185.05; 365/185.16; 365/51; 365/63; 365/72; 257/316; 257/E21.422; 257/E29.3; 257/315; 257/320; 257/321; 257/319

(58) Field of Classification Search ............ 365/185.05, 365/185.16, 51, 63, 72; 257/E21.422, E29.3, 257/315, 316, 319, 320, 321
See application file for complete search history.

(56) References Cited

U.S. PATENT DOCUMENTS

| | | | | |
|---|---|---|---|---|
| 5,859,454 A | * | 1/1999 | Choi et al. | 257/316 |
| 6,151,248 A | * | 11/2000 | Harari et al. | 365/185.14 |
| 6,420,232 B1 | * | 7/2002 | Wu | 438/257 |
| 6,433,382 B1 | * | 8/2002 | Orlowski et al. | 257/315 |
| 6,563,728 B2 | * | 5/2003 | Kobayashi | 365/63 |
| 7,057,931 B2 | * | 6/2006 | Lutze et al. | 365/185.18 |
| 2004/0000688 A1 | * | 1/2004 | Harari et al. | 257/315 |
| 2007/0257299 A1 | * | 11/2007 | Chen et al. | 257/315 |
| 2010/0187594 A1 | | 7/2010 | Mizukami et al. | |
| 2010/0214840 A1 | | 8/2010 | Ichikawa et al. | |

(Continued)

FOREIGN PATENT DOCUMENTS

JP  2-218158  8/1990

(Continued)

OTHER PUBLICATIONS

International Preliminary Report on Patentability issued Oct. 21, 2010 in International Application No. PCT/JP2008/053688 (English Translation).

(Continued)

*Primary Examiner* — J. H. Hur
(74) *Attorney, Agent, or Firm* — Oblon, Spivak, McClelland, Maier & Neustadt, L.L.P.

(57) ABSTRACT

According to one embodiment, a multi-dot flash memory includes an active area, a floating gate arranged on the active area via a gate insulating film and having a first side and a second side facing each other in a first direction, a word line arranged on the floating gate via an inter-electrode insulating film, a first bit line arranged on the first side of the floating gate via a first tunnel insulating film and extending in a second direction intersecting the first direction, and a second bit line arranged on the second side of the floating gate via a second tunnel insulating film and extending in the second direction. The active area has a width in the first direction narrower than that between a center of the first bit line and a center of the second bit line.

18 Claims, 56 Drawing Sheets

U.S. PATENT DOCUMENTS

2011/0038213 A1   2/2011   Ichikawa et al.

FOREIGN PATENT DOCUMENTS

| JP | 6-97456 | 4/1994 |
|---|---|---|
| JP | 11-40784 | 2/1999 |
| JP | 2005-302996 | 10/2005 |

OTHER PUBLICATIONS

"Handbook of Flash Memory Technology", Fujio Masuoka (Chief editor), on Demand Publishing, Aug. 1993, 199-205.

Andrea Ghetti, et al., "3D Simulation study of gate coupling and gate cross-interference in advanced floating gate non-volatile memories", Solid-State Electronics, vol. 49, Issue 11, Nov. 2005, pp. 1805-1812.

Robert H. Dennard, et al., "Design of Ion-Implanted MOSFET's with Very Small Physical Dimensions", IEEE Journal of Solid-State Circuits, vol. 9, No. 5, 1974, pp. 256-268.

"Device that traveled in outer space, Non-volatile memory device technology for low-cost combined mounting 'MONOS'", Sony CX-PAL, Issue 52, Apr. 2002, 4 pages.

Ryuji Ohba, et al., "Silicon Nitride Trap Memory with Double Tunnel Junction", Symposium on VLSI Technology Digest of Technical Papers, 2003, pp. 35-36.

M. Shima, et al., "Tetrahedral shaped recess channel Hemt with a floating quantum dot gate", IEDM Tech. Dig., Dec. 1998, pp. 437-440.

TNT 2005, Aug. 29-Sep. 2, 2005, Oviedo-Spain, "Metalloporphyrins for memory applications", F. Duclairoir, et al., 1 page.

TNT 2006, Sep. 4-8, 2006, Grenoble-France, "Synthesis of Molecular memory using metallporphyrins monolayer on silicon surface", K. Huagn, et al., 1 page.

Appllied Physics Letters, vol. 84, No. 11, Mar. 15, 2004, pp. 1949-1951, 2004, "Multilevel memory based on molecular devices", C. Li, et al., 3 pages.

* cited by examiner

PRIOR ART

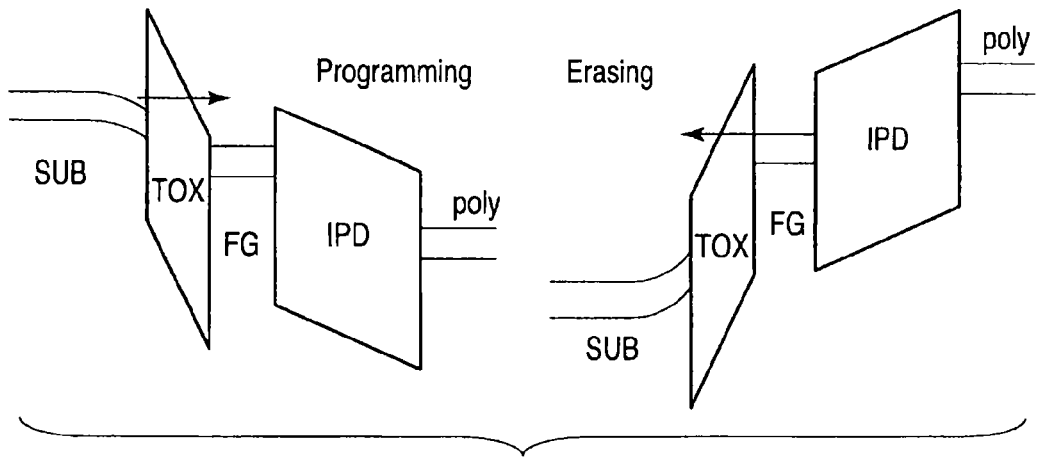
F I G. 3
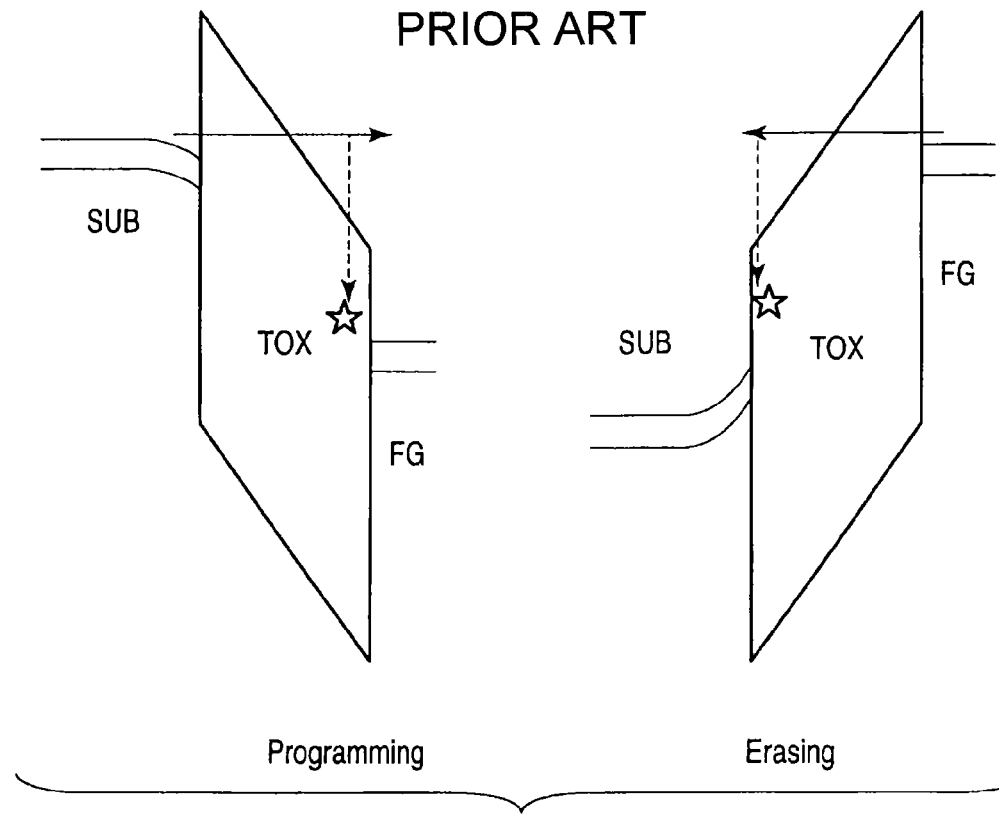
F I G. 4

PRIOR ART

Programming  Erasing

PRIOR ART

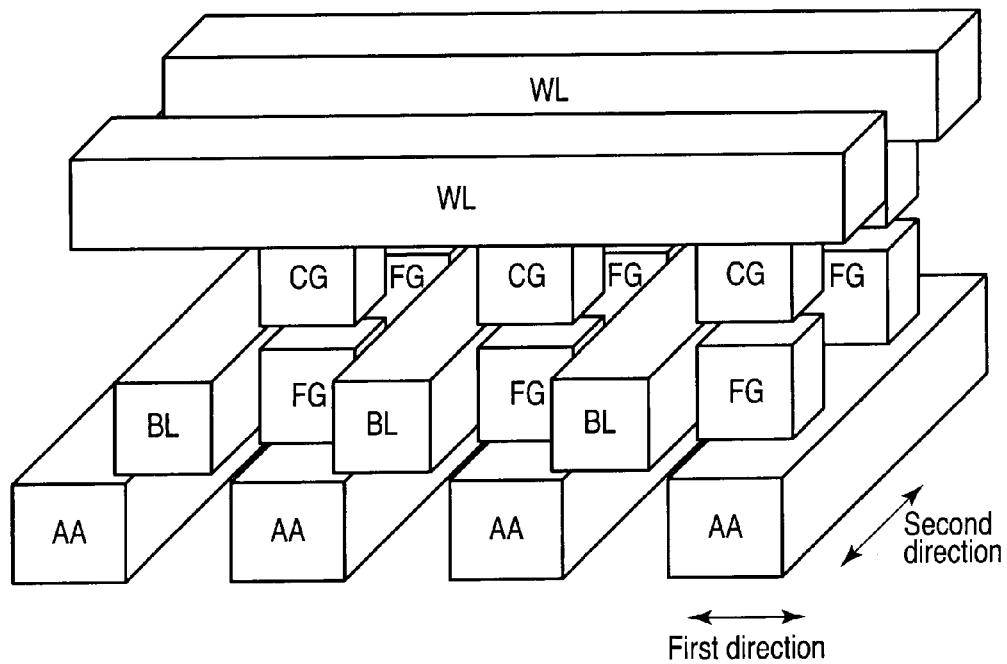
F I G. 13
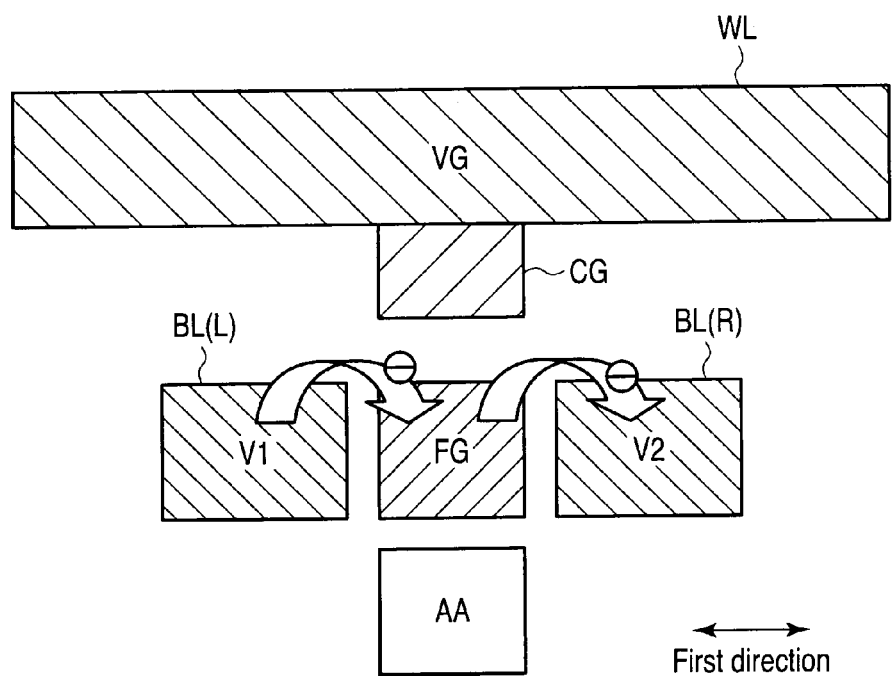
F I G. 14

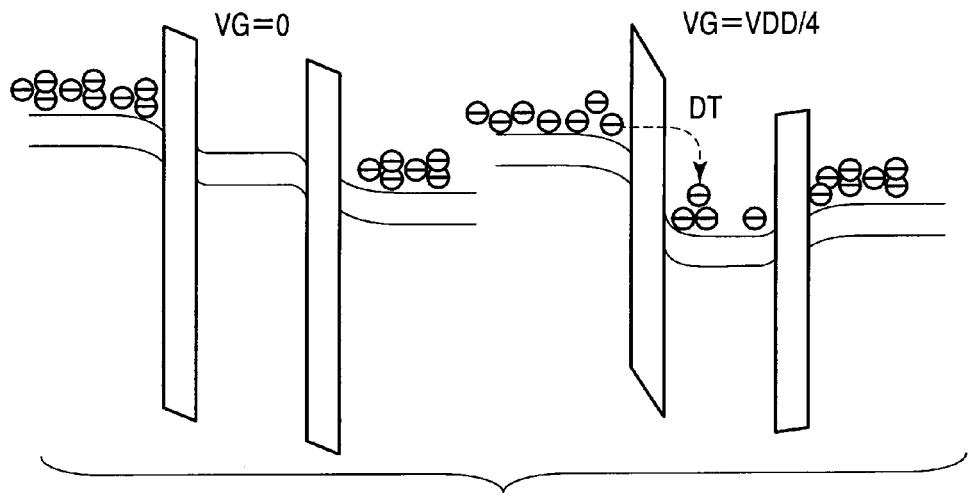
F I G. 17
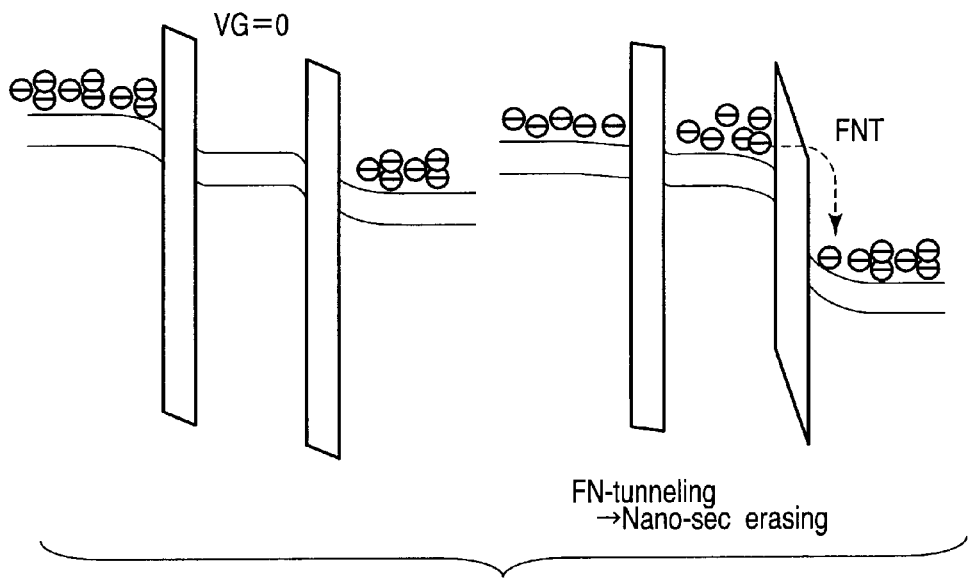
F I G. 18

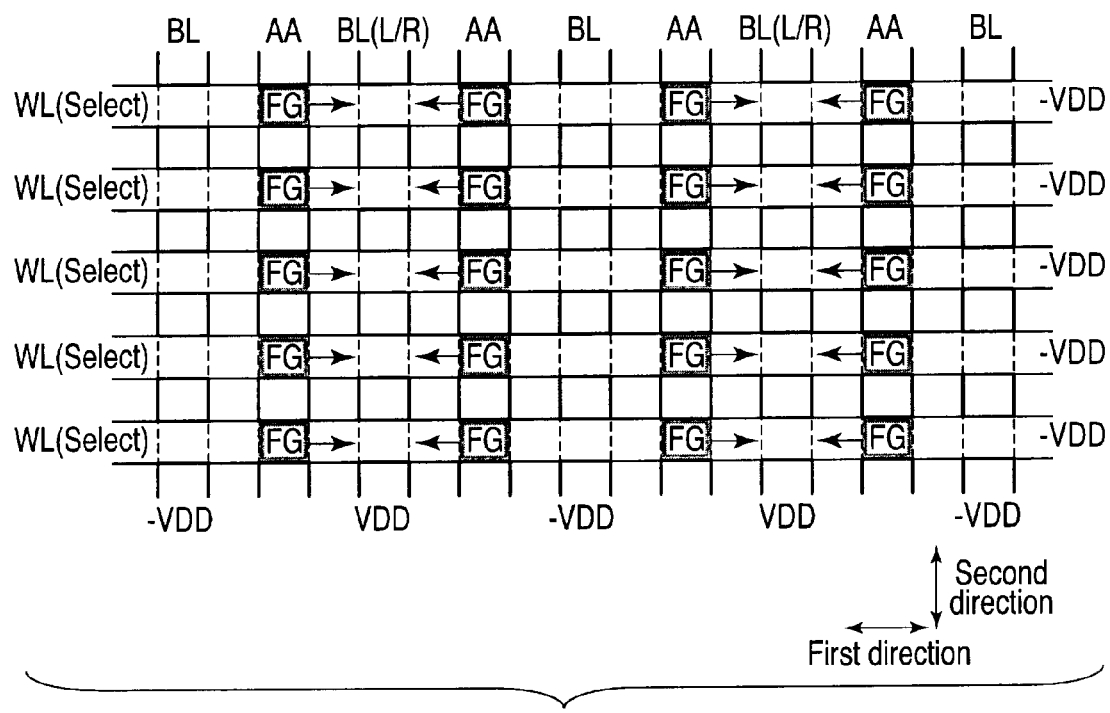
F I G. 31

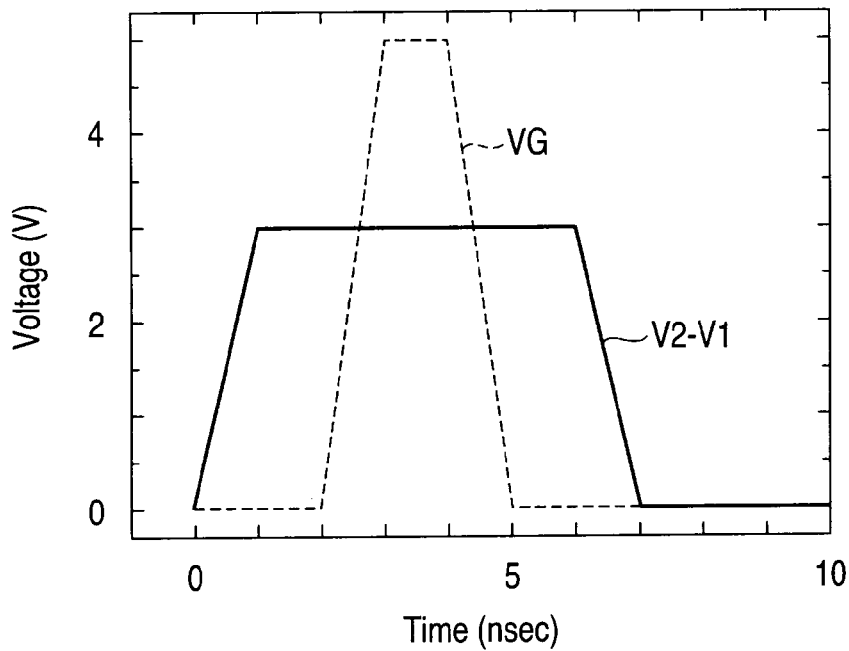
F I G. 32
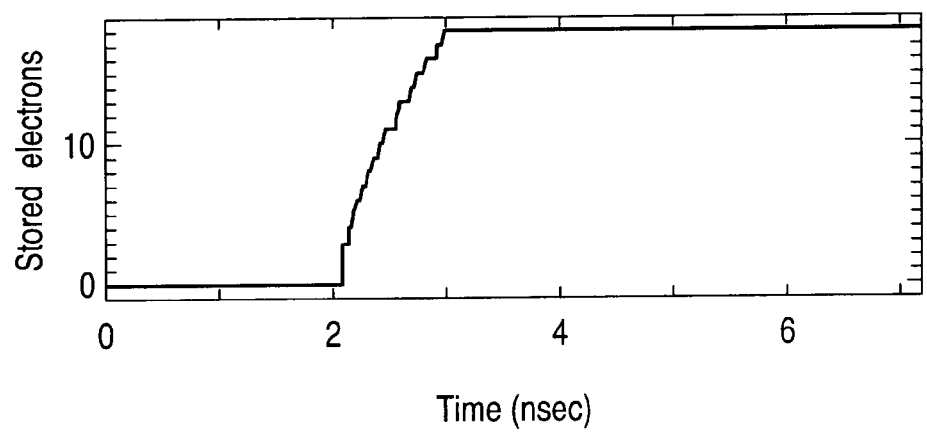
F I G. 33

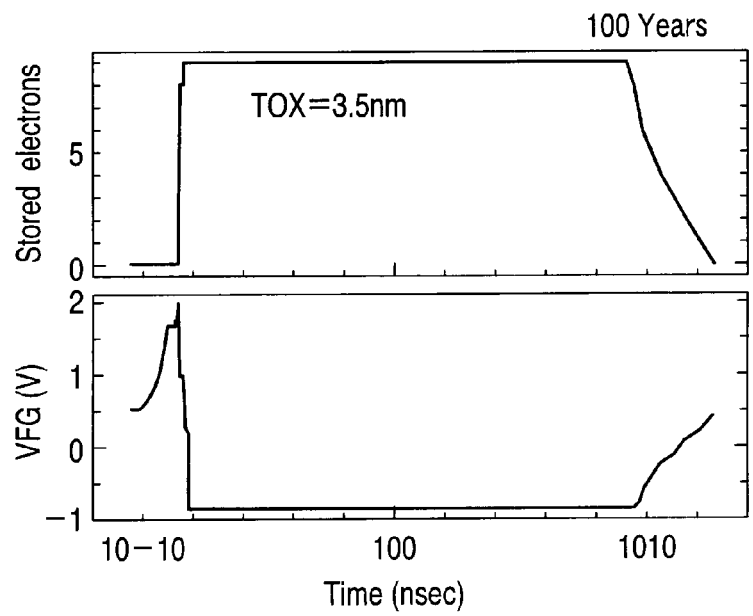
F I G. 34
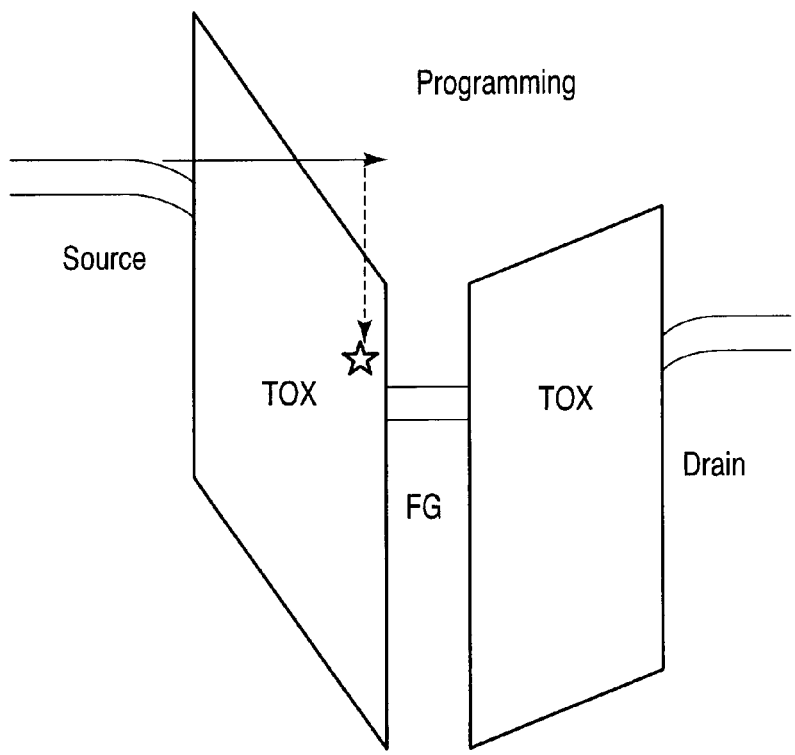
F I G. 35

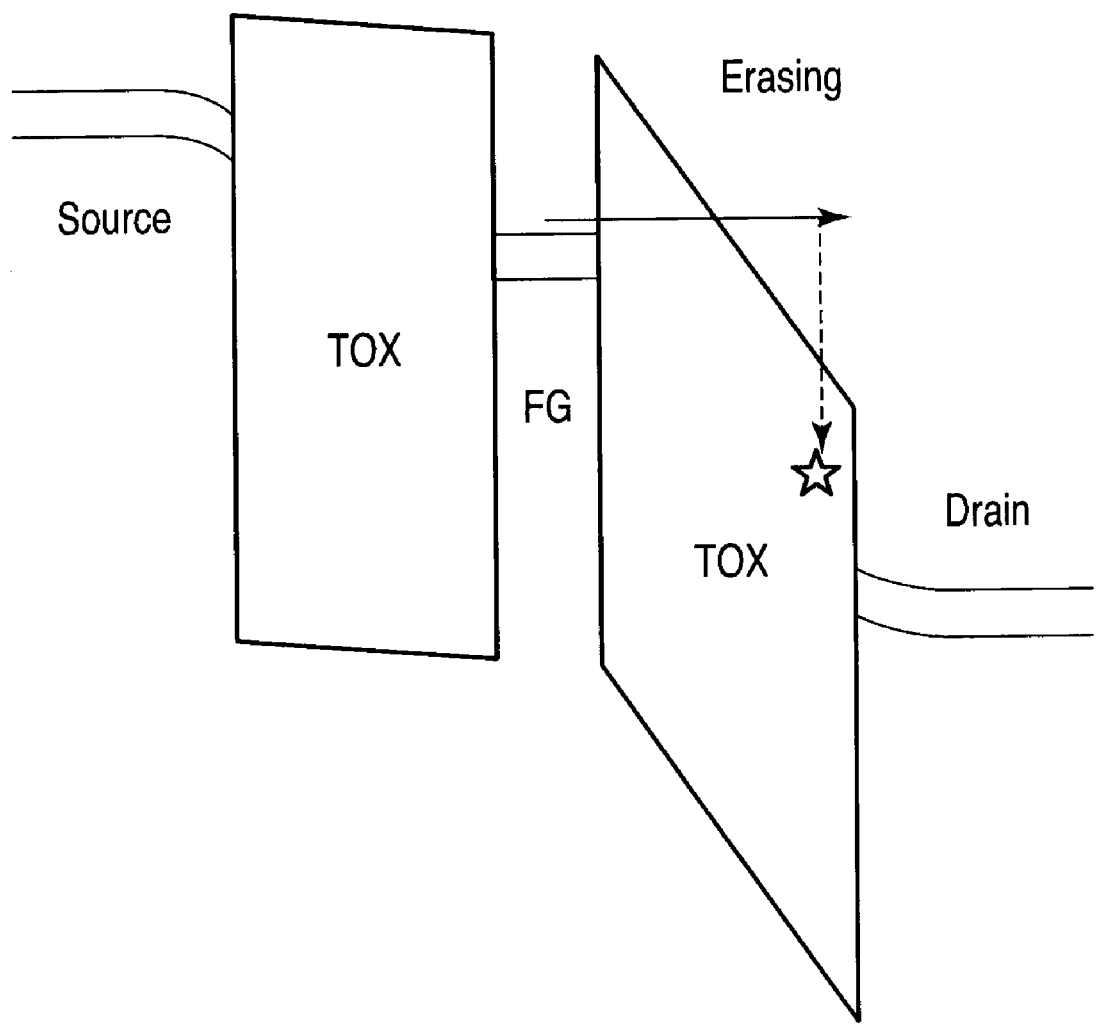
F I G. 36

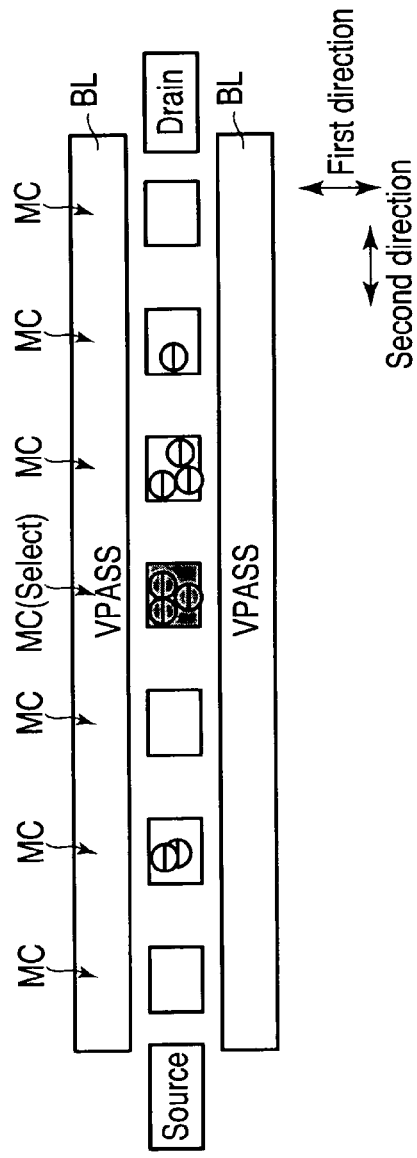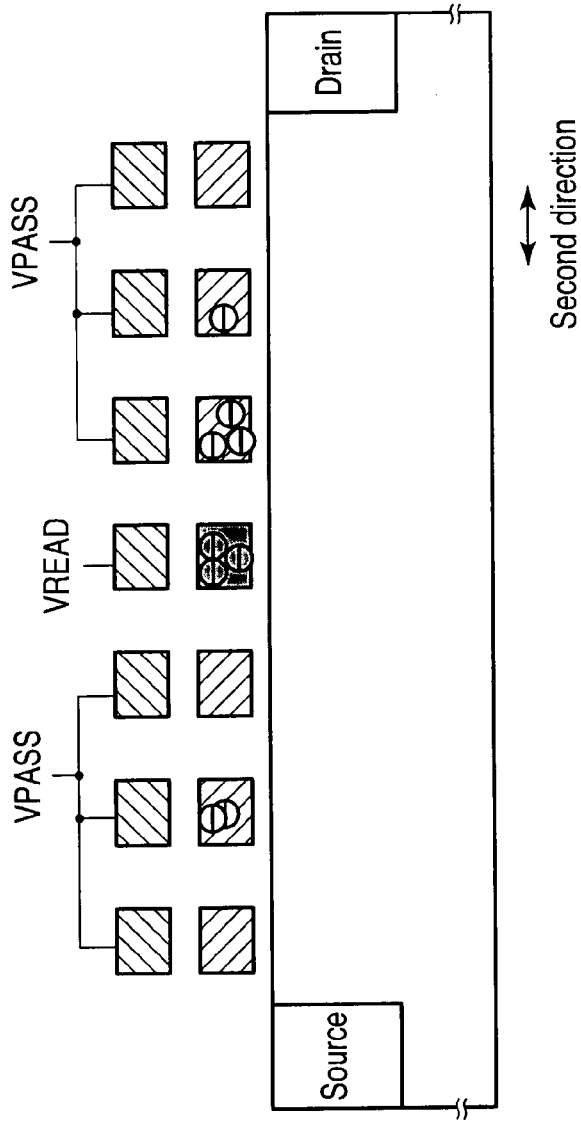
F I G. 40A
F I G. 40B

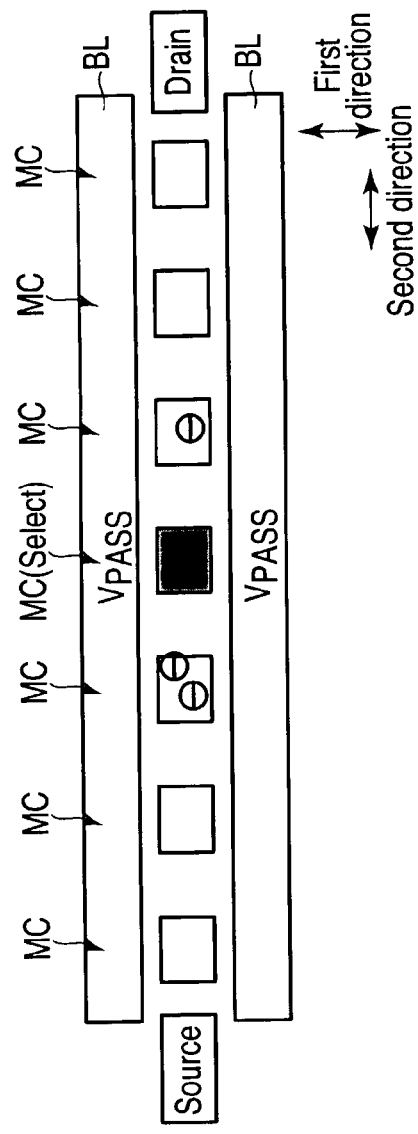
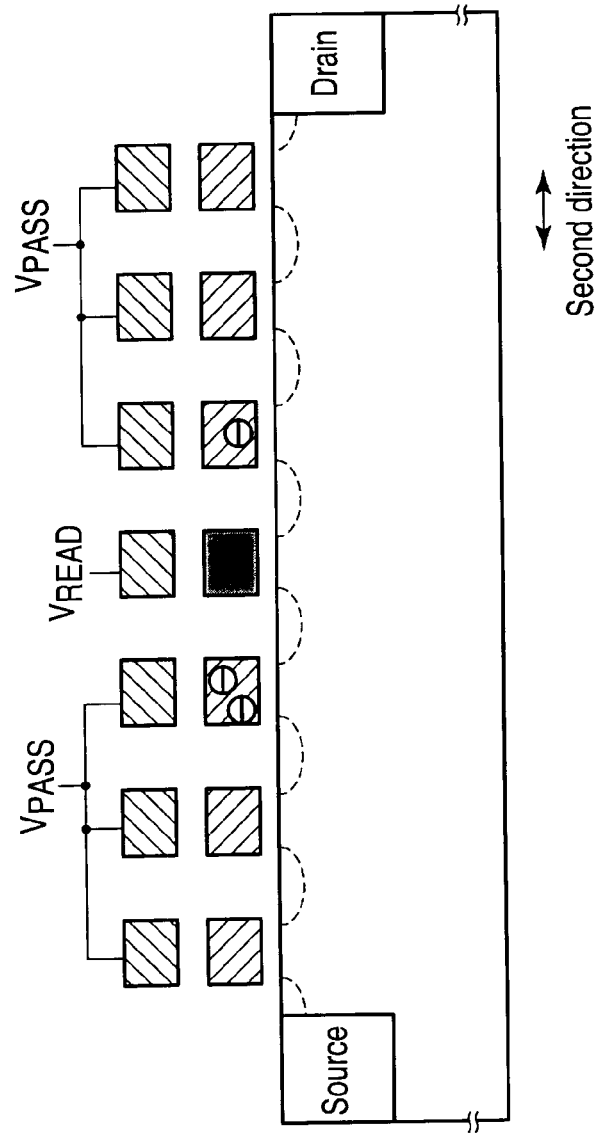
FIG. 41A
FIG. 41B

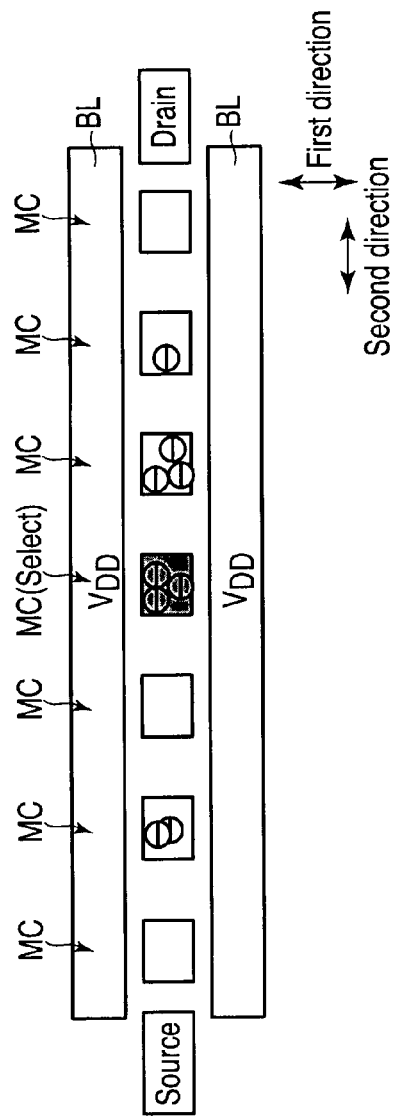
F I G. 42A
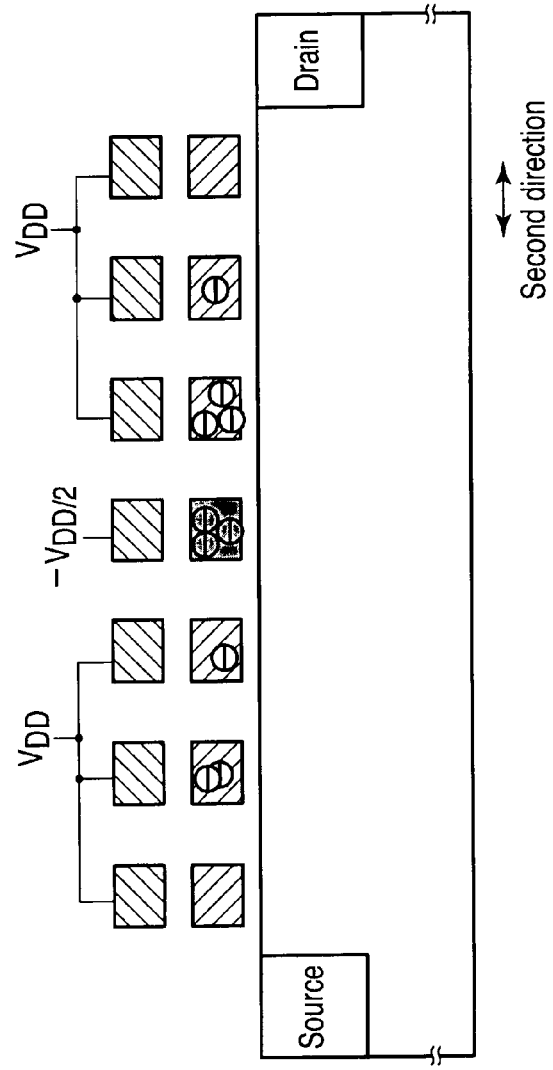
F I G. 42B

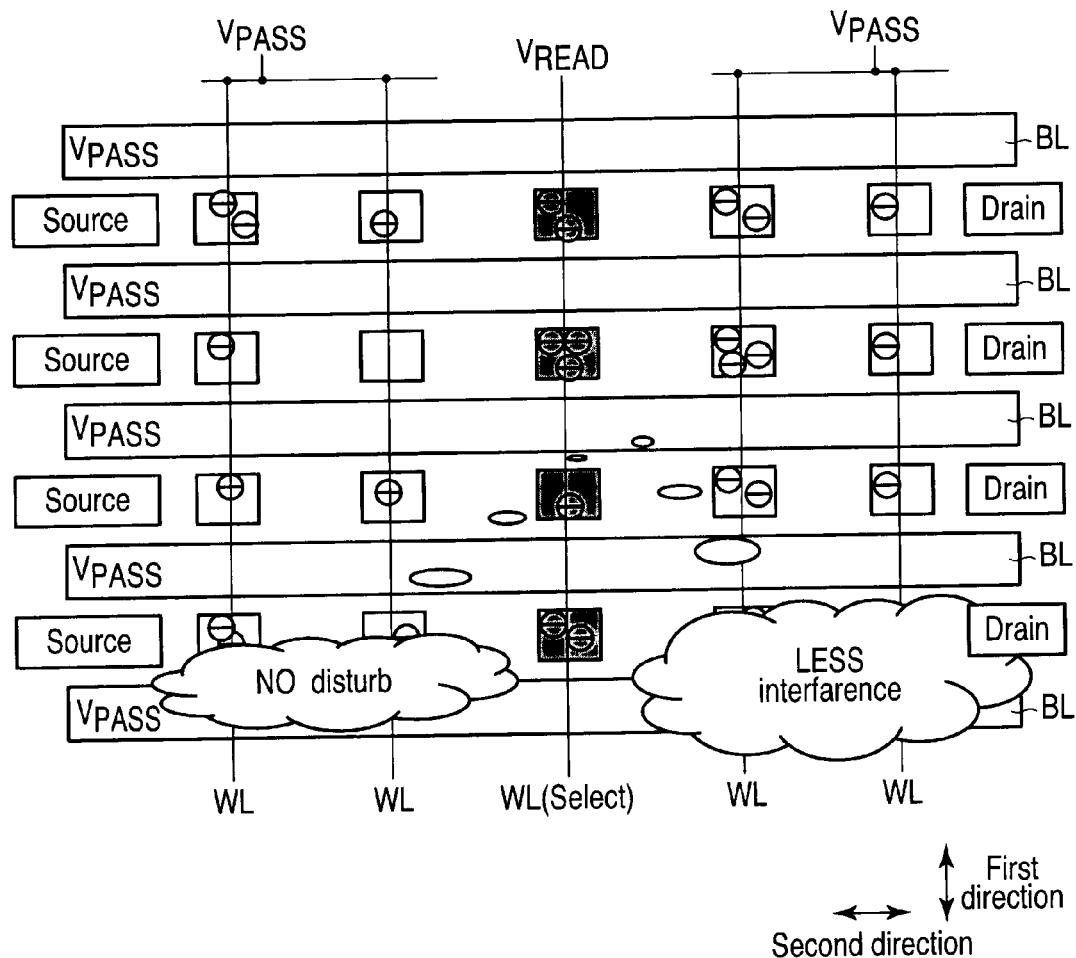
F I G. 43

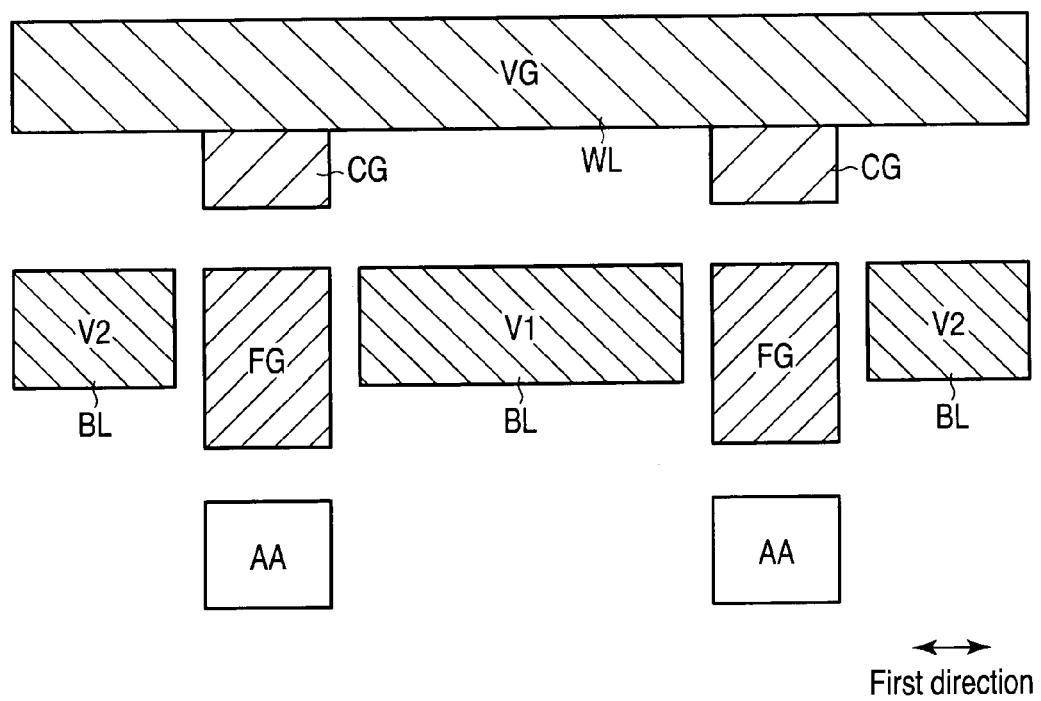
F I G. 44

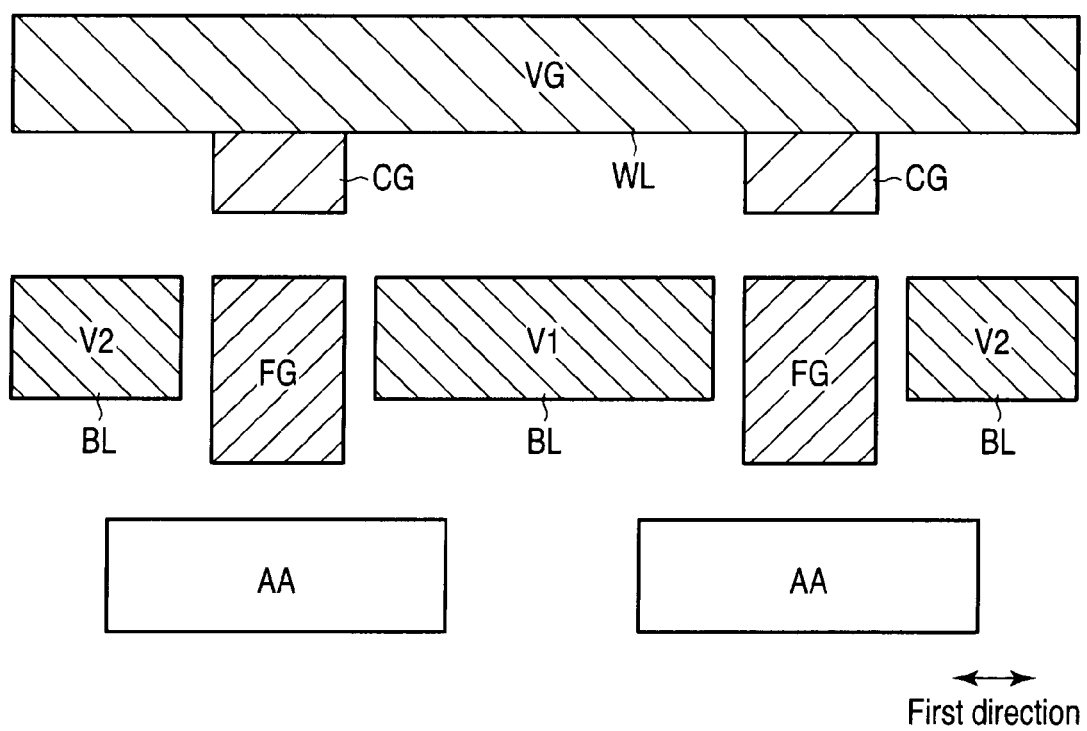
F I G. 45

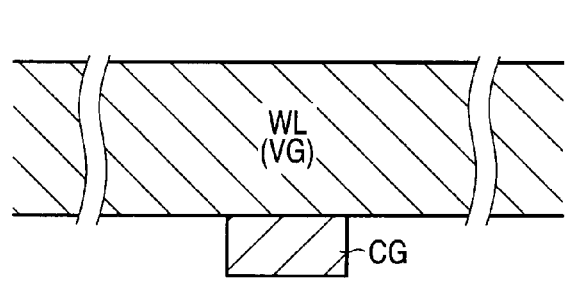 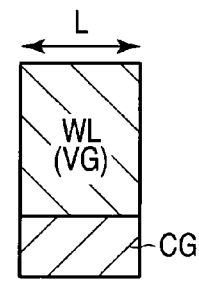
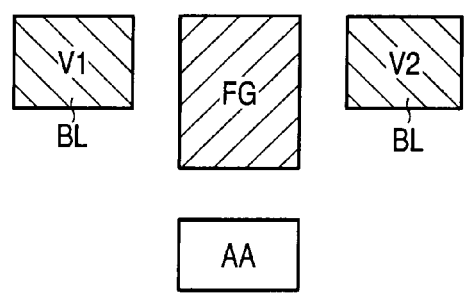 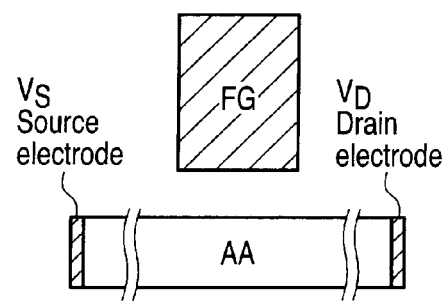
F I G. 46A　　　　　　　　F I G. 46B
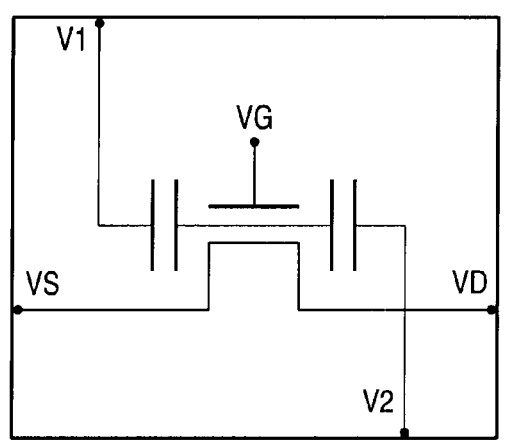
F I G. 47

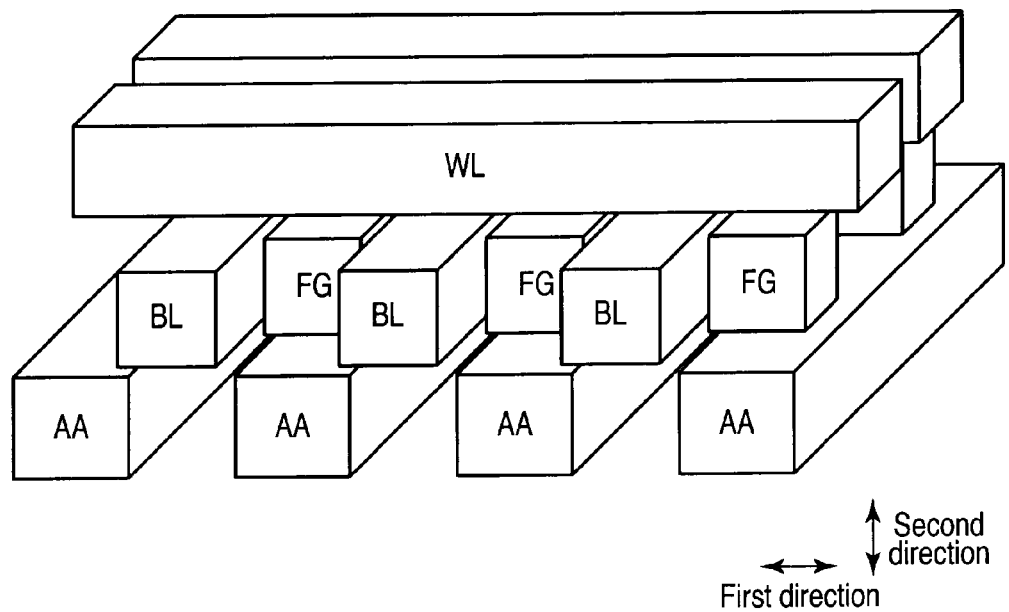
F I G. 49
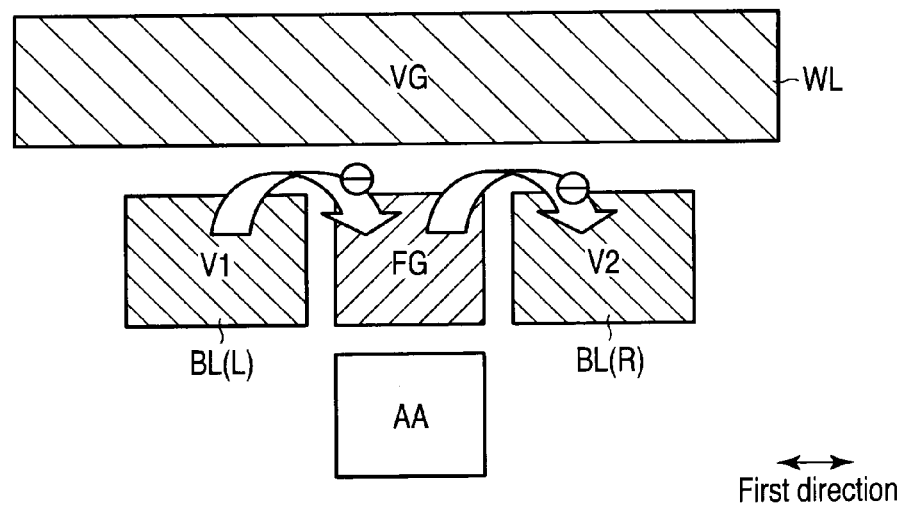
F I G. 50

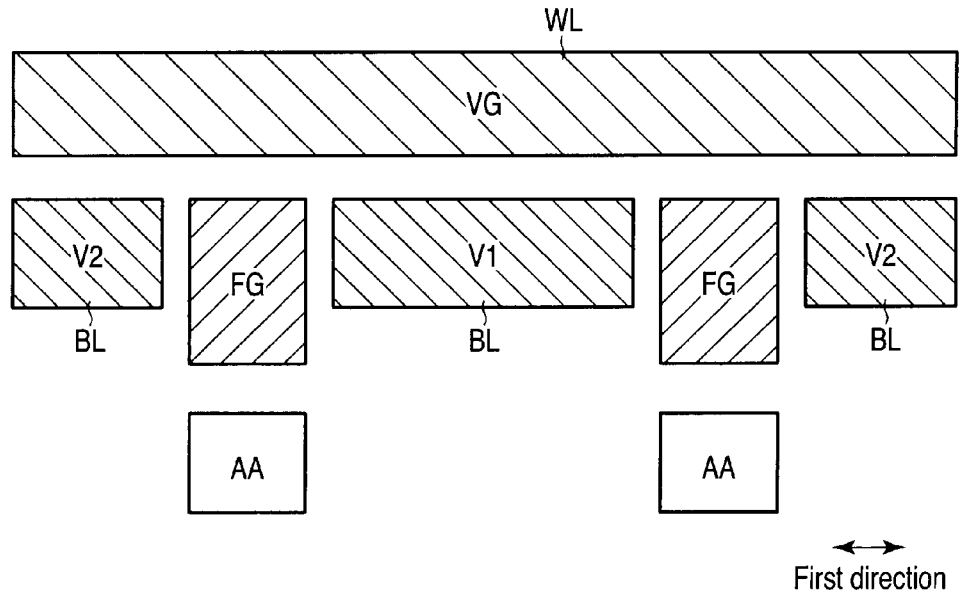
F I G. 53
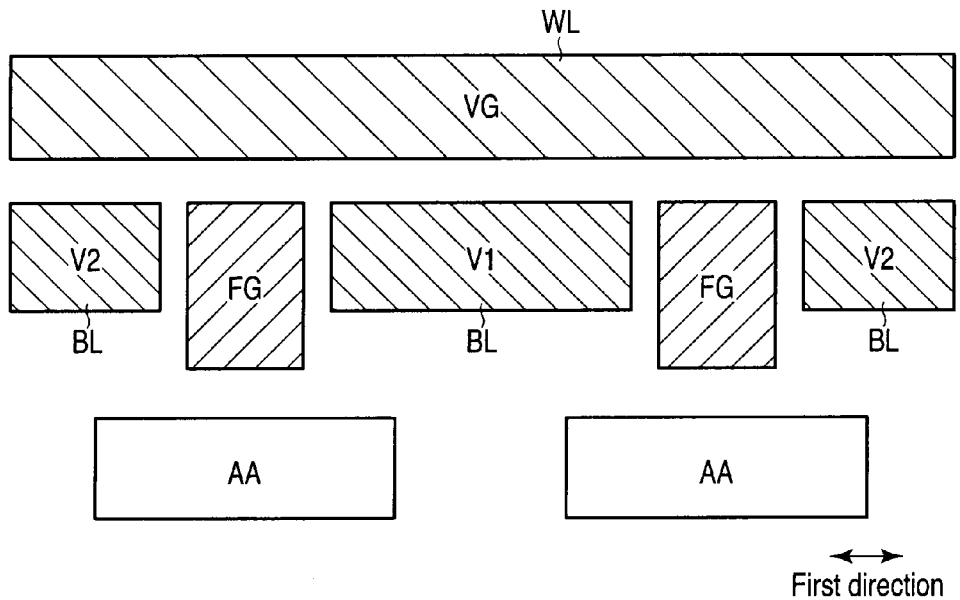
F I G. 54

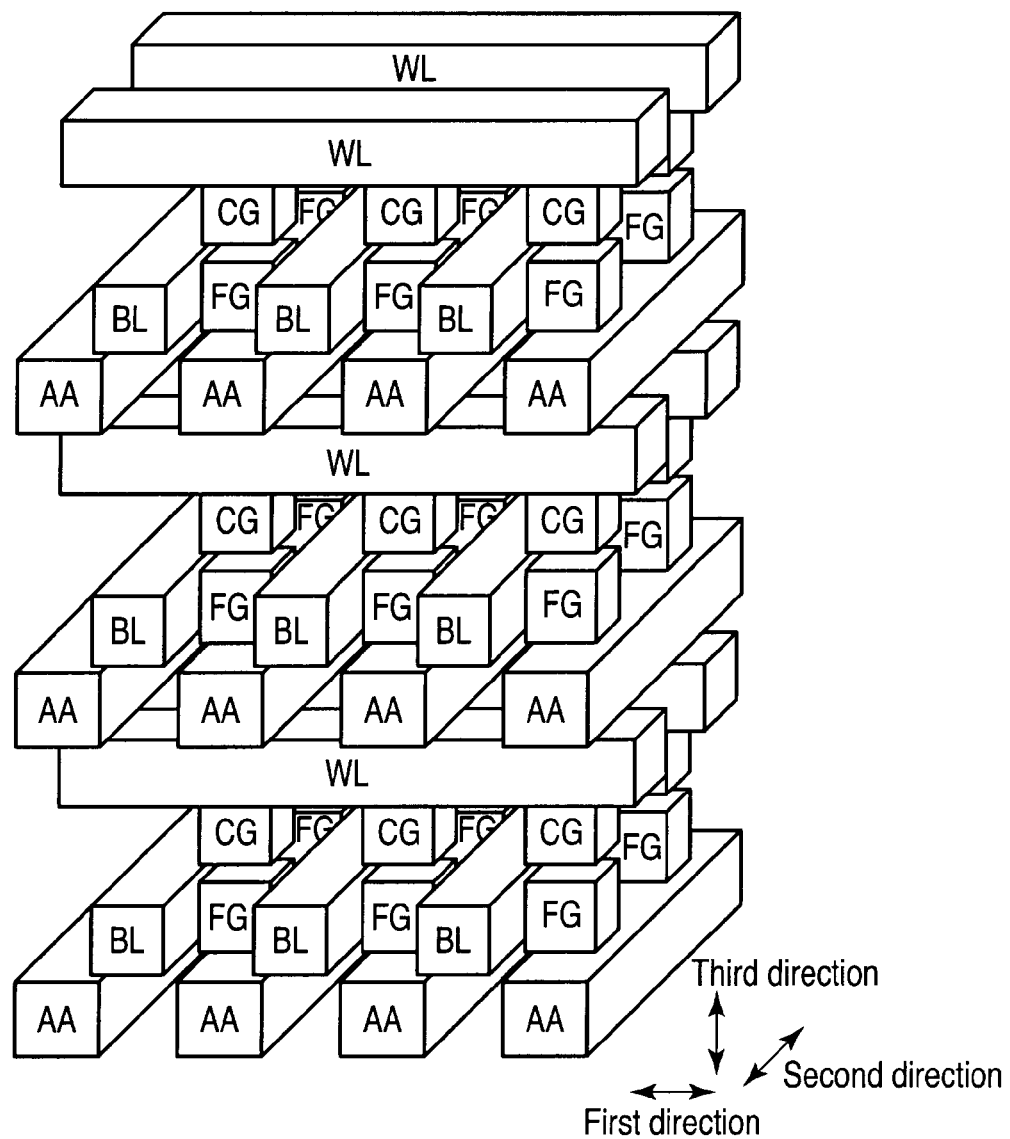
F I G. 55

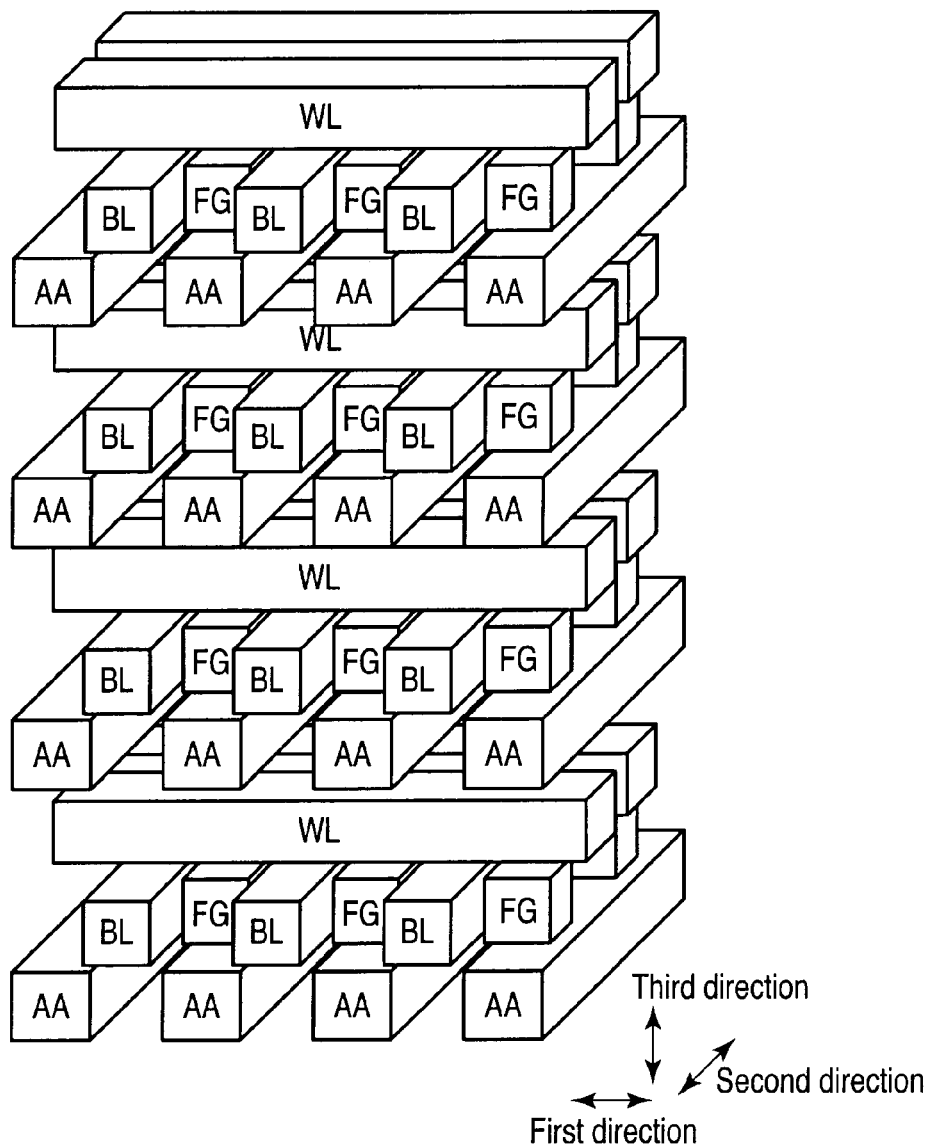
F I G. 56

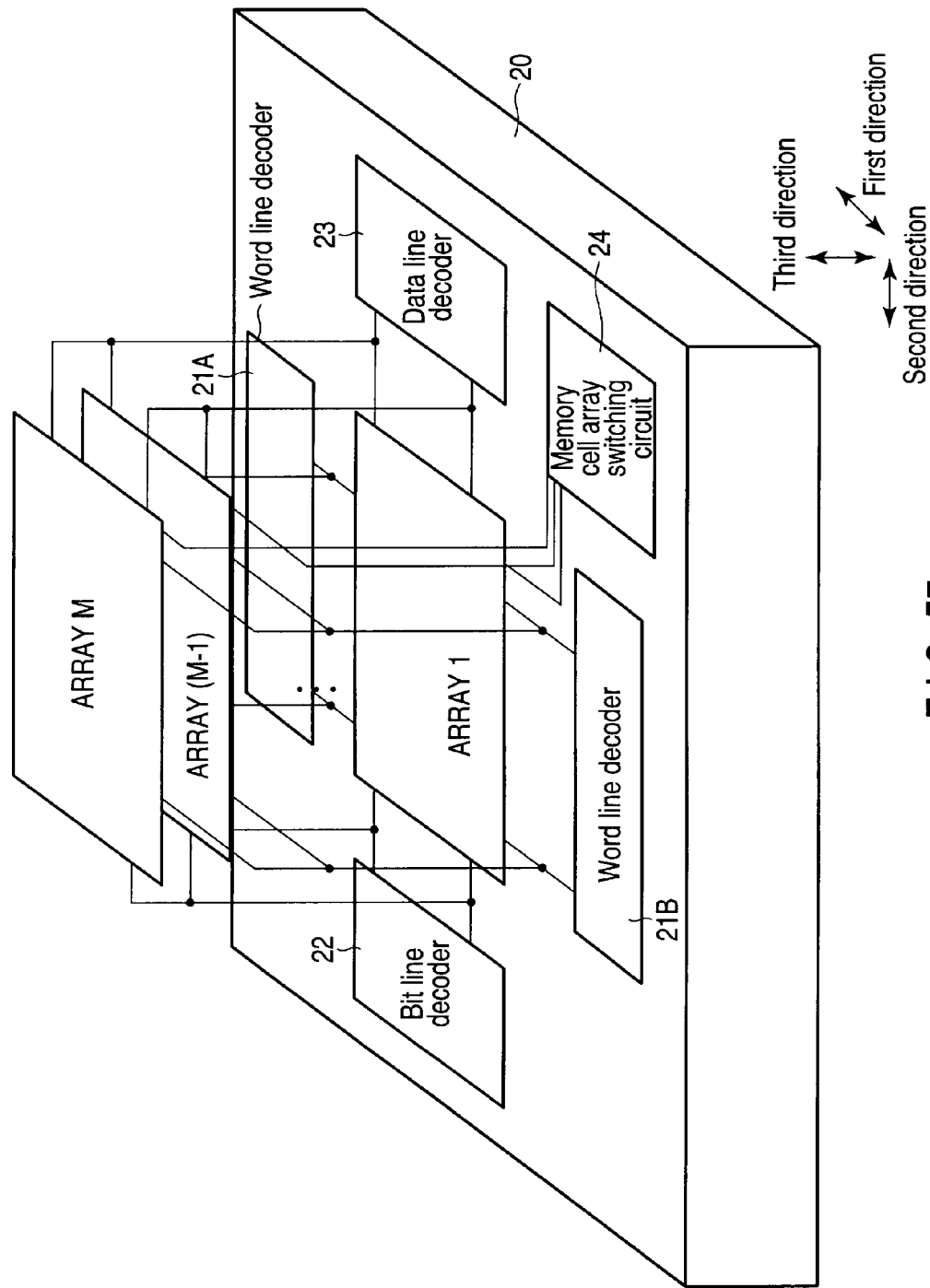
F I G. 57

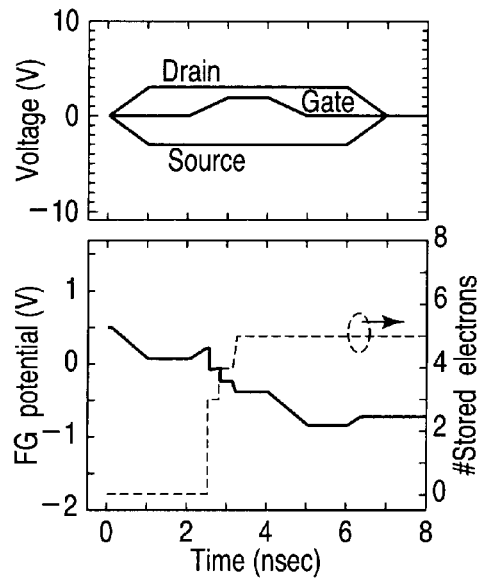
F I G. 65A
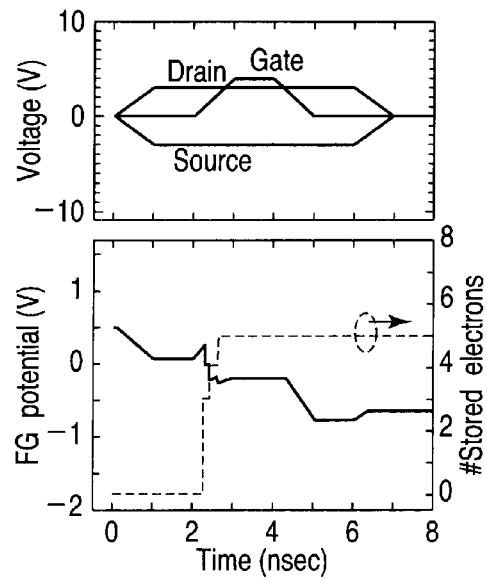
F I G. 65B
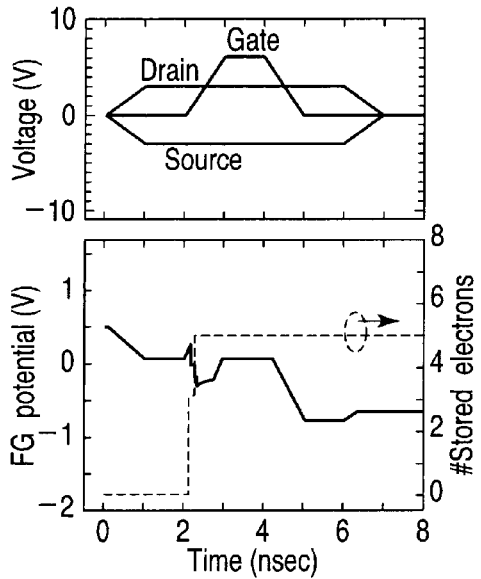
F I G. 65C
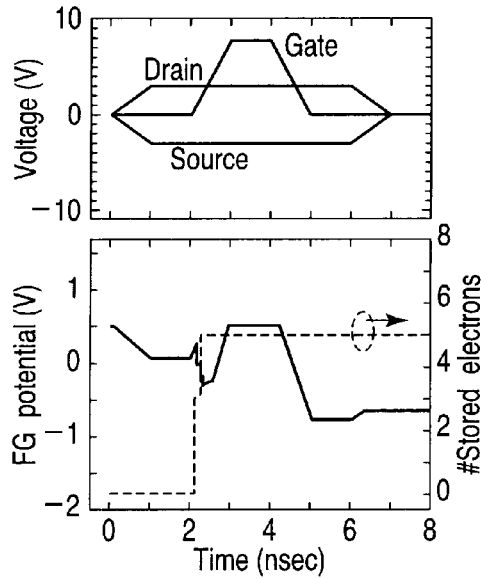
F I G. 65D

| $V_S/V_D$ | Electrons | $\Delta V_{FB}$ | $\Delta V_{th}$ | $\Delta V_{th}$/Electron |
|---|---|---|---|---|
| +2V/−2V | 3 | 0.5V | 0.6V | 0.2V |
| +3V/−3V | 5 | 1.2V | 1.5V | 0.3V |
| +4V/−4V | 6 | 1.5V | 2.0V | 0.3V |

F I G. 68

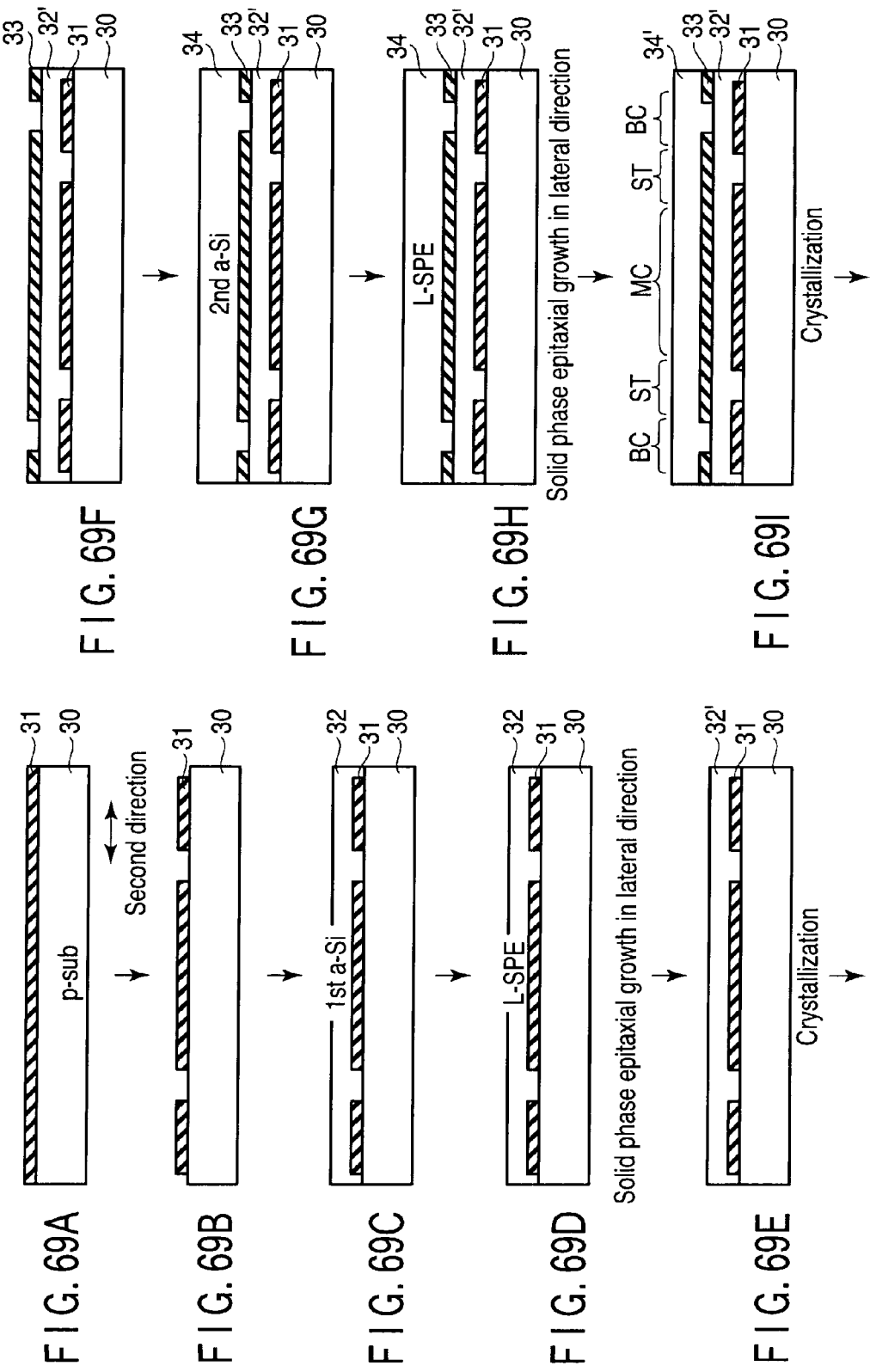

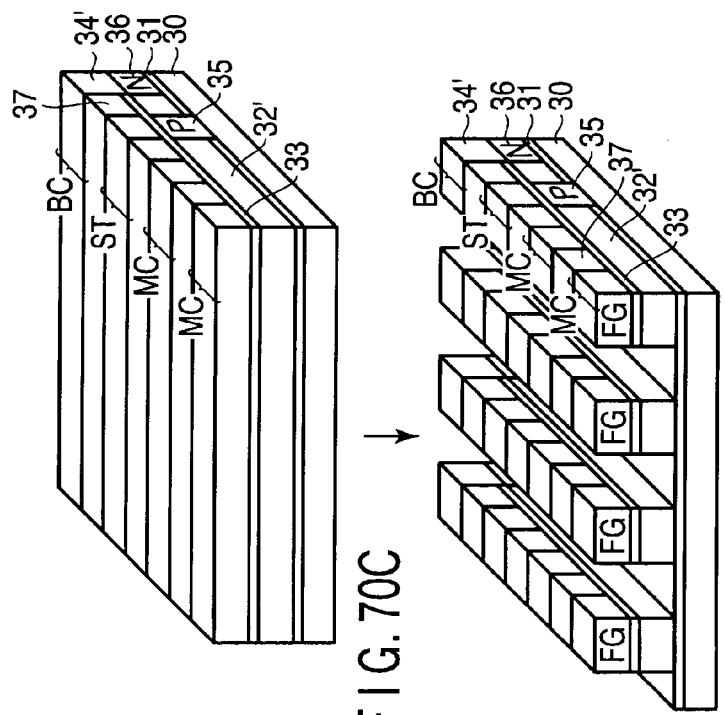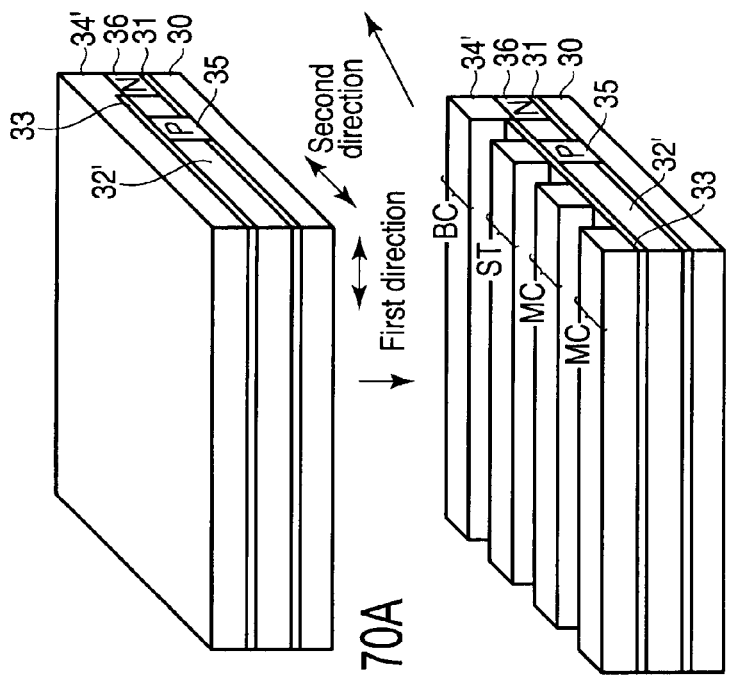

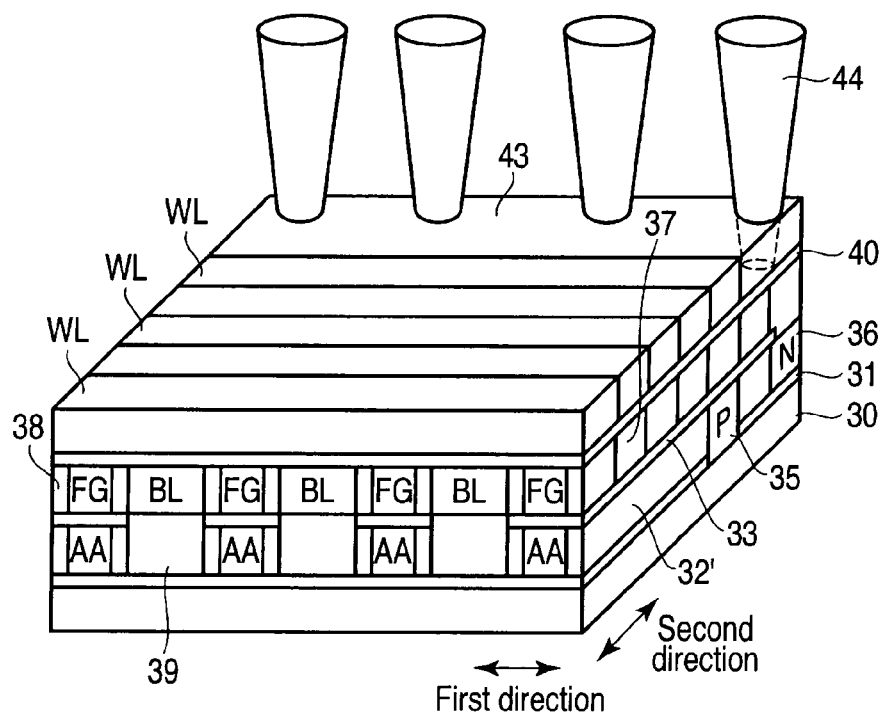
F I G. 72
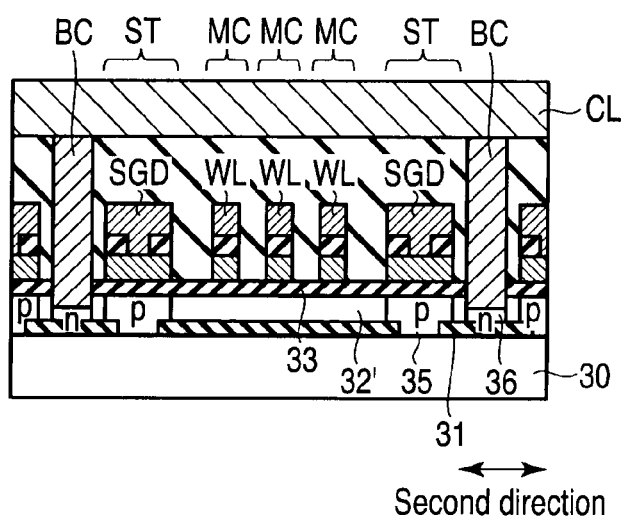
F I G. 73

MULTI-DOT FLASH MEMORY

CROSS-REFERENCE TO RELATED APPLICATION

This is a Continuation Application of PCT Application No. PCT/JP2008/053688, filed Feb. 29, 2008, which was published under PCT Article 21(2) in Japanese.

FIELD

The present invention relates to a multi-dot flash memory (MDF).

BACKGROUND

In a NAND flash memory of the type widely available on the memory market, a tunnel insulating film for performing programming/erasing operations serves also as a gate insulating film that determines transistor characteristics of a cell. Thus, performance deterioration resulting from repeated programming/erasing operations causes a big problem. Such a reliability problem of the insulating film is disclosed, for example, in "Fujio Masuoka (chief editor) "Handbook of Flash Memory Technology", On Demand Publishing, August 1993".

Moreover, the NAND flash memory cannot be randomly written and thus is not suitable for recording a large quantity of data at high speed. Therefore, a large-capacity buffer memory is needed for recording dynamic images in real time.

A floating gate type using a floating gate for holding electric charges and a local trap type using a charge storage layer comprised of local traps contained in a nitride film or the like in a high proportion are mainly known as memory cell structures of the NAND flash memory. However, whether both types are suitable for finer structures of generations of 30 nm or later is uncertain, as given in the following points.

First, the floating gate type currently widely used commercially has, as a serious problem obstructing finer structures, an interference effect (inter-cell interference) between two mutually adjacent floating gates.

The inter-cell interference is disclosed, for example, by Andrea Ghetti, Luca Bortesi and Loris Vendrame, in "3D Simulation study of gate coupling and gate cross-interference in advanced floating gate non-volatile memories", Solid-State Electronics, vol. 49, Issue 11, November 2005, Pages 1805-1812.

The quickest and simplest method of solving this problem is to make thinner both a tunnel insulating film filling up a space between a channel and a floating gate and an inter-electrode insulating film (for example, IPD (Inter-Polysilicon Dielectric)) filling up a space between the floating gate and a control gate to implement shrinkage in a longitudinal direction simultaneously with shrinkage in a cross direction.

This is a method conforming to the scaling law (see, for example, R. H. Dennard et al., "Design of ion-implanted MOSFET's with very small physical dimensions", IEEE J. of SSC, vol. 9, no. 5, pp. 256-268, 1974) and is the most effective one. However, since programming/erasing operations need to be performed through a tunnel insulating film, charge traps occur on the floating gate side while performing programming operations and charge traps occur on the substrate side while performing erase operations.

Therefore, with an increasing number of times of programming/erasing operations to/from a memory cell, a difference (threshold window) between a threshold in a programming state and that in an erasing state becomes smaller.

Thus, when tackling the problem of reliability of a tunnel insulating film, a problem specific to non-volatile memories, making a tunnel insulating film thinner is difficult to realize. Therefore, making a NAND flash memory of the floating gate type finer results in distorted scaling in which only shrinkage in the cross direction is implemented. This reveals the problem caused by an inter-cell interference effect.

The local trap type, on the other hand, has structurally no inter-cell interference and, in addition, leak phenomena of a tunnel insulating film are limited to local traps related to a leak path that arises in the tunnel insulating film. Thus, the local trap type is also superior in leak resistance (see, for example, SONY CX-PAL, issue 52, Device that traveled in outer space, Non-volatile memory device technology for low-cost combined mounting "MONOS").

From these points described above, local trap type memory cells are expected to be a prospective successor after processes to make floating gate type memory cells finer come to an end.

Since the local trap type has a thin tunnel insulating film, there is an advantage that charge traps are less likely to occur in the tunnel insulating film due to lower energy of tunnel electrons than that of the floating gate type.

However, if programming/erasing operations are performed repeatedly in the local trap type, a charge trap in the tunnel insulating film occurs, as in the floating gate type. Such a trap naturally reveals a problem of reliability of the tunnel insulating film.

In addition, if processes of making the local trap type finer are advanced, the number of local traps in the charge storage layer decreases, revealing a fundamental weak point that the amount of charges that can be stored decreases. For this reason, even a slight amount of charge that slips out from a local trap in a charge storage layer in a finer memory cell has an enormous effect on the threshold of the memory cell.

If, for example, the trap density of a charge storage layer is $1 \times 10^{12}$ cm$^{-2}$, the number of traps of the charge storage layer for a control gate whose plane size is 20 nm×20 nm, will be just four. If only one of the four traps becomes a leak path, 25% of the total charge will be lost.

Such fluctuations in the number of local traps render memory cell operations unstable.

That is, if such fluctuations in the number of local traps are further considered when the number of local traps (number of electrons held) in the charge storage layer decreases and a threshold swing between a programming state and an erasing state of a memory cell becomes smaller. Read operation can not execute, when no threshold window or a narrow threshold window generates.

Under such circumstances, a next-generation memory called a quantum dot memory is proposed.

The quantum dot memory can roughly be divided into two types.

One is a technology that utilizes many quantum dots having fluctuations as an aggregate, considering the fact that position control and quality maintenance of single quantum dots are difficult.

For example, quantum dots are embedded in a tunnel insulating film to improve programming characteristics. This technology is disclosed, for example, by R. Ohba, N. Sugiyama, J. Koga, and S. Fujita, in "Silicon nitride memory with double tunnel junction", 2003 Symposium on VLSI Technology Dig. Tech. Paper." Moreover, quantum dots themselves may be used in place of local traps.

These technologies may partially improve conventional memory cell characteristics, but since quantum dots are embedded corresponding to one floating gate, the floating gate itself cannot be made so microscopic that quantum dot properties appear, thus fundamental progress is not expected. In addition, manufacturing costs increase because reliability of a tunnel insulating film containing a quantum dot layer becomes lower than that of a tunnel insulating film of the floating gate type due to the presence of quantum dots.

The other is a technology that utilizes quantum dots as a floating gate.

A floating gate of 10 nm is self-aligningly formed in a trough of a recess without position fluctuations on a longitudinal structure in which a tetrahedral shaped recess is cut out in a GaAs substrate (see, for example, M. Shima, Y. Sakuma, T. Futatsugi, Y. Awano, and N. Yokoyama, "Tetrahedral shaped recess channel HEMT with a floating quantum dot gate", IEDM Tech. Dig., pp. 437-440, December 1998).

Since data is stored depending on whether or not one electron is present, for example, terabit-level scaling can be handled. However, the size of a recess opening is actually several micrometers and thus, a cell occupied area will be vastly larger than a file memory using a silicon substrate.

That is, the key to making a cell finer is to make an opening finer. Making a recess opening finer is limited also by limitations of making a GaAs substrate thinner because a source and a drain are arranged vertically. In addition, the GaAs substrate is originally not appropriate for a file memory because of increased bit costs.

From what has been described above, realization of a new memory architecture is desired that uses a silicon technology, solves a problem of reliability by separating a gate insulating film and a tunnel insulating film, operates even on a scale where a floating gate behaves like quantum dots, and further is randomly programmable.

BRIEF SUMMARY

The present invention proposes a multi-dot flash memory as a randomly programmable next-generation file memory that solves problems of microprocessing and reliability.

A multi-dot flash memory of an aspect of the present invention comprises an active area, a floating gate arranged on the active area via a gate insulating film and having a first side and a second side facing each other in a first direction, a word line arranged on the floating gate via an inter-electrode insulating film, a first bit line arranged on the first side of the floating gate via a first tunnel insulating film and extending in a second direction intersecting the first direction, and a second bit line arranged on the second side of the floating gate via a second tunnel insulating film and extending in the second direction. The active area has a width in the first direction narrower than that between a center of the first bit line and a center of the second bit line.

A multi-dot flash memory of aspect of the present invention comprises active areas arranged by being aligned in a first direction and extending in a second direction intersecting the first direction, source/drain diffusion layers arranged at ends in the second direction of the active areas, floating gates arranged on the active areas via a gate insulating film and arranged in the first and second directions like an array, word lines arranged on the floating gates via an inter-electrode insulating film and extending in the first direction, and bit lines arranged by being aligned in the first direction, extending in the second direction, and arranged between the floating gates via a tunnel insulating film. The bit lines and the floating gates are arranged alternately in the first direction.

A multi-dot flash memory of aspect of the present invention comprises memory cell arrays stacked on a semiconductor substrate, a peripheral circuit formed in the semiconductor substrate, and a memory cell array switching circuit formed in the semiconductor substrate to electrically connect a memory cell array selected from the memory cell arrays to the peripheral circuit. Each of the memory cell arrays includes active areas arranged by being aligned in a first direction and extending in a second direction intersecting the first direction, source/drain diffusion layers arranged at ends in the second direction of the active areas, floating gates arranged on the active areas via a gate insulating film and arranged in the first and second directions like an array, word lines arranged on the floating gates via an inter-electrode insulating film and extending in the first direction, and bit lines arranged by being aligned in the first direction, extending in the second direction, and arranged between the floating gates via a tunnel insulating film. The bit lines and the floating gates are arranged alternately in the first direction.

A method of manufacturing a multi-dot flash memory, of aspect of the present invention, comprises the steps of forming a first insulating film on a semiconductor substrate, forming a first amorphous silicon film on the first insulating film, making a first silicon film by allowing solid phase epitaxial growth of the first amorphous silicon film in a lateral direction and crystallizing the first amorphous silicon film, forming a second insulating film on the first silicon film, forming a second amorphous silicon film on the second insulating film, making a second silicon film by allowing solid phase epitaxial growth of the second amorphous silicon film in the lateral direction and crystallizing the second amorphous silicon film, patterning the second silicon film to form second silicon films in a line & space structure extending in a first direction, filling a space between the second silicon films with a third insulating film, patterning the second silicon films, the third insulating film, the second insulating film, and the first silicon film, forming the first silicon film into active areas in a line & space structure extending in a second direction intersecting the first direction, making the second silicon films, floating gates, oxidizing a side along the second direction of the active areas and the floating gates, forming a fourth insulating film between the active areas, forming bit lines between the floating gates, forming an inter-electrode insulating film on the floating gates and the bit lines, and forming word lines extending in the first direction on the inter-electrode insulating film.

According to the present invention, a multi-dot flash memory as a randomly programmable next-generation file memory that solves problems of microprocessing and reliability can be realized.

BRIEF DESCRIPTION OF THE DRAWINGS

FIG. 3 is a diagram showing a programming/erasing mechanism.

FIGS. 4 to 6 are diagrams, each showing a principle of charge trapping.

FIG. 13 is a diagram showing a device structure in a first embodiment.

FIGS. 14 and 15 are diagrams, each showing a programming/erasing mechanism.

FIG. 17 is a diagram showing a principle of programming by direct tunneling.

FIG. 18 is a diagram showing a principle of erasing by FN-tunneling.

FIG. 31 is a diagram showing a fifth example of an erasing method.

FIG. 32 is a graph showing timing for applying a gate voltage.

FIG. 33 is a graph showing an increase of charges in a floating gate.

FIG. 34 is a graph showing charge holding characteristics.

FIG. 35 is a diagram showing charge trapping during programming.

FIG. 36 is a diagram showing charge trapping during erasing.

FIGS. 40A, 40B, 41A, 41B, 42A, 42B and 43 are diagrams, each showing a state of reading.

FIGS. 44 and 45 are diagrams, each showing a width of an active area.

FIGS. 46A and 46B are diagrams schematically showing a cell structure of the invention.

FIG. 47 is a diagram showing an equivalent circuit of a cell structure according to the invention.

FIG. 49 is a diagram showing a device structure in a second embodiment.

FIGS. 50 and 51 are diagrams, each showing a programming/erasing mechanism.

FIGS. 53 and 54 are diagrams, each showing a width of an active area.

FIGS. 55 and 56 are diagrams, each showing a device structure in a third embodiment.

FIG. 57 is a diagram showing a device structure in a fourth embodiment.

FIGS. 64, 65A to 65D, 66A, 66B, 67A, 67B and 68 are diagrams, each showing a summary of simulation results.

FIGS. 69A to 69I are diagrams, each showing a method of manufacturing a double SOI substrate.

FIGS. 70A to 70D and 71A to 71F are diagrams, each showing a method of manufacturing a device of the invention.

FIGS. 72 and 73 are diagrams, each showing a device structure of the manufacturing method of the invention.

DETAILED DESCRIPTION

Best modes for carrying out the present invention will be described below with reference to the drawings.

1. REFERENCE EXAMPLE

First, a reference example to be a premise of the present invention will be described.

Figure 1:
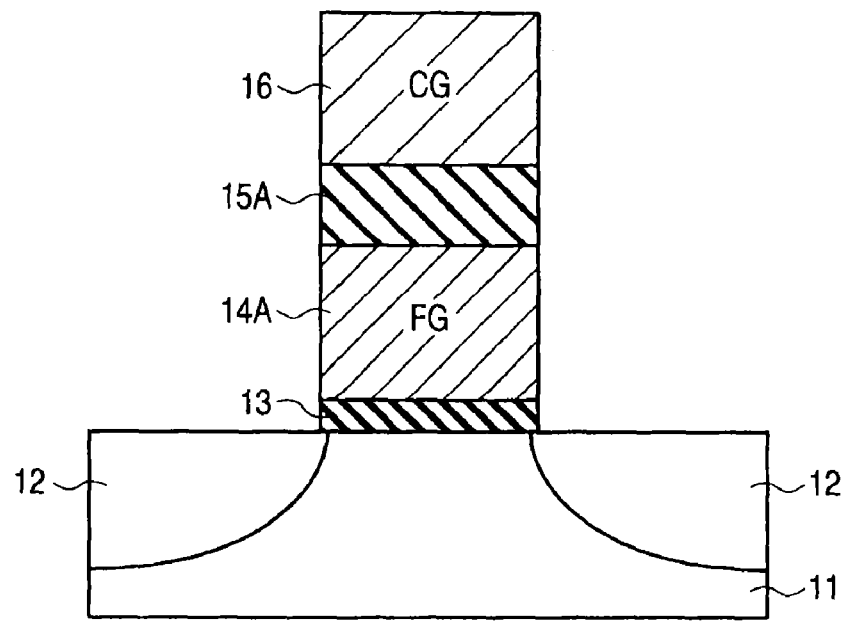
FIG. 1 is a diagram showing a floating gate type memory cell.
Figure 2:
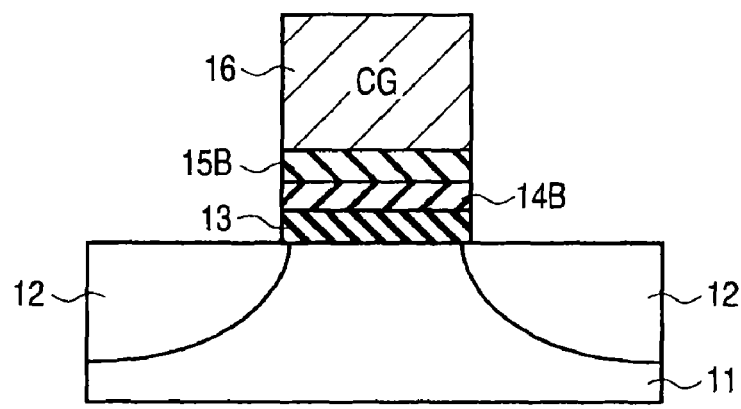
FIG. 2 is a diagram showing a local trap type memory cell.

FIG. 1 shows a memory cell of a floating gate type flash memory. FIG. 2 shows a memory cell of a local trap type flash memory.

In the floating gate type, source/drain diffusion layers 12 are formed in a semiconductor substrate 11, and a tunnel insulating film 13, a floating gate 14A, an inter-electrode insulating film 15A, and a control gate 16 are formed over a channel area between the source/drain diffusion layers 12.

In the local trap type, the source/drain diffusion layers 12 are formed in the semiconductor substrate 11, and the tunnel insulating film 13, a charge storage layer 14B, a blocking insulating film 15B, and the control gate 16 are formed over the channel area between the source/drain diffusion layers 12.

The inter-electrode insulating film 15A and the blocking insulating film 15B are defined below:

The inter-electrode insulating film 15A is an insulator which blocks an electron flow between a floating gate 14A and a control gate 16. The blocking insulating film 15B is an insulator which blocks an electron flow between a charge storage layer 14B and a control gate 16.

As described above, however, finer structures of generations of 30 nm or later are not provided for by these structures.

In the floating gate type, as shown in FIG. 3, programming/erasing is performed by movement of charges (arrow) in the tunnel insulating film (TOX). Thus, as shown in FIG. 4, a charge trap (asterisk) occurs on the floating gate (FG) side during programming and a charge trap (asterisk) occurs on the substrate (SUB) side during erasing.

An influence of these traps will be considered.

Figure 5:
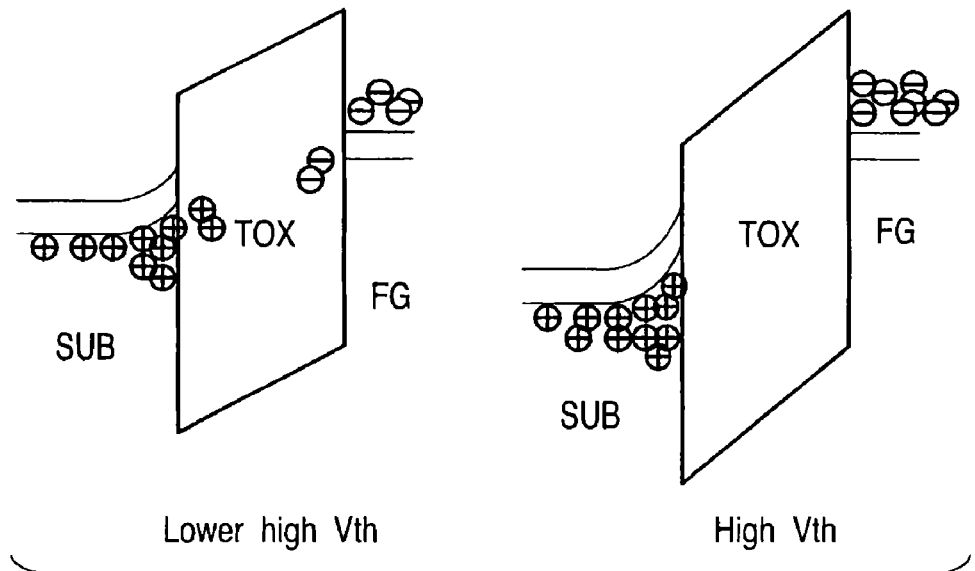

The right diagram (High Vth) in FIG. 5 shows a state in which no charge trap has occurred in the tunnel insulating film (TOX). Subsequently, charge traps are caused on the substrate (SUB) side and the floating gate (FG) side inside the tunnel insulating film (TOX) by repeated programming/erasing. Then, after the last programming, charges are trapped in the trap sections as shown in the left diagram (Lower high Vth) in FIG. 5.

That is, holes are trapped in a trap section on the substrate side and electrons are trapped in a trap section on the floating gate side. This state relieves an electric field inside the tunnel insulating film. Thus, the threshold (Vth) of the memory cell is lowered by an occurrence of a trap.

Figure 6:
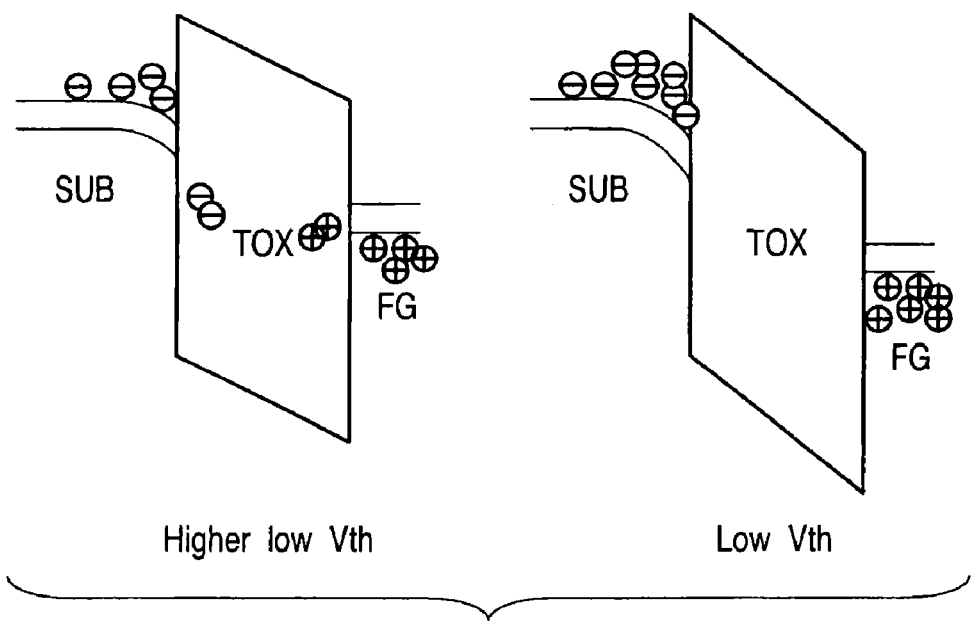

FIG. 6 shows a situation after repeating programming/erasing and lastly performing erasing. The right diagram (Low Vth) in FIG. 6 shows a state in which no charge trap has occurred in the tunnel insulating film (TOX). When erasing is performed lastly, electrons are trapped in a trap section on the substrate side and holes are trapped in a trap section on the floating gate side, as shown in the left diagram (Higher low Vth) in FIG. 6. This state relieves an electric field inside the tunnel insulating film. Thus, the threshold (Vth) of the memory cell is raised by an occurrence of a trap.

Figure 7:
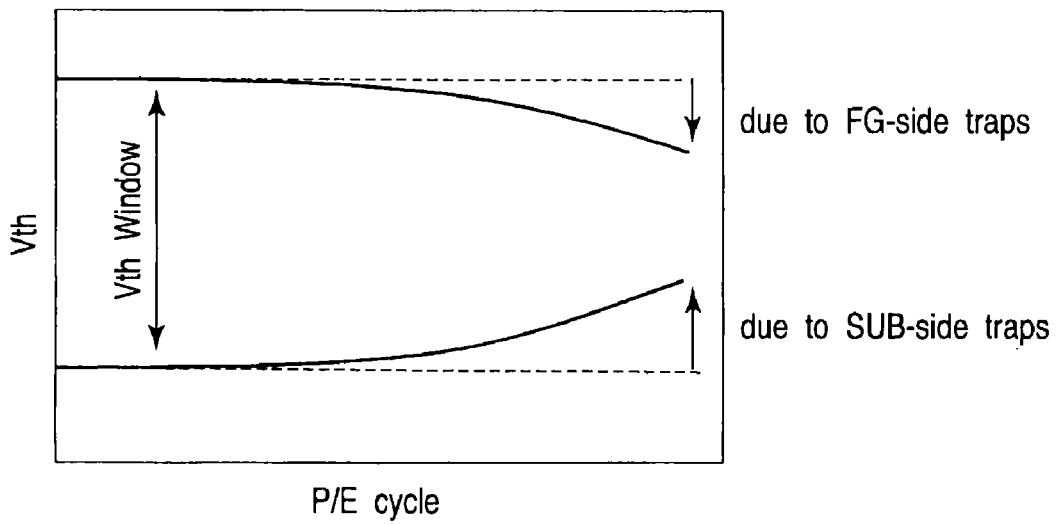
FIGS. 7 and 8 are graphs, each showing a relationship between programming/erasing cycles and a threshold window.

Thus, as shown in FIG. 7, charge traps generated by repeating programming/erasing cause a difference (Vth Window) between the thresholds Vth during programming and erasing to be narrower in accordance with the number of times of programming/erasing (P/E cycle).

Figure 8:
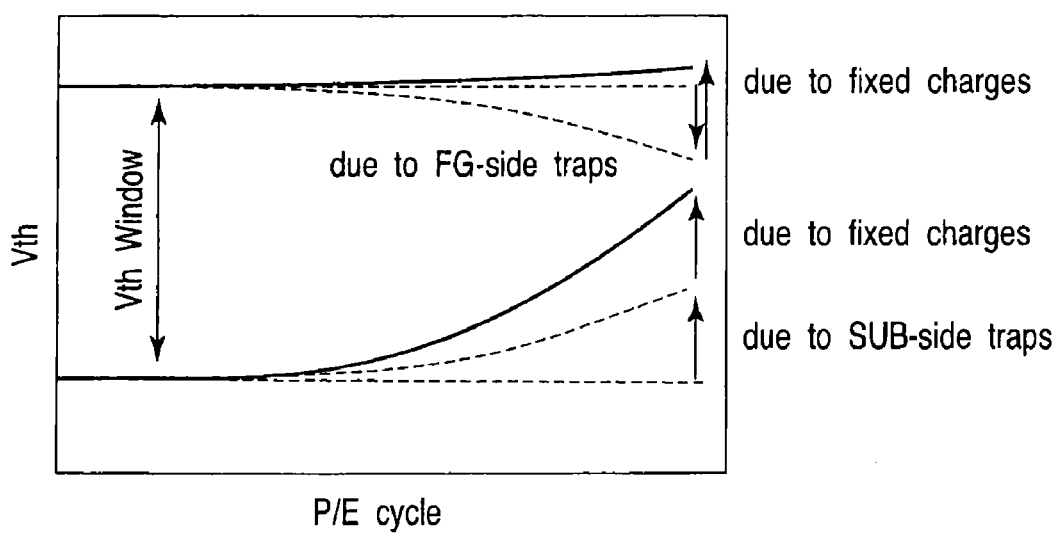
Figure 9:
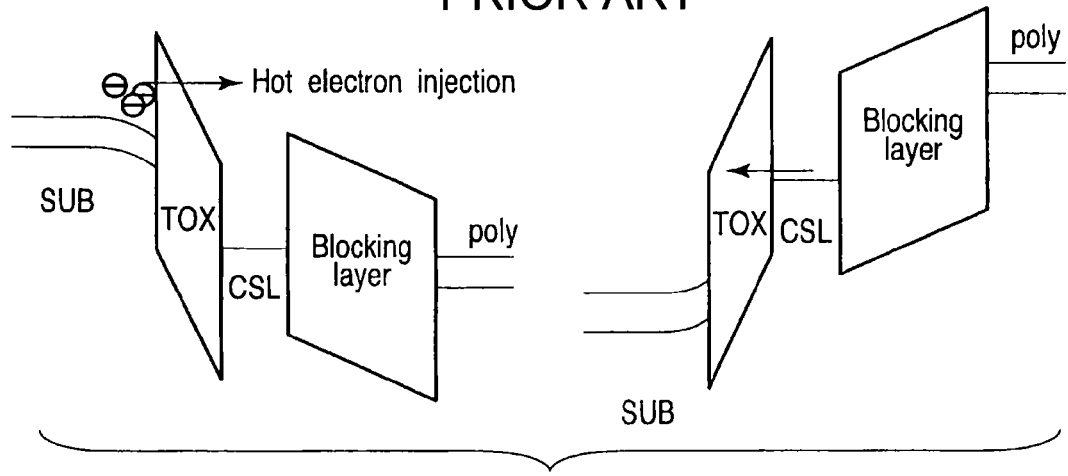
FIG. 9 is a diagram showing a programming/erasing mechanism.
Figure 10:
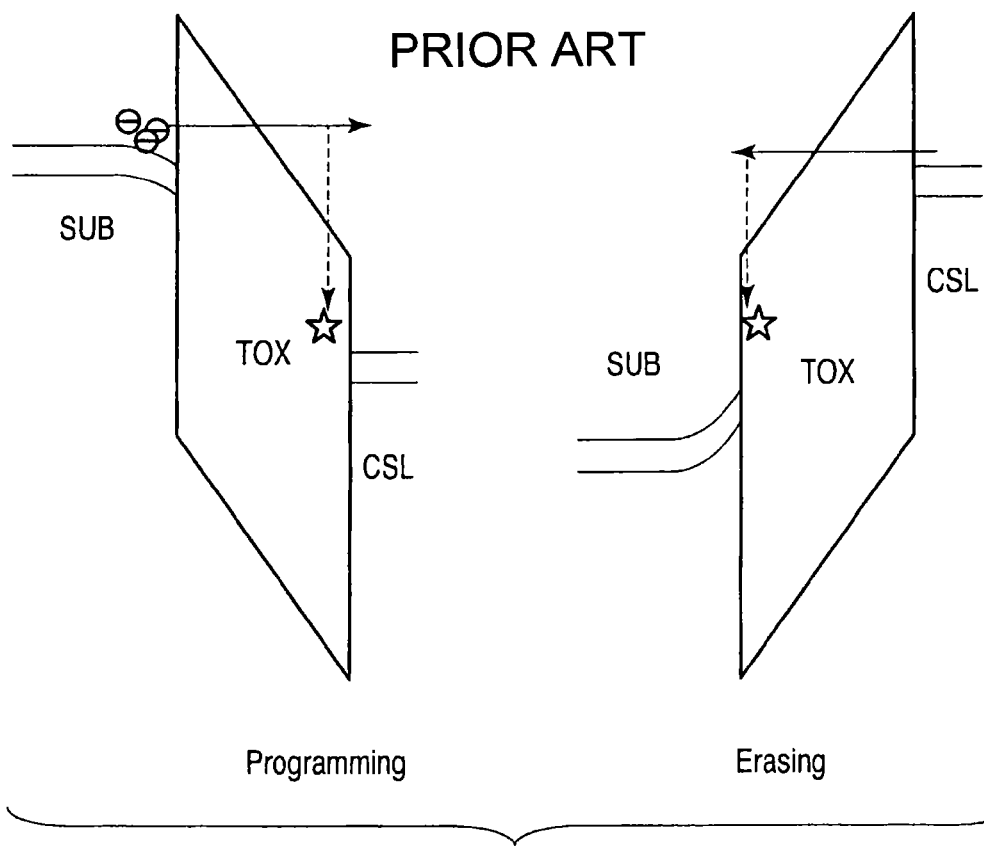
FIGS. 10 to 12 are diagrams, each showing a principle of charge trapping.
Figure 11:
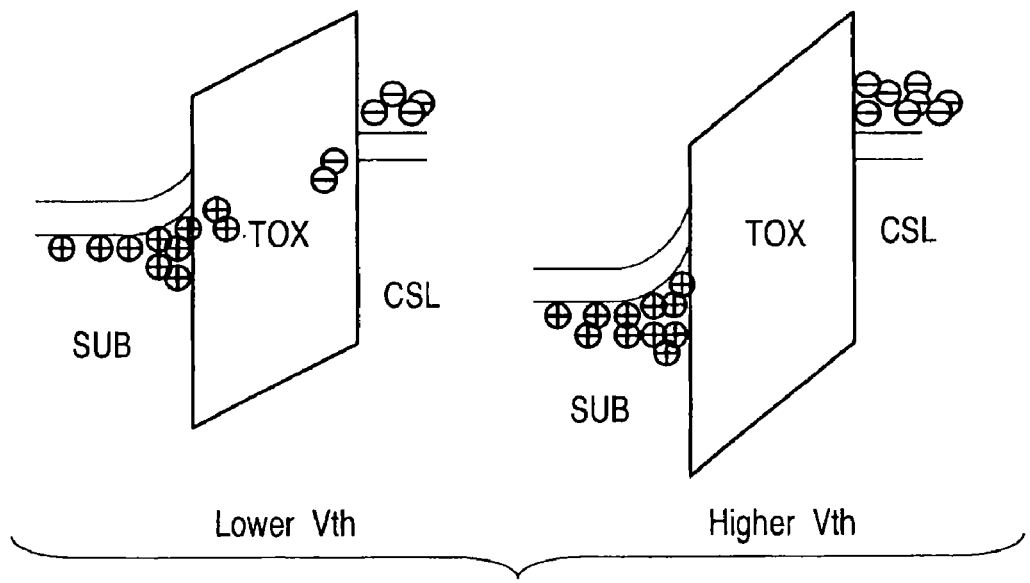
Figure 12:
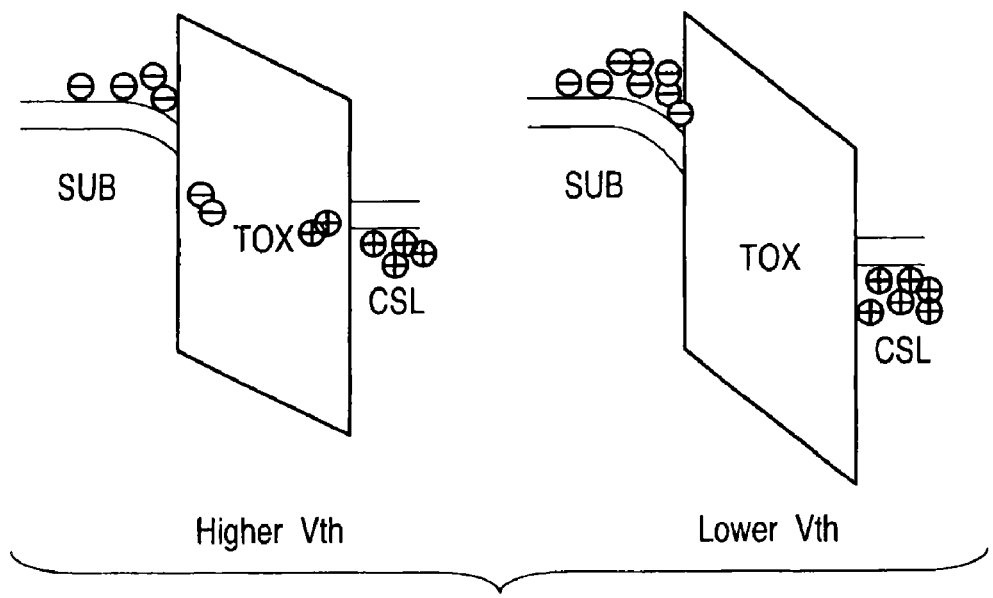

Traps generated by repeating programming/erasing are naturally not limited to those described above. Traps may be generated at a deeper level to become negative fixed charges by capturing electrons. Or, such traps may be generated in the center of a tunnel insulating film. In this case, as shown in FIG. 8, the threshold Vth is raised similarly after programming and erasing, but the threshold window (Vth Window) will become narrower all the same.

Further, if the tunnel insulating film becomes thinner, the interval between traps becomes narrower and a leak path arises and thus, making the tunnel insulating film thinner is difficult to realize. Therefore, making a NAND flash memory of the floating gate type finer leads to distorted scaling in which only shrinkage in the cross direction is implemented. This reveals the problem caused by an inter-cell interference effect.

The local trap type, on the other hand, has structurally no inter-cell interference. In addition, leak phenomena of a tunnel insulating film are limited to local traps related to a leak path that arises in the tunnel insulating film. Thus, the local trap type is superior in leak resistance.

In addition, since the local trap type has a thin tunnel insulating film, charge traps are less likely to occur in the tunnel insulating film due to lower energy of tunnel electrons than that of the floating gate type.

However, as shown in FIGS. 9 to 12, charge traps occur also in the local trap type in the tunnel insulating film (TOX) between the charge storage layer (CSL) and the substrate (SUB) as in the floating gate type if programming/erasing is repeated.

Therefore, if charge traps occur, the problem of reliability as shown in FIGS. 7 and 8 will occur even for the local trap type.

The local trap type also has a problem that annealing for causing traps generated on a sidewall of the tunnel insulating film to disappear during gate processing also causes traps in the charge storage layer to disappear at the same time.

Moreover, this process is difficult to control and it is still more difficult to make the density of traps remaining inside the charge storage layer uniform. That is, even if traps on the sidewall of the tunnel insulating film are caused to disappear and local traps of about $1 \times 10^{12}$ cm$^{-2}$ per cell on average are left in the charge storage layer, the number of local traps remaining in each cell fluctuates widely.

For example, while the number of local traps obtained by averaging all cells is four, some cells have two and other cells have six, or some cells have four, seven, and one. This directly leads to fluctuations of the threshold.

Even if the number of electrons that can actually be captured by the charge storage layer becomes four-fold by considering the degree of freedom of spin and a doublet state of traps (see, for example, "J. Robertson and M. J. Powell, Appl. Phys. Lett. Vol. 44, p. 414, 1984" and "T. Maruyama and R. Shirota, J. Appl. Phys. Vol. 78, p. 1912, 1995"), the maximum number of electrons leaked out by one leak path also becomes four-fold. That is, the above fluctuations will not decrease.

"The number of electrons held is small" means "the threshold swing is small". Realizing a threshold swing in the local trap type like that of the floating gate type also means that both a blocking layer filling a space between the charge storage layer and the control gate and the tunnel insulating film need to be made thinner. That is, the tunnel insulating film of the local trap type is thinner than that of the floating gate type, not because the former is more reliable than the latter, but because otherwise, the local trap type will not operate.

Therefore, if the tunnel insulating film and blocking film can be made thinner in the local trap type, the tunnel insulating film and blocking film can similarly be made thinner in the floating gate type. As a result, the local trap type cannot be automatically judged to be more advantageous than the floating gate type for making films thinner.

From a historical point of view, the difficulty of controlling local traps originally slowed down commercialization of the local trap type compared with the floating gate type. As described above, the problem of trap controllability is becoming still more difficult together with finer structures, and present circumstances are more pessimistic than is believed in the world. Roughly speaking, commercialization of the local trap type was probably realistic up to the 60-70 nm generation (conditions for securing 50 or more traps in the trap density of $1 \times 10^{12}$ cm$^{-2}$).

Considering the above circumstances, the inventors examined how far limitations of the floating gate type can go assuming that a method of solving the problem of reliability of the tunnel insulating film or inter-electrode insulating film or the problem of wiring is found. If the size of floating gate falls to 10 to 15 nm or less, the floating gate is believed to begin to behave like quantum dots. Therefore, the inventors conducted research and development of a new type of memory cell making good use of the above characteristics.

As a result, the inventors focused on a quantum-dot memory. The quantum dot memory can roughly be divided into two types.

One is a technology that utilizes many quantum dots having fluctuations as an aggregate, considering the fact that position control and quality maintenance of single quantum dots are difficult.

For example, quantum dots are embedded in a tunnel insulating film to improve programming characteristics. Moreover, quantum dots themselves may be used in place of local traps.

These technologies may partially improve conventional memory cell characteristics. However, since a plurality of quantum dots are embedded corresponding to one floating gate, the floating gate itself cannot be made so microscopic that quantum dot properties appear, thus fundamental progress is not expected. In addition, manufacturing costs increase because reliability of a tunnel insulating film containing a quantum dot layer becomes lower than that of a tunnel insulating film of the floating gate type due to the presence of quantum dots.

The other is a technology that utilizes quantum dots as a floating gate.

A floating gate of 10 nm is self-aligningly formed in a trough of a recess without position fluctuations on a longitudinal structure in which a tetrahedral shaped recess is cut out in a GaAs substrate.

Since data is stored depending on whether or not one electron is present, for example, terabit-level scaling can be handled. However, the size of a recess opening is actually several micrometers and thus, a cell occupied area will be vastly larger than a file memory using a silicon substrate.

That is, the key to making a cell finer is to make an opening finer. Making a recess opening finer is limited also by limitations of making a GaAs substrate thinner because a source and a drain are arranged vertically. In addition, the GaAs substrate is originally not appropriate for a file memory because of increased bit costs.

In view of the above circumstances, the inventors have realized a new memory architecture that uses a silicon technology, solves the problem of reliability by separating the gate insulating film and the tunnel insulating film, operates even on a scale (5 nm×5 nm×5 nm) where a floating gate behaves like quantum dots, and further is randomly programmable is desired.

Such a next-generation file memory that solves the problems of finer structures and reliability will be called a "multi-dot flash memory" hereafter.

2. Embodiments

Embodiments of a multi-dot flash memory in the present invention will be described below.

(1) First Embodiment

FIG. 13 is a bird's-eye view showing a memory cell array of a multi-dot flash memory. FIG. 14 is a sectional view in a first direction of the memory cell array in FIG. 13.

Active areas (for example, a silicon substrate) AA, ... are arranged in a line & space structure in the first direction and a line of the active areas AA, ... extends in a second direction. Bit lines BL, ... are arranged above the space between the active areas AA, ... and extend on the second direction. The space between the active areas AA, ... becomes a device isolation area (for example, a shallow trench isolation (STL)).

Floating gates FG, ... are arranged like an array in the space above the active areas AA, ... and between the bit lines BL, .... Each of the floating gates FG, ... is sandwiched between the left and right bit lines BL (L) and BL (R).

A gate insulating film is arranged in a space between the active areas AA, ... and the floating gates FG, .... A tunnel insulating film is arranged in a space between the bit lines BL, ... and the floating gates FG, .... Thus, the problem of reliability is solved by separating the gate insulating film and the tunnel insulating film.

Control gates CG, ... are arranged above the floating gates FG, .... An inter-electrode insulating film (for example, IPD) is arranged in a space between the floating gates FG, ... and the control gates CG, .... Word lines WL, ... are arranged above the control gates CG, .... The word lines WL, ... extend in the first direction and are connected commonly to the control gates CG, ... arranged by being aligned in the first direction.

In a multi-dot flash memory having the structure described above, as shown in FIG. 14, charges can be injected/discharged into/from the floating gate FG by controlling a gate voltage VG applied to the word line WL, a voltage V1 applied to the left bit line BL (L), and a voltage V2 applied to the right bit line BL (R).

Size relations among these voltages are assumed to be, for example, (a) V2 (positive voltage)>V1 (negative voltage), VG>0 V and (b) V1 (positive voltage)>V2 (negative voltage), VG>0 V. The case of (a) will be described below.

Figure 15:
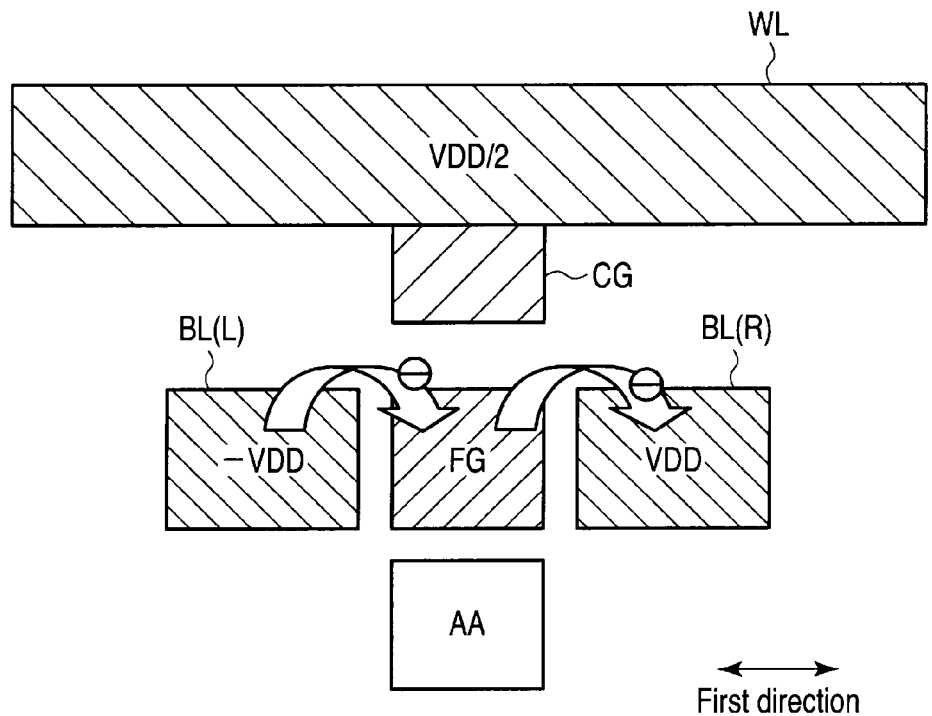

More specifically, as shown in FIG. 15, VG=VDD/2, V1=−VDD, and V2=VDD are set for programming, where VDD is a supply voltage. Here, programming is an operation to inject electrons into the floating gate FG. This also applies below.

In this case, electrons are injected into the floating gate FG from the left bit line BL (L) and a portion thereof is discharged from the floating gate FG into the right bit line BL (R).

Figure 16:
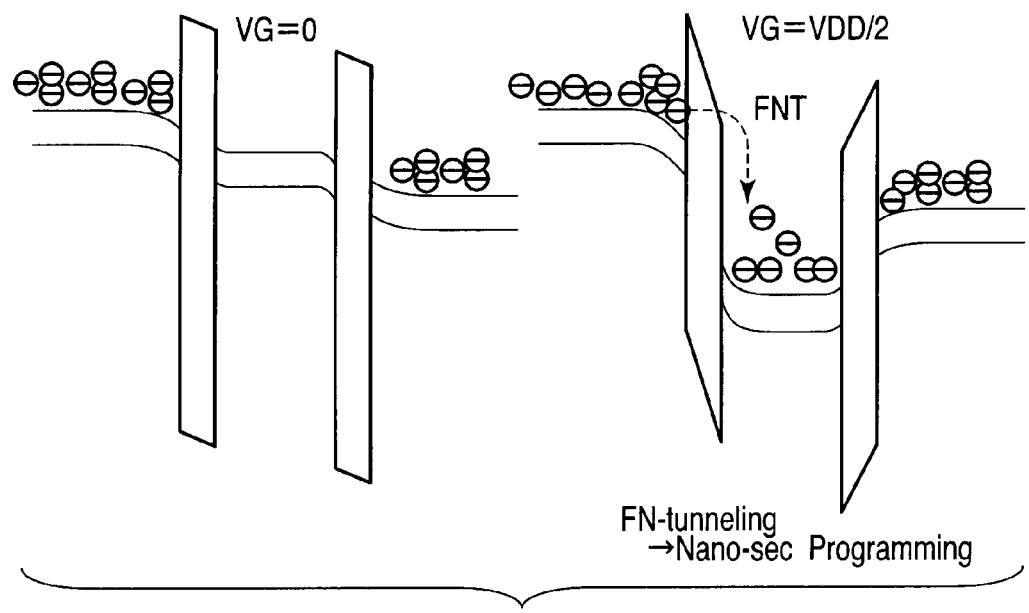
FIG. 16 is a diagram showing a principle of programming by FN-tunneling.

FIG. 16 is a band diagram for illustrating a programming mechanism.

When VG=0 V, V1=−VDD, and V2=VDD, an electric field is applied to a tunnel insulating film between the left bit line BL (L) and the floating gate FG and a tunnel insulating film between the floating gate FG and the right bit line BL (R).

The electric field acts to cause electrons to hop from the left bit line BL (L) to the right bit line BL (R) via the floating gate FG, but the action is small and no hopping occurs in a short time.

Thus, if VG is changed, such as in VG=0 V→VDD/2, V1=−VDD, and V2=VDD, the electric field applied to the tunnel insulating film between the left bit line BL (L) and the floating gate FG becomes stronger, leading to injection of electrons into the floating gate FG due to Fowler-Nordheim tunneling (FNT).

At the same time, the electric field applied to the tunnel insulating film between the floating gate FG and the right bit line BL (R) becomes weaker or field reversing occurs under certain voltage conditions. Therefore, a tunnel current flowing through the tunnel insulating film disappears or becomes extremely weak.

In this manner, electrons are injected into the floating gate FG for execution of programming.

Naturally, depending on relationships between the thickness of the tunnel insulating films between the two left and right bit lines BL (L) and BL (R) and the floating gate FG and the voltages applied thereto (more specifically, values of V1, V2, and VG), "direct tunneling (DT)" shown in FIG. 17 may occur, instead of "Fowler-Nordheim tunneling" shown in FIG. 16.

In the example in FIG. 17, for example, electrons are injected into the floating gate FG from the left bit line BL (L) through direct tunneling by setting VG=0 V→VDD/4, V1=−VDD, and V2=VDD.

In this case, while the programming speed becomes slower than electron injection by Fowler-Nordheim tunneling, the programming speed can be made closer to that by Fowler-Nordheim tunneling by making the tunnel insulating film thinner.

Since the supply voltage VDD can be lowered by using direct tunneling, it is desirable to use Fowler-Nordheim tunneling and direct tunneling differently in accordance with design specifications.

Subsequently, an erasing mechanism will be described.

Figure 19:
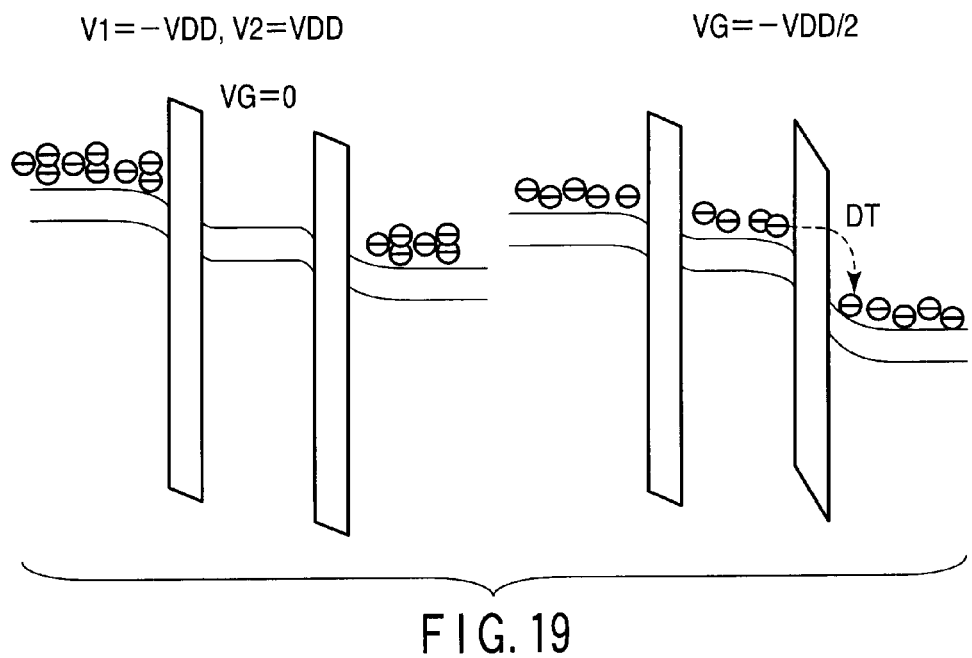
FIG. 19 is a diagram showing a principle of erasing by direct tunneling.

FIG. 18 is a band diagram utilizing Fowler-Nordheim tunneling and FIG. 19 is a band diagram utilizing direct tunneling.

As shown in FIG. 18, electrons in the floating gate FG are discharged into the right bit line BL (R) by Fowler-Nordheim tunneling by setting VG=0 V→−VDD, V1=−VDD, and V2=VDD. When VG=0 V, this discharge does not occur.

As shown in FIG. 19, electrons in the floating gate FG are discharged into the right bit line BL (R) by direct tunneling by setting VG=0 V→−VDD/2, V1=−VDD, and V2=VDD. When VG=0 V, this discharge does not occur.

Also for erasing, while the speed (erasing speed) of electron emission by direct tunneling becomes slower than that by Fowler-Nordheim tunneling, the speed can be made closer to the speed of electron emission by Fowler-Nordheim tunneling by making the tunnel insulating film thinner.

Since the supply voltage VDD can be lowered by using direct tunneling, it is desirable to use Fowler-Nordheim tunneling and direct tunneling differently in accordance with design specifications.

As described above, the first embodiment is characterized in that one of two tunnel insulating films present on the left and right sides of the floating gate FG is used for charge injection for programming and the other for charge discharge for erasing.

Since the direction of the tunnel current (flow of electrons) flowing through the tunnel insulating films is made always constant by using the tunnel insulating films as described above, reliability of the tunnel insulating films can be improved.

FIGS. 20A to 20C and 21A to 21C each shows a cross section of multi-dot flash memory in a second direction.

Compared with the structure shown in FIG. 13, this structure is characterized in that the position of the word line WL in the height direction is made for every other word line WL. Apart from this, the structure is the same as that shown in FIG. 13.

By adopting the structure shown above, the pitch of the word lines WL, . . . can be made wider while making the pitch of the floating gate FG, . . . narrower. That is, it becomes possible to make the memory cells finer by making the pitch of the floating gate FG, . . . narrower and also to decrease resistance of the word lines WL, . . . by making the pitch thereof wider.

When a shallow trench isolation (STI) is formed in a semiconductor substrate (for example, a silicon substrate), the active area AA becomes an area other than the device isolation area where STI is formed. The floating gate FG, . . . is comprised by, for example, a material obtained by thermally oxidizing single crystal silicon, a material obtained by radically oxidizing polysilicon and the like.

A plurality of memory cells MC, . . . are serially connected in the second direction and, like the NAND flash memory, comprises a NAND row. One memory cell MC has one floating gates GF. A source diffusion layer (Source) 17A is formed at one end of the NAND row and a drain diffusion layer (Drain) 17B is formed at the other end.

Figure 20A:
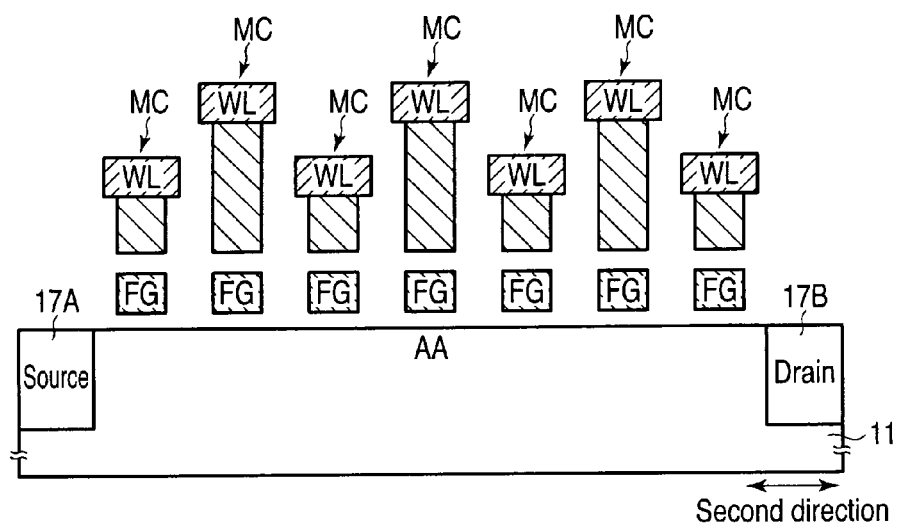
FIGS. 20A to 20C and 21A to 21C are diagrams, each showing a modification of a device structure in the first embodiment.
Figure 20B:
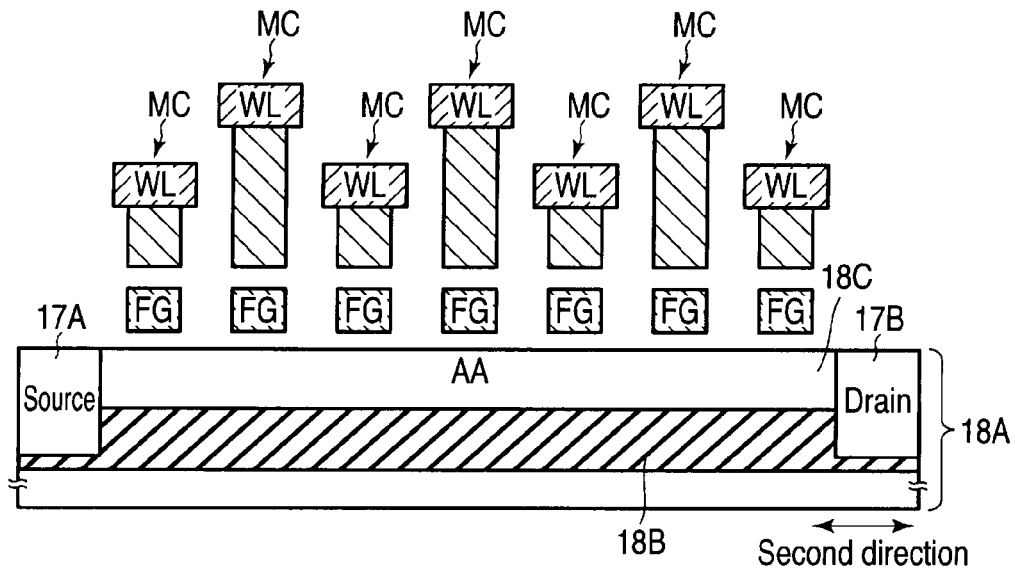
Figure 21A:
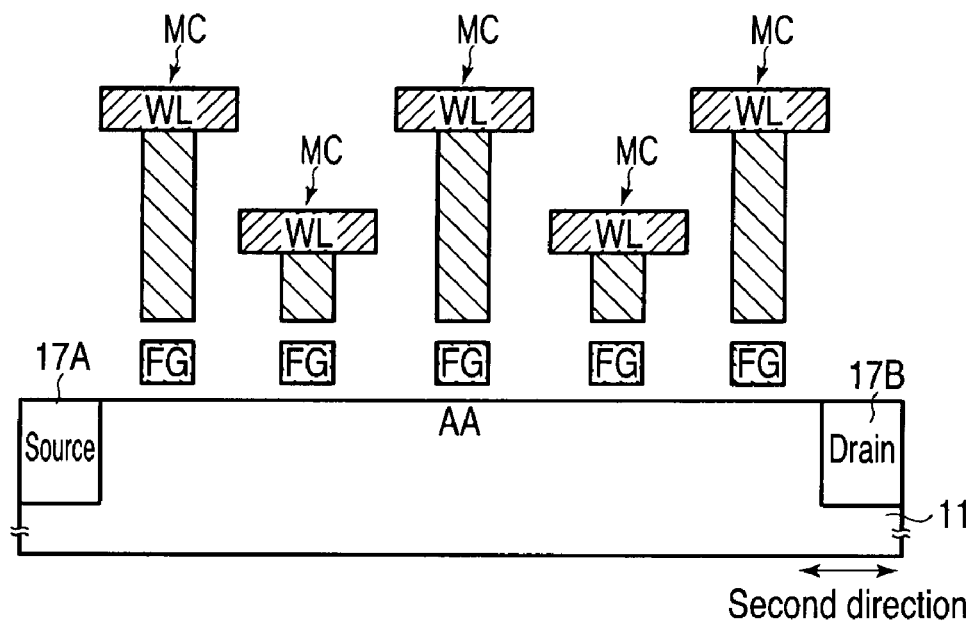
Figure 21B:
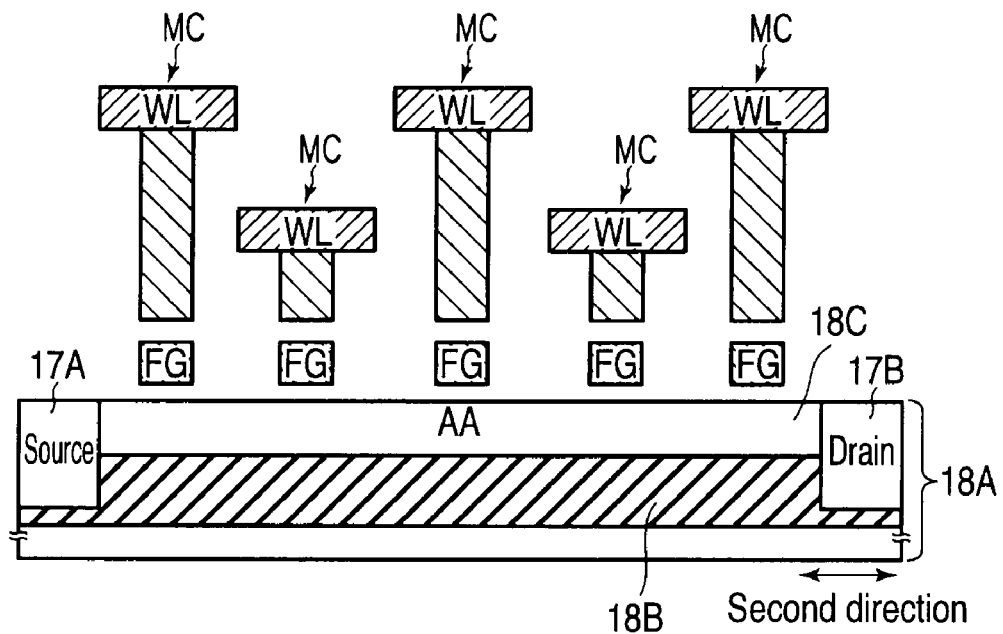

Here, FIGS. 20A and 21A are examples in which the semiconductor substrate (for example, a silicon substrate) 11 is made the active area AA, and FIGS. 20B and 21B are examples in which a semiconductor layer 18C on an insulating layer 18B in a SOI (silicon on insulator) substrate 18A is made the active area AA.

Figure 20C:
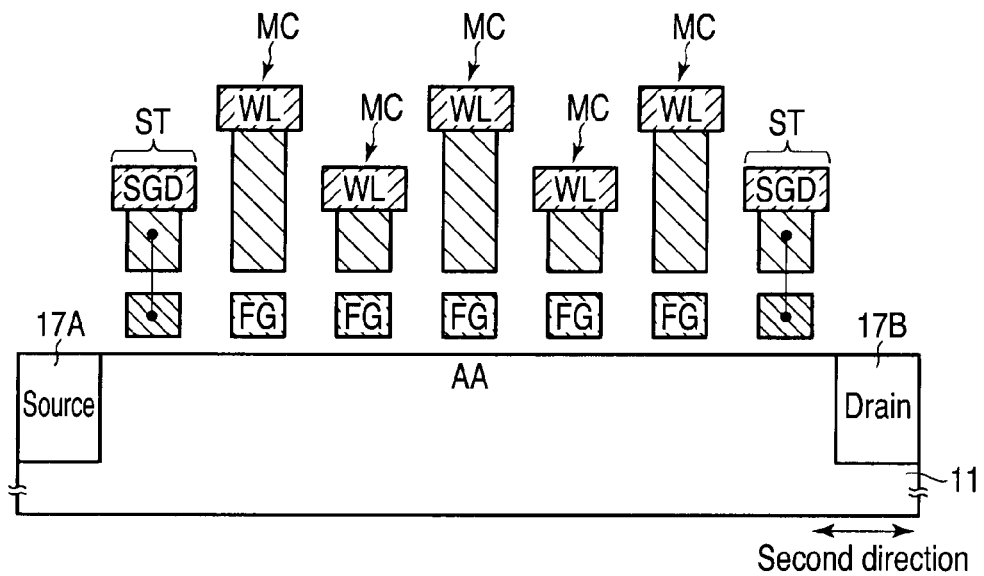
Figure 21C:
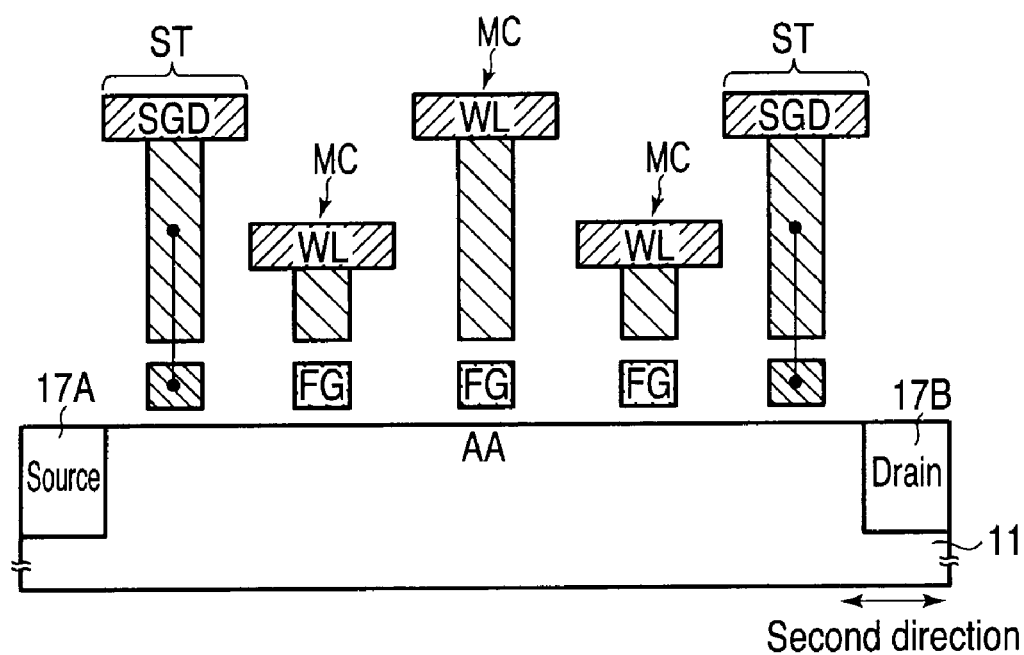

FIGS. 20C and 21C are modifications of the structures of the FIGS. 20A and 21A, respectively, and are examples in which a select gate transistor ST is arranged between a NAND row (memory cells MC) and the source/drain diffusion layers (Source/Drain) 17A, 17B. A gate is formed by short-circuit lines.

In the case of FIGS. 20B and 21B, if the semiconductor layer 18C on the insulating layer 18B is made sufficiently thin, reading/programming becomes possible even if the select gate transistor is omitted.

When a NAND row is comprised by a plurality of memory cells MC, . . . , the plurality of memory cells MC, . . . may be normally on or normally off. For FIGS. 20B and 21B, on/off can be controlled by normally turning on the memory cell MC and controlling growth of a depletion layer in the semiconductor layer 18C by the voltage of the word lines WL, . . . .

Incidentally, though no diffusion layer is formed between the memory cells MC, . . . serially connected and the select gate transistor ST in FIGS. 20 and 21, a diffusion layer may naturally be formed there.

As the memory cells MC, . . . have increasingly finer structures, on/off of a current pathway in a NAND row can commonly be controlled by controlling the voltage of the word line WL without the diffusion layer.

Figure 22:
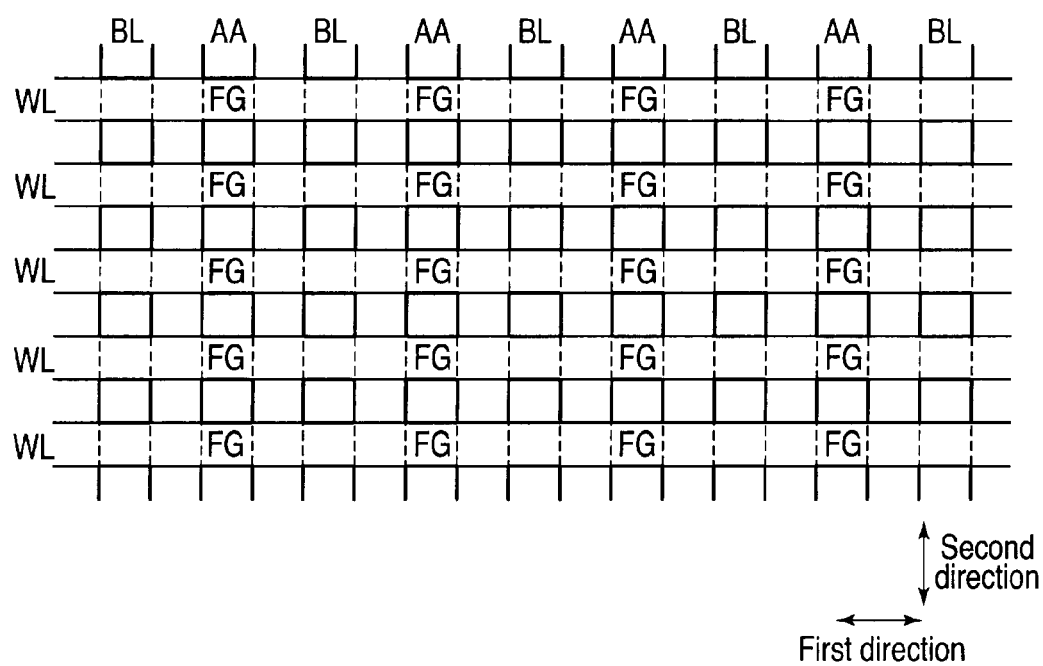
FIG. 22 is a diagram showing a memory cell array.

FIG. 22 is a diagram of the bird's-eye view in FIG. 13 viewed from right above.

The word lines WL, . . . extend in the horizontal direction (first direction) and the bit lines BL, . . . extend in the vertical direction (second direction). The active areas AA, . . . extend like the bit lines BL, . . . in the vertical direction.

The floating gates FG, . . . are arranged on the active areas AA, . . . . The floating gates FG, . . . are arranged between the bit lines BL, . . . .

First, the programming method will be described.

In a description below, the bit line BL (L/R) means the left bit line BL (L) or the right bit line BL (R).

Figure 23A:
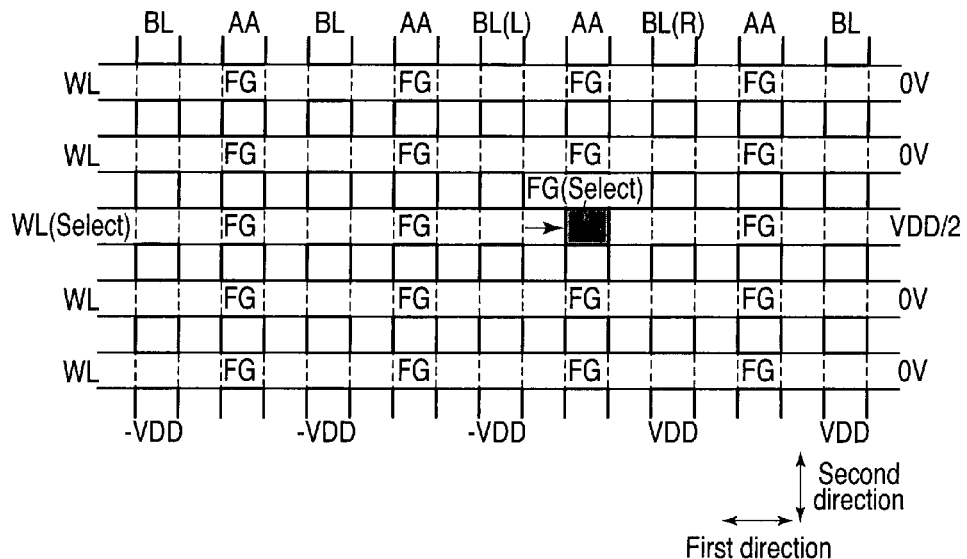
FIGS. 23A and 23B are diagrams, each showing a first example of a programming method.
Figure 23B:
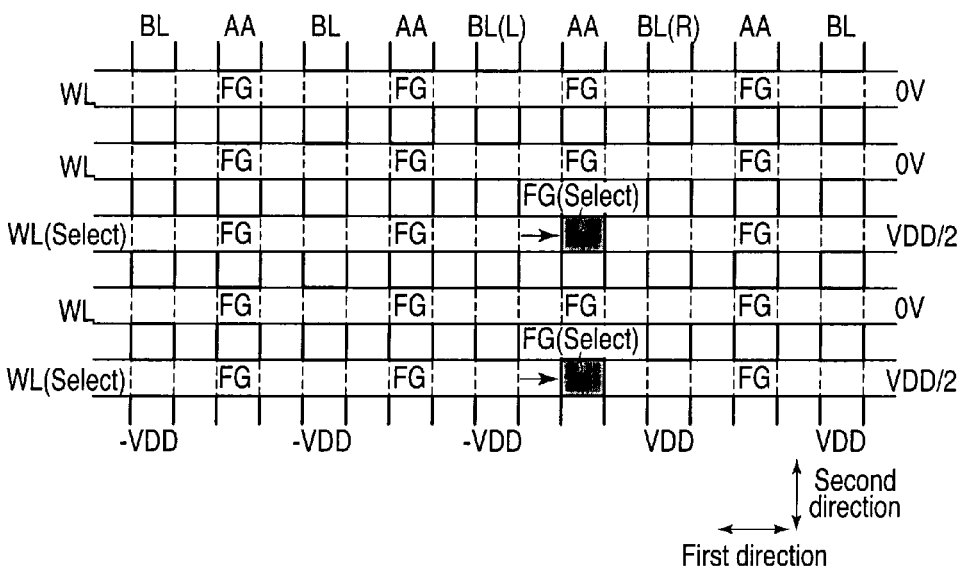

FIGS. 23A and 23B show a first example of the programming method.

FIG. 23A is an example in which electrons are injected into a selected floating gate FG (Select) from the left bit line BL (L) present on the left side thereof.

In this case, the left bit line BL (L) is set to −VDD and all left bit lines BL present further on the left side to −VDD. Also, the right bit line BL (R) is set to +VDD and all right bit lines BL present further on the right side to +VDD.

The word line WL (Select) present on the selected floating gate FG (Select) is set to +VDD/2 and other word lines WL to 0 V.

In this state, electrons are injected, as shown by an arrow, from the left bit line BL (L) into the selected floating gate FG (Select).

As an application example of FIG. 23A, electrons can also be simultaneously injected into a plurality of floating gates present in the same NAND row.

FIG. 23B is an example in which electrons are injected into the two selected floating gates FG (Select) present in the same NAND row from the left bit lines BL (L) present on the left side thereof.

Voltages in FIG. 23B are the same as those in FIG. 23A except that +VDD/2 is applied to the two word lines WL (Select).

Figure 24A:
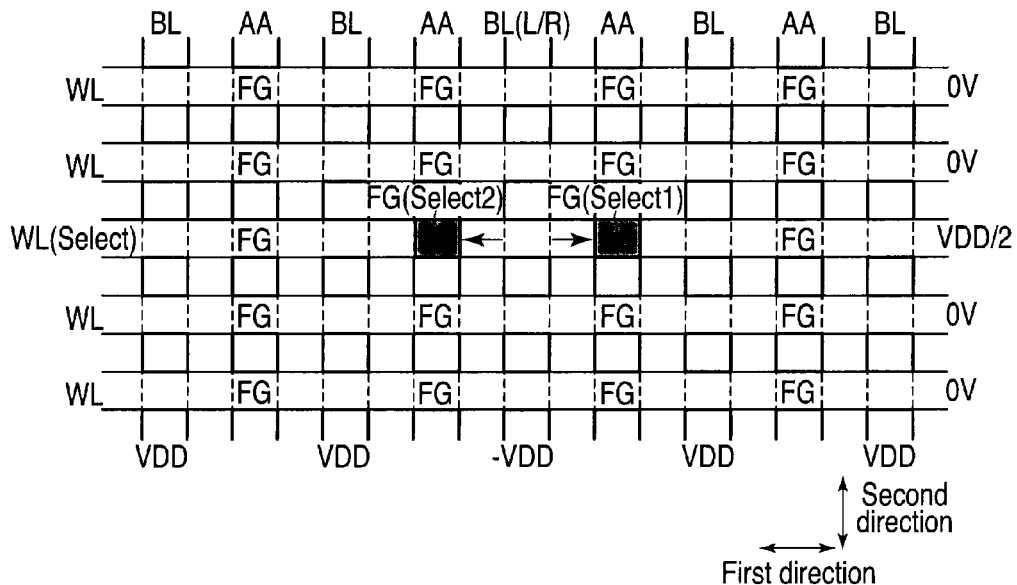
FIGS. 24A and 24B are diagrams, each showing a second example of a programming method.
Figure 24B:
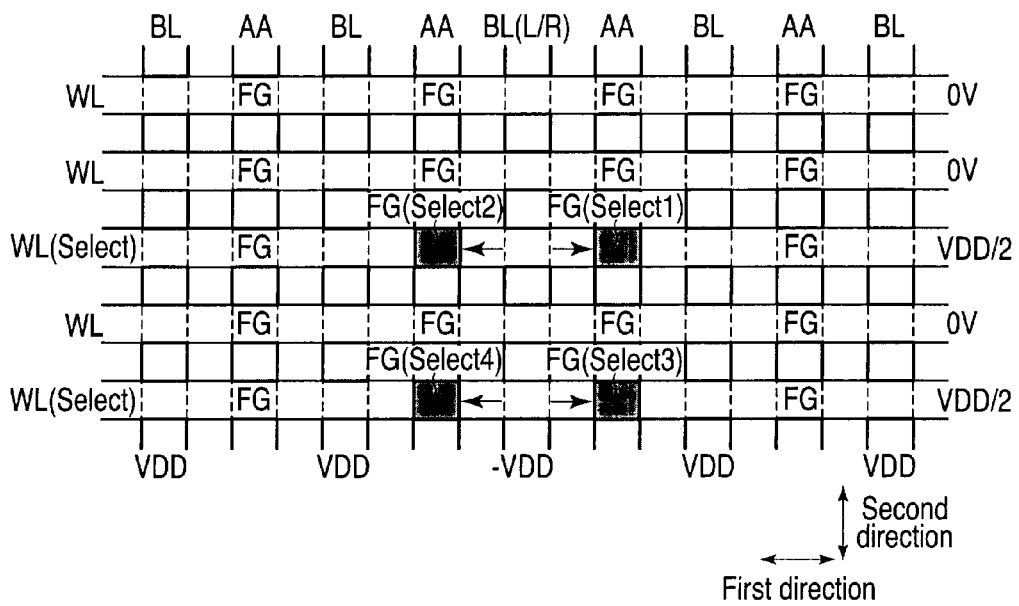

FIGS. 24A and 24B show a second example of the programming method.

FIG. 24A is an example in which electrons are injected into two selected floating gates FG (Select 1) and FG (Select 2) present immediately below the same word line WL (Select).

More specifically, electrons are injected into the selected floating gate FG (Select 1) from the left bit line BL (L) present on the left side thereof. Also, electrons are injected into the selected floating gate FG (Select 2) from the right bit line BL (R) present on the right side thereof.

In this case, the left/right bit lines BL (L/R) are set to −VDD and other bit lines BL to +VDD.

The word line WL (Select) present on the two selected floating gates FG (Select 1) and FG (Select 2) is set to +VDD/2 and other word lines WL to 0 V.

In this state, electrons are injected, as shown by arrows, from the left/right bit lines BL (L/R) into the two selected floating gates FG (Select 1) and FG (Select 2) simultaneously.

As an application example of FIG. 24A, electrons can also be simultaneously injected into a plurality of floating gates further present in the same NAND row.

FIG. 24B is an example in which electrons are injected into further selected two floating gates FG (Select 3) and FG (Select 4) from the left/right bit lines BL (L/R) present on the left/right sides thereof.

Voltages in FIG. 24B are the same as those in FIG. 24A except that +VDD/2 is applied to the two word lines WL (Select).

Figure 25A:
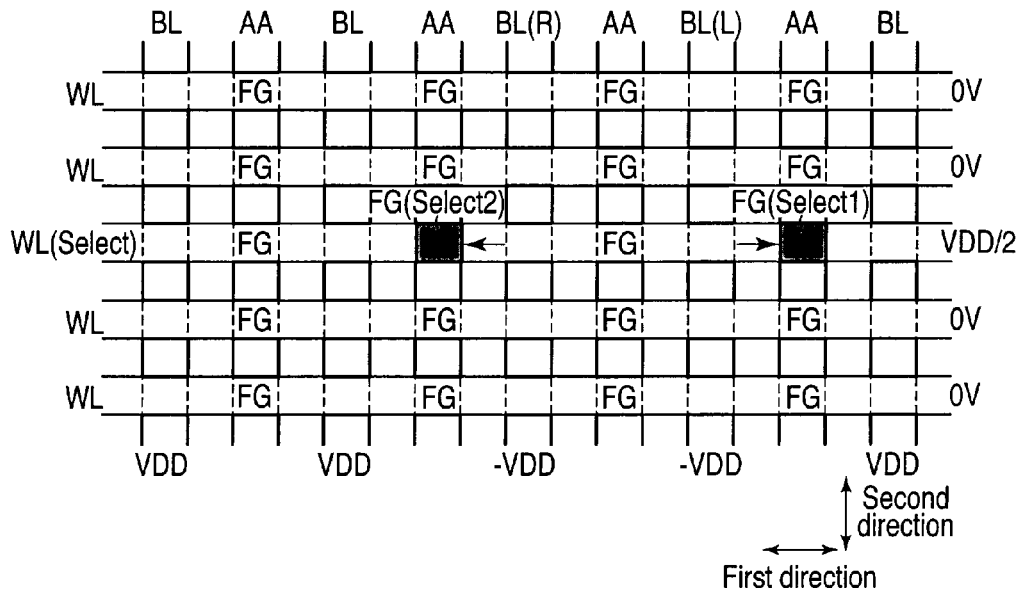
FIGS. 25A and 25B are diagrams, each showing a third example of a programming method.
Figure 25B:
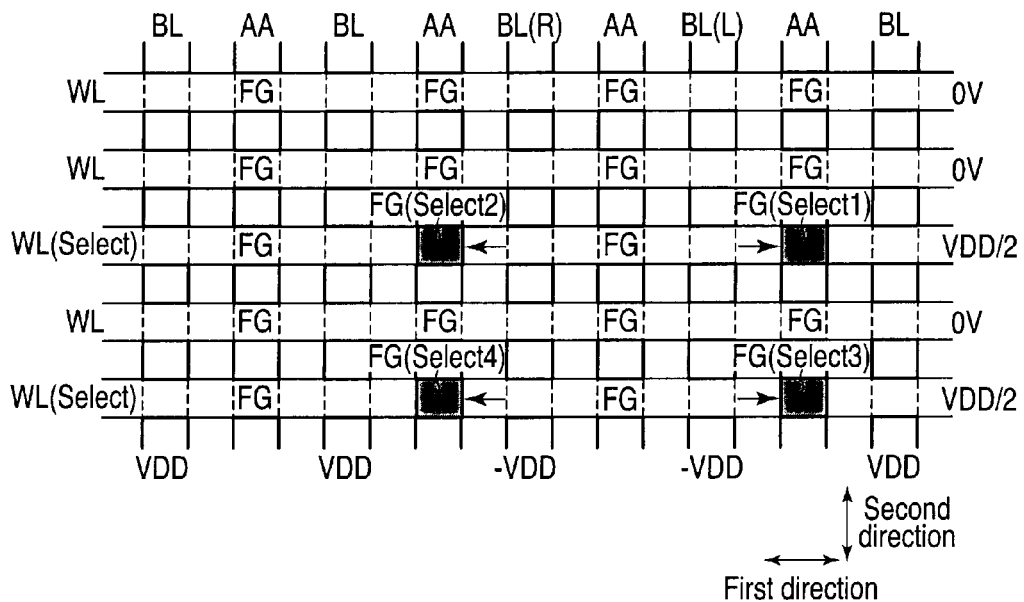

FIGS. 25A and 25B show a third example of the programming method.

FIG. 25A is an example in which electrons are injected into the two selected floating gates FG (Select 1) and FG (Select 2) present immediately below the same word line WL (Select).

More specifically, electrons are injected into the selected floating gate FG (Select 1) from the left bit line BL (L) present on the left side thereof. Also, electrons are injected into the selected floating gate FG (Select 2) from the right bit line BL (R) present on the right side thereof.

The third example is different from the second example in that the two selected floating gates FG (Select 1) and FG (Select 2) are not adjacent in the first direction and a non-selected floating gate is present in between.

In this case, the left bit line BL (L) and the right bit line BL (R) are set to −VDD and other bit lines BL to +VDD.

One floating gate is present between the selected floating gates FG (Select 1) and FG (Select 2) in the present example. If two or more floating gates FG are present in between, all bit lines present between the floating gates FG (Select 1) and FG (Select 2) are set to −VDD.

Then, the word line WL (Select) present on the two selected floating gates FG (Select 1) and FG (Select 2) is set to +VDD/2 and other word lines WL to 0 V.

In this state, electrons are injected, as shown by arrows, from the left bit line BL (L) into the selected floating gate FG (Select 1) and also from the right bit line BL (R) into the selected floating gate FG (Select 2).

As an application example of FIG. 25A, electrons can also be simultaneously injected into a plurality of floating gates further present in the same NAND row.

FIG. 25B is an example in which electrons are injected into the further selected two floating gates FG (Select 3) and FG (Select 4).

More specifically, electrons are injected into the selected floating gate FG (Select 3) from the left bit line BL (L) present on the left side thereof. Also, electrons are injected into the selected floating gate FG (Select 4) from the right bit line BL (R) present on the right side thereof.

Voltages in FIG. 25B are the same as those in FIG. 25A except that +VDD/2 is applied to the two word lines WL (Select).

Figure 26A:
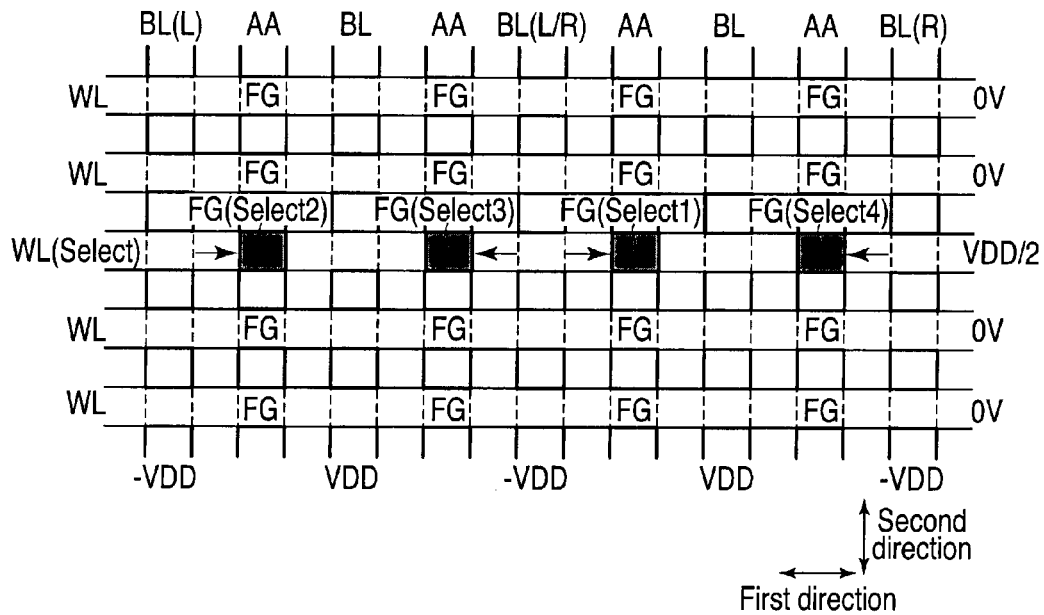
FIGS. 26A and 26B are diagrams, each showing a fourth example of a programming method.
Figure 26B:
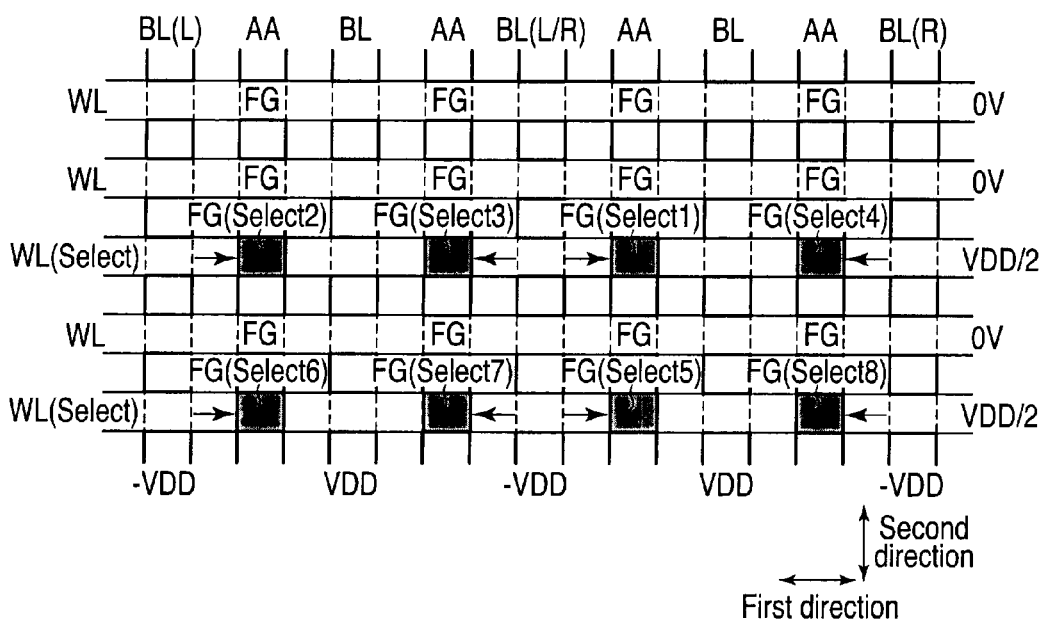

FIGS. 26A and 26B show a fourth example of the programming method.

FIG. 26A is an example in which electrons are injected into the four selected floating gates FG (Select 1), FG (Select 2), FG (Select 3), and FG (Select 4) present immediately below the same word line WL (Select).

More specifically, electrons are injected into the selected floating gates FG (Select 1) and FG (Select 2) from the left bit line BL (L) present on the left side thereof. Also, electrons are injected into the selected floating gates FG (Select 3) and FG (Select 4) from the right bit line BL (R) present on the right side thereof.

In this case, the left bit line BL (L) and the right bit line BL (R) are set to −VDD and other bit lines BL to +VDD.

In addition, all left bit lines present further on the left side from the leftmost bit line BL (L) in FIG. 26A and all right lines present further on the right side from the rightmost bit line BL (R) in FIG. 26A are set to −VDD.

Then, the word line WL (Select) present on the four selected floating gates FG (Select 1), FG (Select 2), FG (Select 3), and FG (Select 4) is set to +VDD/2 and other word lines WL to 0 V.

In this state, electrons are injected, as shown by arrows, from the left bit line BL (L) into the selected floating gates FG (Select 1) and FG (Select 2) and also from the right bit line BL (R) into the selected floating gates FG (Select 3) and FG (Select 4).

According to the fourth example, for example, programming (electron injection) to all floating gates (corresponding to one or a plurality of pages of NAND flash memory) present immediately below the word line WL (Select) can be performed.

As an application example of FIG. 26A, electrons can also be simultaneously injected into a plurality of floating gates further present in the same NAND row.

FIG. 26B is an example in which electrons are injected into further selected four floating gates FG (Select 5), FG (Select 6), FG (Select 7), and FG (Select 8).

More specifically, electrons are injected into the selected floating gates FG (Select 5) and FG (Select 6) from the left bit line BL (L) present on the left side thereof. Also, electrons are injected into the selected floating gates FG (Select 7) and FG (Select 8) from the right bit line BL (R) present on the right side thereof.

Voltages in FIG. 26B are the same as those in FIG. 26A except that +VDD/2 is applied to the two word lines WL (Select).

In the above first to fourth examples regarding the programming method, V1 is set at −VDD, V2 is set at +VDD, and VG is set at VDD/2. As described above, bias conditions (values of V1, V2, and VG) for programming are riot limited to these values.

Next, the erasing method will be described.

In a description below, the bit line BL (L/R) means the left bit line BL (L) or the right bit line BL (R).

Figure 27A:
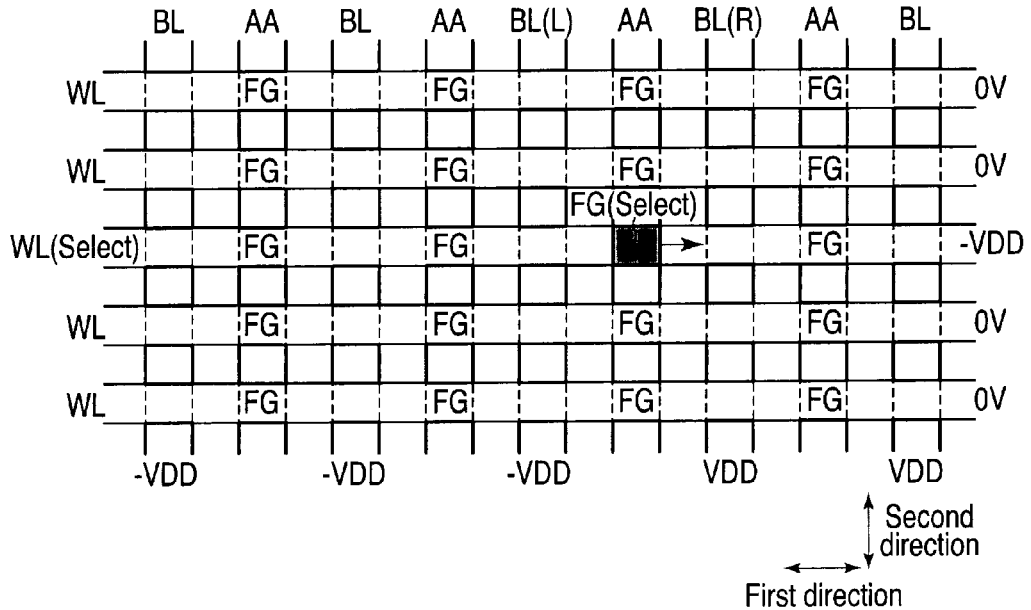
FIGS. 27A and 27B are diagrams, each showing a first example of an erasing method.
Figure 27B:
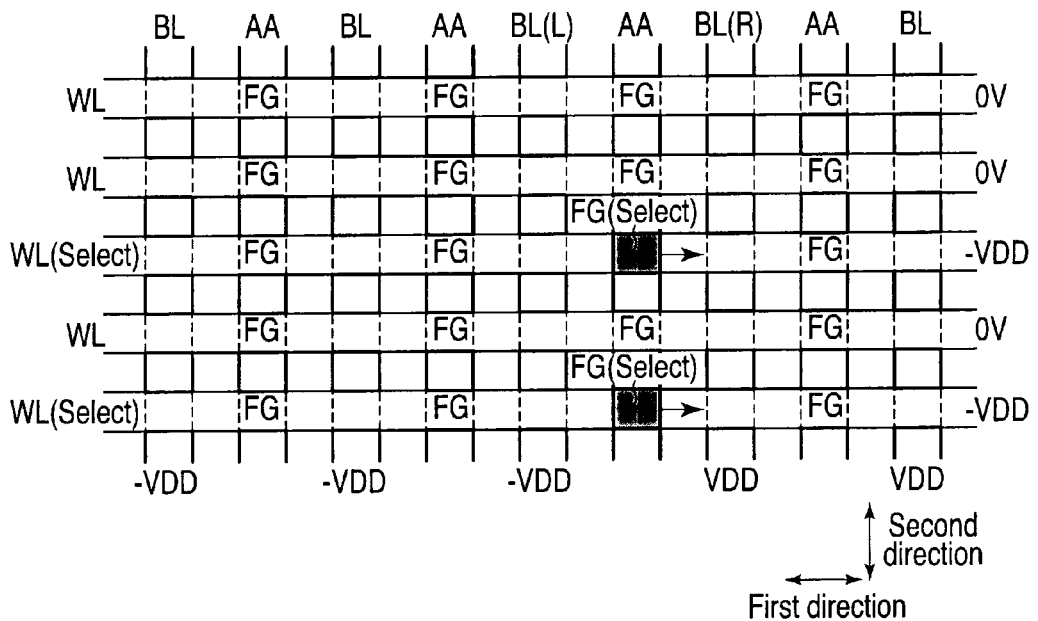

FIGS. 27A and 27B show a first example of the erasing method.

The first example is the erasing method corresponding to the first example (FIG. 23) of the programming method.

FIG. 27A is an example in which electrons are discharged from inside a selected floating gate FG (Select) into the right bit line BL (R) present on the right side thereof.

In this case, the left bit line BL (L) is set to −VDD and all left bit lines BL present further on the left side to −VDD. Also, the right bit line BL (R) is set to +VDD and all right bit lines BL present further on the right side to +VDD.

The word line WL (Select) present on the selected floating gate FG (Select) is set to −VDD and other word lines WL to 0 V.

In this state, electrons are discharged, as shown by an arrow, from the selected floating gate FG (Select) into the right bit line BL (R).

As an application example of FIG. 27A, electrons can also be simultaneously discharged from a plurality of floating gates present in the same NAND row.

FIG. 27B is an example in which electrons are discharged from inside two selected floating gates FG (Select) present in the same NAND row into the right bit line BL (R) present on the right side thereof.

Voltages in FIG. 27B are the same as those in FIG. 27A except that −VDD is applied to the two word lines WL (Select).

Figure 28A:
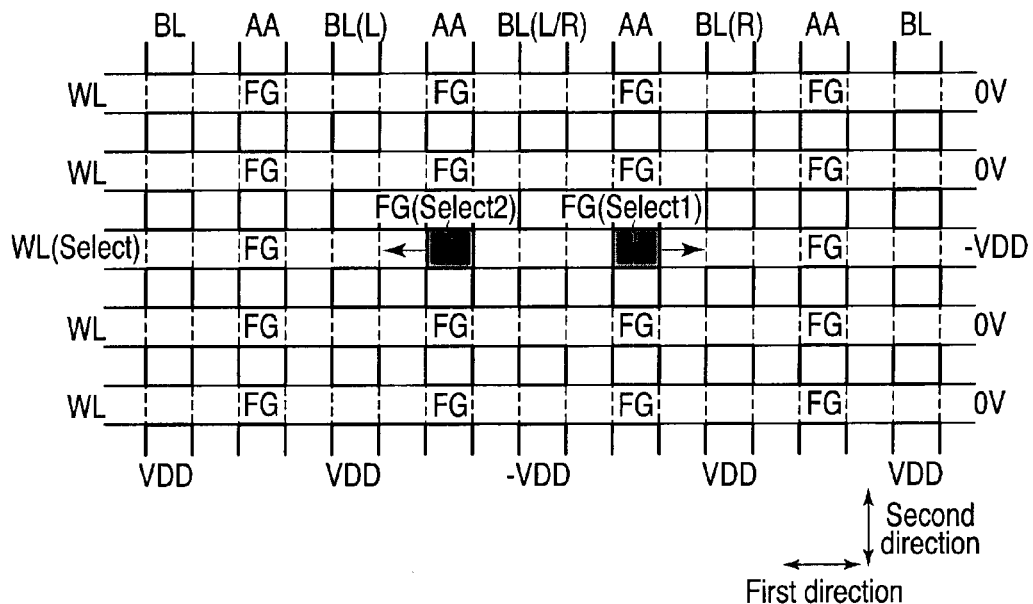
FIGS. 28A and 28B are diagrams, each showing a second example of an erasing method.
Figure 28B:
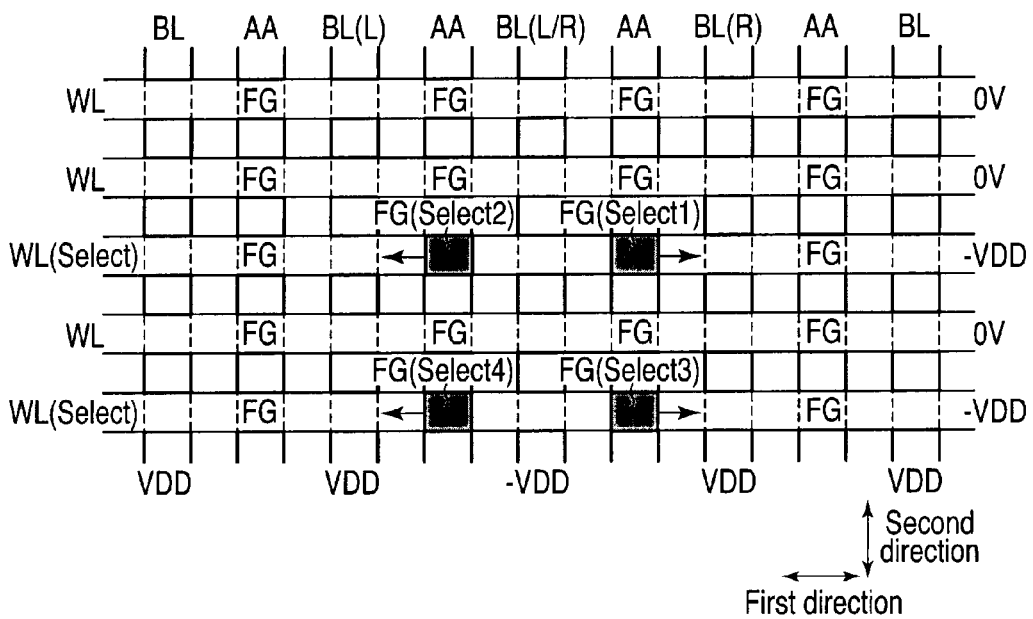

FIGS. 28A and 28B show a second example of the erasing method.

The second example is the erasing method corresponding to the second example (FIG. 24) of the programming method.

FIG. 28A is an example in which electrons are discharged from the two selected floating gates PG (Select 1) and FG (Select 2) present immediately below the same word line WL (Select).

More specifically, electrons are discharged from the selected floating gate FG (Select 1) into the right bit line BL (R) present on the right side thereof. Also, electrons are discharged from the selected floating gate FG (Select 2) into the left bit line BL (L) present on the left side thereof.

In this case, the left/right bit lines BL (L/R) are set to −VDD and other bit lines BL to +VDD.

The word line WL (Select) present on the two selected floating gates FG (Select 1) and FG (Select 2) is set to −VDD and other word lines WL to 0 V.

In this state, electrons are discharged, as shown by arrows, from the selected floating gate FG (Select 1) into the right bit line BL (R) and also from the selected floating gate FG (Select 2) into the left bit line BL (L).

As an application example of FIG. 28A, electrons can also be simultaneously discharged from a plurality of floating gates further present in the same NAND row.

FIG. 28B is an example in which electrons are discharged from inside the further selected floating gate FG (Select 3) into the right bit line BL (R) present on the right side thereof and also from inside the selected floating gate FG (Select 4) into the left bit line BL (L) present on the left side thereof.

Voltages in FIG. 28B are the same as those in FIG. 28A except that −VDD is applied to the two word lines WL (Select).

Figure 29A:
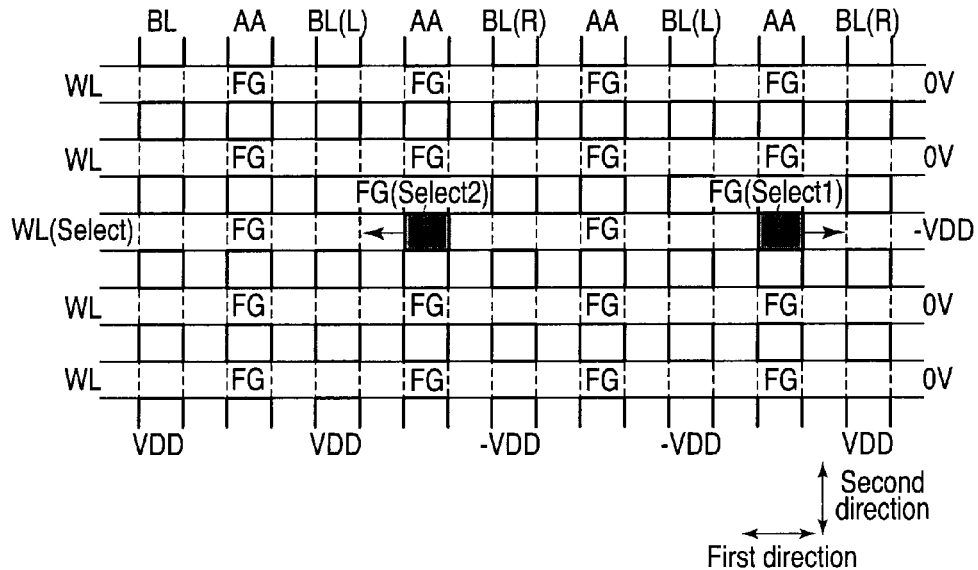
FIGS. 29A and 29B are diagrams, each showing a third example of an erasing method.
Figure 29B:
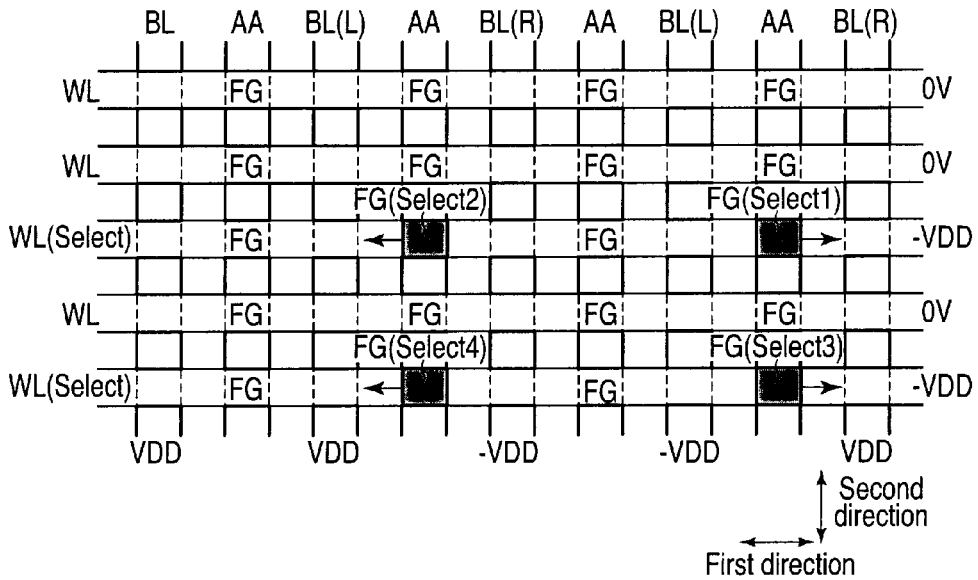

FIGS. 29A and 29B show a third example of the erasing method.

The third example is the erasing method corresponding to the third example (FIG. 25) of the programming method.

FIG. 29A is an example in which electrons are discharged from inside the two selected floating gates FG (Select 1) and FG (Select 2) present immediately below the same word line WL (Select).

More specifically, electrons are discharged from the selected floating gate FG (Select 1) into the right bit line BL (R) present on the right side thereof. Also, electrons are discharged from the selected floating gate FG (Select 2) into the left bit line BL (L) present on the left side thereof.

In this case, the left bit line BL (L) present on the left side of the selected floating gate FG (Select 1) and the right bit line BL (R) present on the right side of the selected floating gate FG (Select 2) are set to −VDD and other bit lines BL to +VDD.

One floating gate is present between the selected floating gates FG (Select 1) and FG (Select 2) in the present example. If two or more floating gates PG are present in between, all bit lines present between the floating gates FG (Select 1) and FG (Select 2) are set to −VDD.

Then, the word line WL (Select) present on the two selected floating gates FG (Select 1) and FG (Select 2) is set to −VDD and other word lines WL to 0 V.

In this state, electrons are discharged, as shown by arrows, from the selected floating gate FG (Select 1) into the right bit line BL (R) and also from the selected floating gate FG (Select 2) into the left bit line BL (L).

As an application example of FIG. 29A, electrons can also be simultaneously discharged from a plurality of floating gates further present in the same NAND row.

FIG. 29B is an example in which electrons are discharged from inside the further selected two floating gates FG (Select 3) and FG (Select 4).

More specifically, electrons are discharged from the selected floating gate FG (Select 3) into the right bit line BL (R) present on the right side thereof. Also, electrons are discharged from the selected floating gate FG (Select 4) into the left bit line BL (L) present on the left side thereof.

Voltages in FIG. 29B are the same as those in FIG. 29A except that −VDD is applied to the two word lines WL (Select).

Figure 30A:
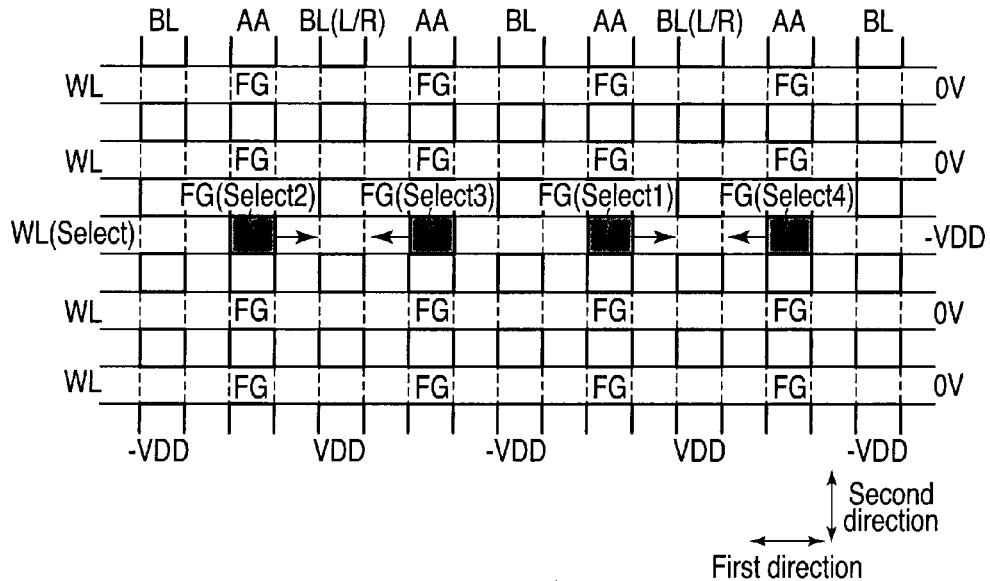
FIGS. 30A and 30B are diagrams, each showing a fourth example of an erasing method.
Figure 30B:
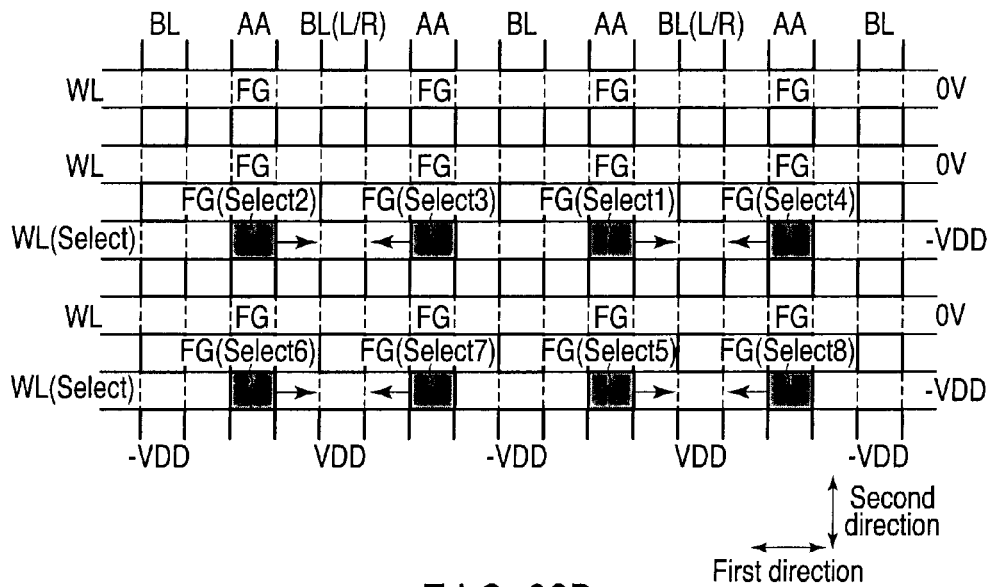

FIGS. 30A and 30B show a fourth example of the erasing method.

The fourth example is the erasing method corresponding to the fourth example (FIG. 26) of the programming method.

FIG. 30A is an example in which electrons are discharged from the four selected floating gates FG (Select 1), FG (Select 2), FG (Select 3), and FG (Select 4) present immediately below the same word line WL (Select).

More specifically, electrons are discharged from the selected floating gates FG (Select 1) and FG (Select 2) into the right bit line BL (R) present on the right side thereof. Also, electrons are discharged from the selected floating gates FG (Select 3) and FG (Select 4) into the left bit line BL (L) present on the left side thereof.

In this case, the left/right bit lines BL (L/R) are set to +VDD and other bit lines BL to −VDD.

The word line WL (Select) present on the four selected floating gates FG (Select 1), FG (Select 2), FG (Select 3), and FG (Select 4) is set to −VDD and other word lines WL to 0 V.

In this state, electrons are discharged, as shown by arrows, from the selected floating gates FG (Select 1) and FG (Select 2) into the right bit line BL (R) and also from the selected floating gates FG (Select 3) and FG (Select 4) into the left bit line BL (L).

According to the fourth example, for example, erasing of all floating gates (corresponding to one or a plurality of pages of NAND flash memory) present immediately below the word line WL (Select) can be performed.

As an application example of FIG. 30A, electrons can also be simultaneously discharged from a plurality of floating gates further present in the same NAND row.

FIG. 30B is an example in which electrons are discharged from the further selected four floating gates FG (Select 5), FG (Select 6), FG (Select 7), and FG (Select 8).

More specifically, electrons are discharged from the selected floating gates FG (Select 5) and FG (Select 6) into the right bit line BL (R) present on the right side thereof. Also, electrons are discharged from the selected floating gates FG (Select 7) and FG (Select 8) into the left bit line BL (L) present on the left side thereof.

Voltages in FIG. 30B are the same as those in FIG. 30A except that −VDD is applied to the two word lines WL (Select).

FIG. 31 shows a fifth example of the erasing method.

This erasing method is characterized by batch erasing of all floating gates. This enables block erasing or chip erasing like that of a NAND flash memory.

In the above first to fourth examples regarding the erasing method, V1 is set at −VDD, V2 is set at +VDD, and VG is set at −VDD. As described above, bias conditions (values of V1, V2, and VG) for erasing are not limited to these values.

FIG. 32 shows an example of bias conditions for programming/erasing.

In FIG. 32, VG is the gate voltage and V2−V1 is a voltage between the right bit line BL (R) present on the right side of the selected floating gate and the left bit line BL (L) present on the left side thereof.

The bias conditions are characterized in that the gate voltage is applied to the selected word line WL after a voltage is applied to between the right bit line BL (R) and the left bit line BL (L).

For programming, for example, V2−V1 is raised from 0 V to 3 V and then, VG is raised from 0 V to 5 V. In this state, programming is performed. Moreover, V2−V1 is lowered from 3 V to 0 V after lowering VG from 5 V to 0 V.

FIG. 33 shows a programming simulation under the bias conditions of FIG. 32.

In FIG. 33, the horizontal axis indicates the time and the vertical axis indicates the number of electrons stored in the floating gate.

Before the gate voltage VG is applied (0-2 nsec), electrons are not injected into the floating gate. In the period of 2 nsec and 3 nsec in which the gate voltage VG rises, electrons are injected into the floating gate one by one in accordance with the rise of VG.

That a phenomenon of one electron after another being injected is observed indicates that the cell structure utilizes programming based on a single electron effect. The size of the floating gate used for the simulation is 5 nm×5 nm×5 nm.

FIG. 34 shows electron holding characteristics (data holding characteristics).

Electron holding characteristics are an index showing how long electrons injected into a floating gate can be held inside the floating gate.

According to the cell structure, a fixed amount of electrons can be held inside a floating gate for about 100 years when a tunnel insulating film has a thickness Tox of 3.5 nm. However, this is a provisional estimate when no charge trap occurs in the tunnel insulating film.

Now, for the programming/erasing method based on the cell structure in the present invention, charge holding characteristics when a charge trap occurs in a tunnel insulating film will be described.

FIG. 35 shows a generation mechanism of a charge trap during programming. FIG. 36 shows a generation mechanism of a charge trap during erasing.

In a general non-volatile semiconductor memory, the same tunnel insulating film is used for programming and erasing. Thus, trap levels arise on both sides of the tunnel insulating film. If it is assumed that trap levels arise within the range of 25% of the whole thickness on both sides of the tunnel insulating film, a portion that actually functions as a tunnel insulating film will be 50% of the whole thickness of the tunnel insulating film.

In contrast, as described above, one feature of the multi-dot flash memory of the present invention is that a tunnel insulating film used for programming and a tunnel insulating film used for erasing are different.

In this case, as shown in FIG. 35, trap levels arise only on one side of the tunnel insulating film used for programming. Thus, if it is assumed that trap levels arise within the range of 25% of the whole thickness on one side of the tunnel insulating film, a portion that actually functions as a tunnel insulating film will be 75% of the whole thickness of the tunnel insulating film.

Similarly, as shown in FIG. 36, trap levels also arise only on one side of the tunnel insulating film used for erasing. Thus, if it is assumed that trap levels arise within the range of 25% of the whole thickness on one side of the tunnel insulating film, a portion that actually functions as a tunnel insulating film will be 75% of the whole thickness of the tunnel insulating film.

That is, according to the cell structure of the present invention, a portion that actually functions as a tunnel insulating film can be made larger than that of a cell structure of a general non-volatile semiconductor memory cell and thus, the tunnel insulating film can advantageously be made thinner.

Moreover, the gate insulating film and the tunnel insulating film are completely separated and thus, the threshold window will not be narrowed after repeating programming/erasing.

Incidentally, a memory cell of the application concerned is characterized by two tunnel insulating films and in view of the problem of reliability, it is desirable to use the tunnel insulating films by defining a tunnel insulating film for programming and that for erasing.

Subsequently, the reading method will be described.

Figure 37:
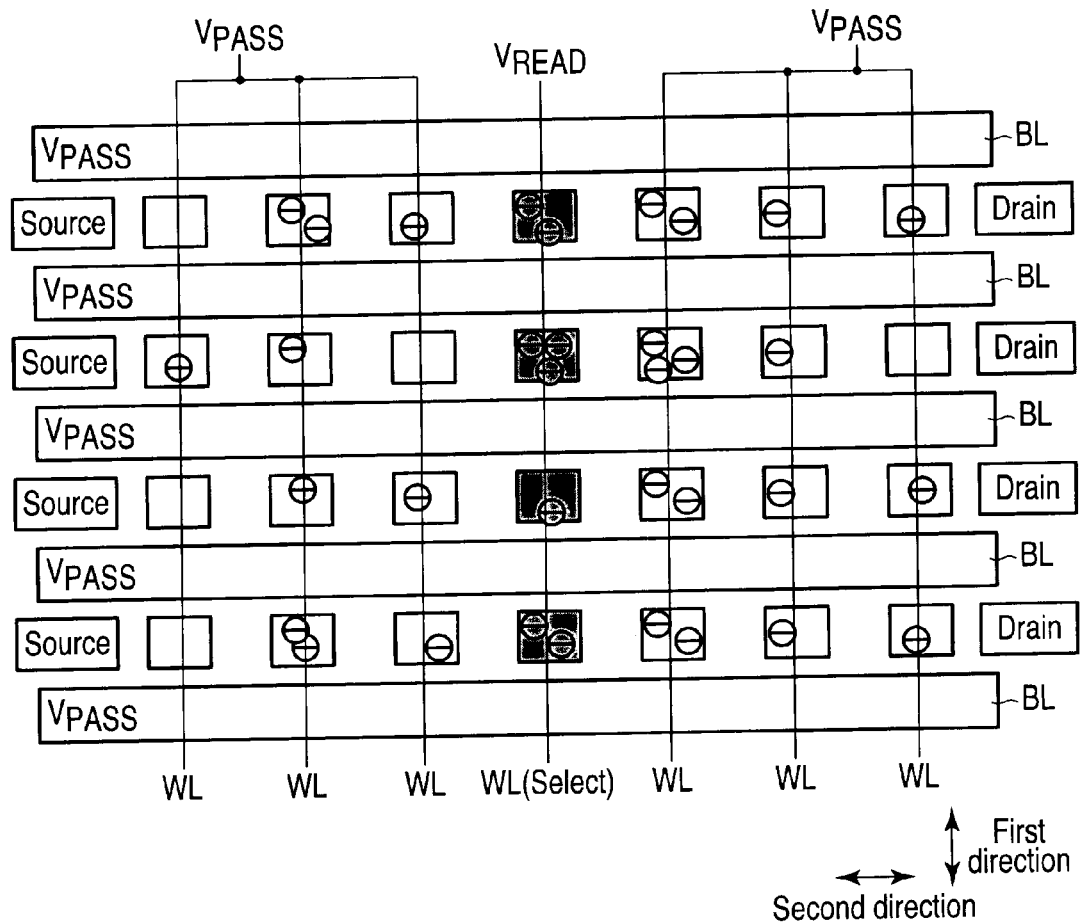
FIG. 37 is a diagram exemplifying a reading method.

FIG. 37 shows the reading method.

To read data of memory cells aligned in a row in the center, that is, the amount of charges stored inside the floating gates (a portion filled in with gray), the word line WL (Select) present above the floating gates is set to VREAD and other word lines WL, . . . to VPASS. The bit lines BL, . . . present on the left and right sides of the floating gates are also set to VPASS.

VREAD should be a value so that on/off of a memory cell is determined in accordance with the amount of charges inside a floating gate and VPASS should be a value so that a memory cell is always on regardless of the amount of charges inside a floating gate. For example, VREAD<VPASS.

By detecting a cell current flowing between a source region (Source) and a drain region (Drain) in this state, data in the memory cells aligned in a row in the center can be read.

Figure 38:
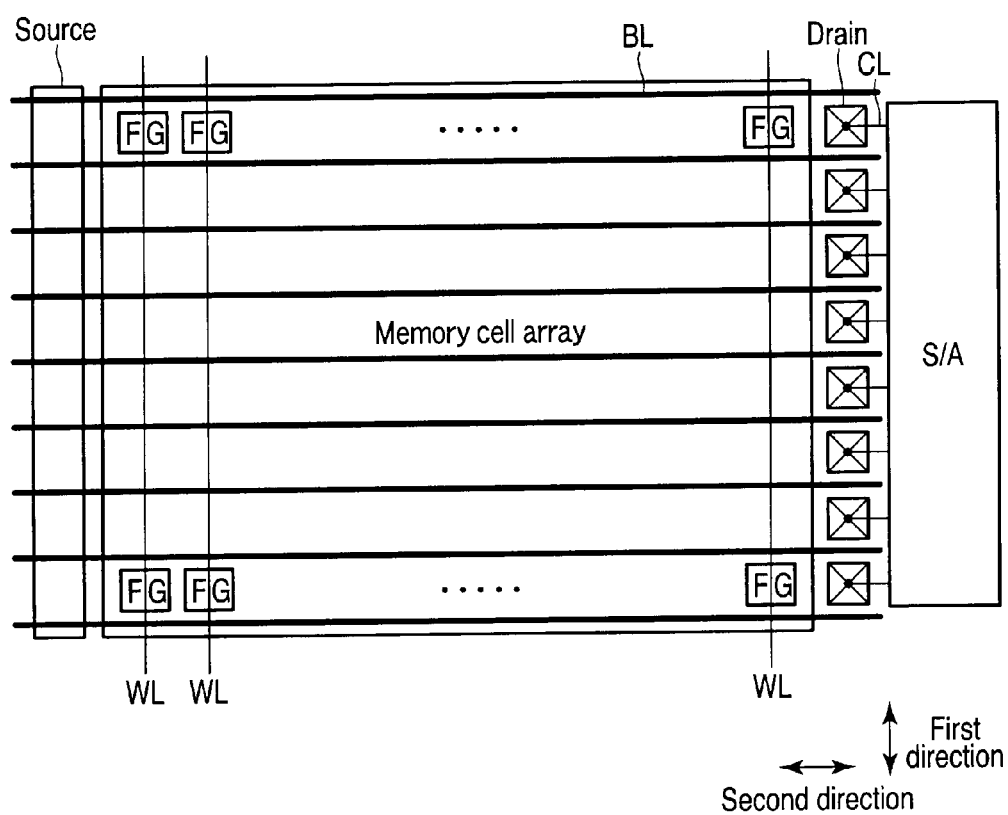
FIGS. 38 and 39 are diagrams, each showing a structure of a memory cell array.

If the source region and drain region are arranged on both sides of a memory cell array, as shown in FIG. 38, for example, there is no need to arrange a conductive wire CL for connecting the drain region (Drain) and a sense amplifier (S/A) on the memory cell array.

Moreover, since no select gate transistor is needed in a memory cell array, for example, a memory cell array can be realized by a cell structure as shown in FIG. 20A, 20B or FIG. 21A, 21B.

However, considering increases in capacity of a memory cell array, a vast number of memory cells will be needed to connect between the source region and the drain region. In this case, resistance between the source region and the drain region increases during reading, causing sense sensitivity to decrease.

Figure 39:
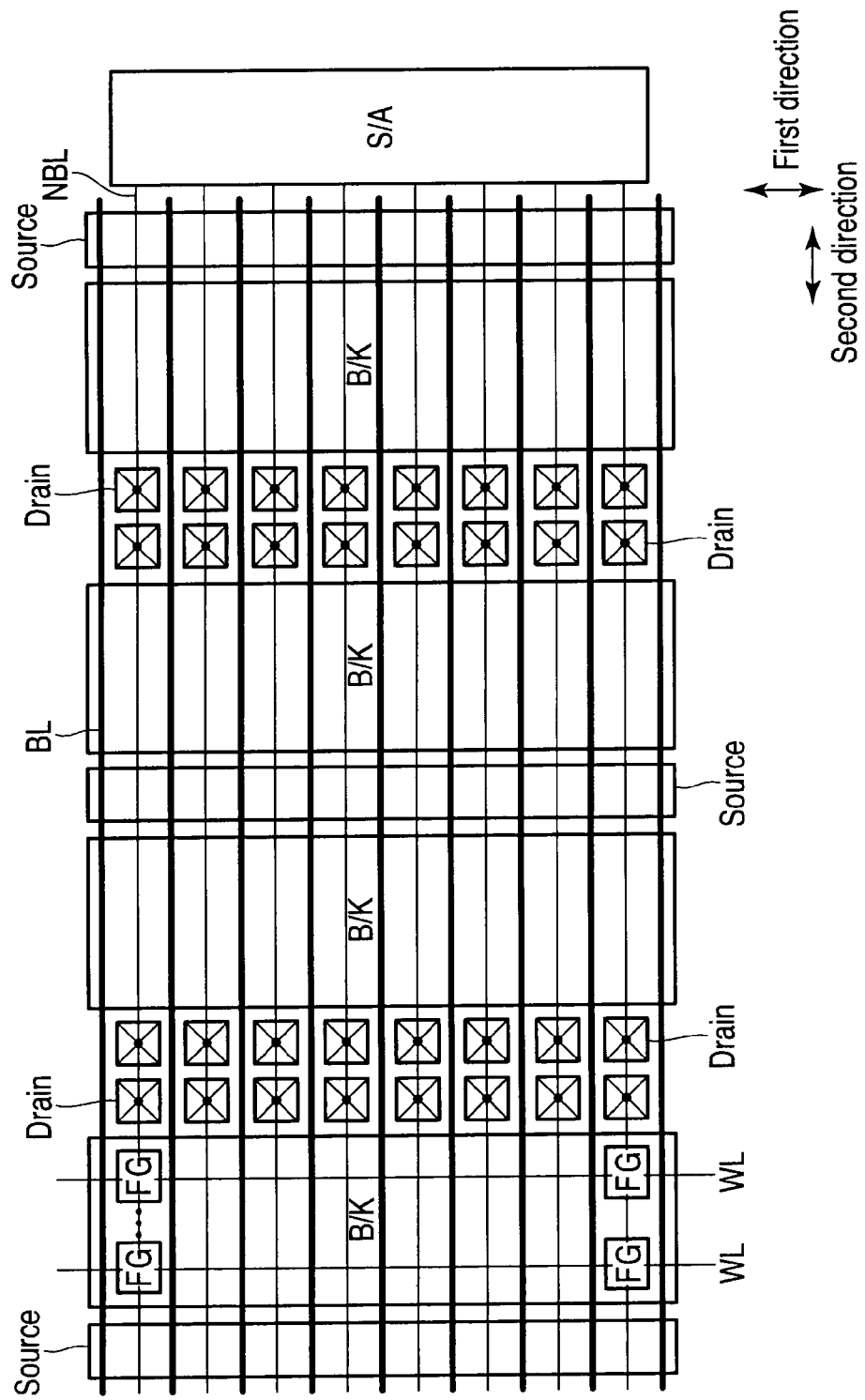

Thus, as shown in FIG. 39, the memory cell array may be blocked. In this case, like a NAND type flash memory, new bit lines (conductive wires) NBL, . . . extending in the second direction common to a plurality of blocks BK, . . . are provided on the memory cell array. The new bit line NBL connects the drain region (Drain) and sense amplifier (S/A) in the plurality of blocks BK, . . . .

The new bit line NBL is different from the bit lines BL present on the left and right sides of the floating gate.

If a memory cell array is blocked, as described above, a select gate transistor will be needed inside the memory cell array and thus, a memory cell array will be realized by a cell structure as shown in FIG. 20C or FIG. 21C.

FIGS. 40A and 40B and FIGS. 41A and 41B each show a mutually different NAND row extracted from the memory cell array in FIG. 37.

FIGS. 40A and 41A are plan views of the NAND row and FIGS. 40B and 41B are sectional views of the NAND row in the second direction.

The memory cells MC, . . . are directly connected between the source region (Source) and the drain region (Drain). Although the present example has no diffusion layer of the memory cells MC, . . . in the semiconductor substrate, diffusion layers (dotted line) of the memory cells MC, . . . may be formed in the semiconductor substrate when needed.

VREAD is applied to the word line WL (Select) on the selected memory cell MC (Select) and VPASS to other word lines WL, when the memory cell MC (Select) present in the center of a NAND row is selected.

As is evident from FIG. 37, the memory cell MC (Select) present in the center of the NAND row in FIG. 40 and the memory cell MC (Select) present in the center of the NAND row in FIG. 41 are commonly connected to the word line WL (Select). That is, like a NAND flash memory, data of a plurality of memory cells (for example, one or a plurality of pages) can simultaneously be read from a multi-dot flash memory of the present invention.

FIGS. 42A and 42B show a modification of the reading method.

This modification is characterized by values of the VPASS and VREAD, and VPASS is set to the supply voltage VDD and VREAD to −VDD/2. Otherwise, the modification is as shown in FIGS. 37 through 41.

FIG. 43 is a modification of the NAND row.

This modification is characterized by the number of memory cells constituting the NAND row. Naturally, the number of cells in the NAND row need not be five. This is only an example. Otherwise, the modification is as shown in FIGS. 37 through 41.

In this example, if the width of the word lines WL, . . . is constant, interference between the word lines is minimized by broadening the pitch of the word lines WL, . . . to prevent reading disturbances.

FIGS. 44 and 45 are examples of broadening the pitch of the bit lines BL, . . . .

Here, the resistance of the bit lines BL, . . . can be made lower by broadening the width of the bit lines BL, . . . . Also, by broadening the pitch of the bit lines BL, . . . , the width of the active area AA in the first direction is allowed to have degrees of freedom.

For example, in the example in FIG. 44, the active area AA is set to the minimum width and the floating gate FG has the same width as that of the active area AA. In contrast, in the example in FIG. 45, the active area AA is made broader than the minimum width and the width of the floating gate FG is made narrower than that of the active area AA.

While a contribution is made to facilitate manufacturing processes by broadening the width of the active area AA in the first direction, an off-leak increases if the width is broadened too much because control over the active area AA by charges stored in the floating gate FG becomes weaker.

Thus, the optimal width of the active area AA in the first direction is determined by trading off manufacturing processes against off-leaks.

Structurally, the width of the active area AA in the first direction needs to be made narrower than that between the center of the bit line BL present on the left side of the floating gate FG and a center of the bit line BL present on the right side thereof.

FIGS. 46A and 46B schematically show a cell structure according to the present invention.

FIG. 46A is a sectional view along the first direction in which a word line extends and FIG. 46B is a sectional view along the second direction in which a bit line extends. An equivalent circuit of a memory cell of the multi-dot flash memory in the present invention created from this schematic diagram is as shown in FIG. 47.

Figure 48:
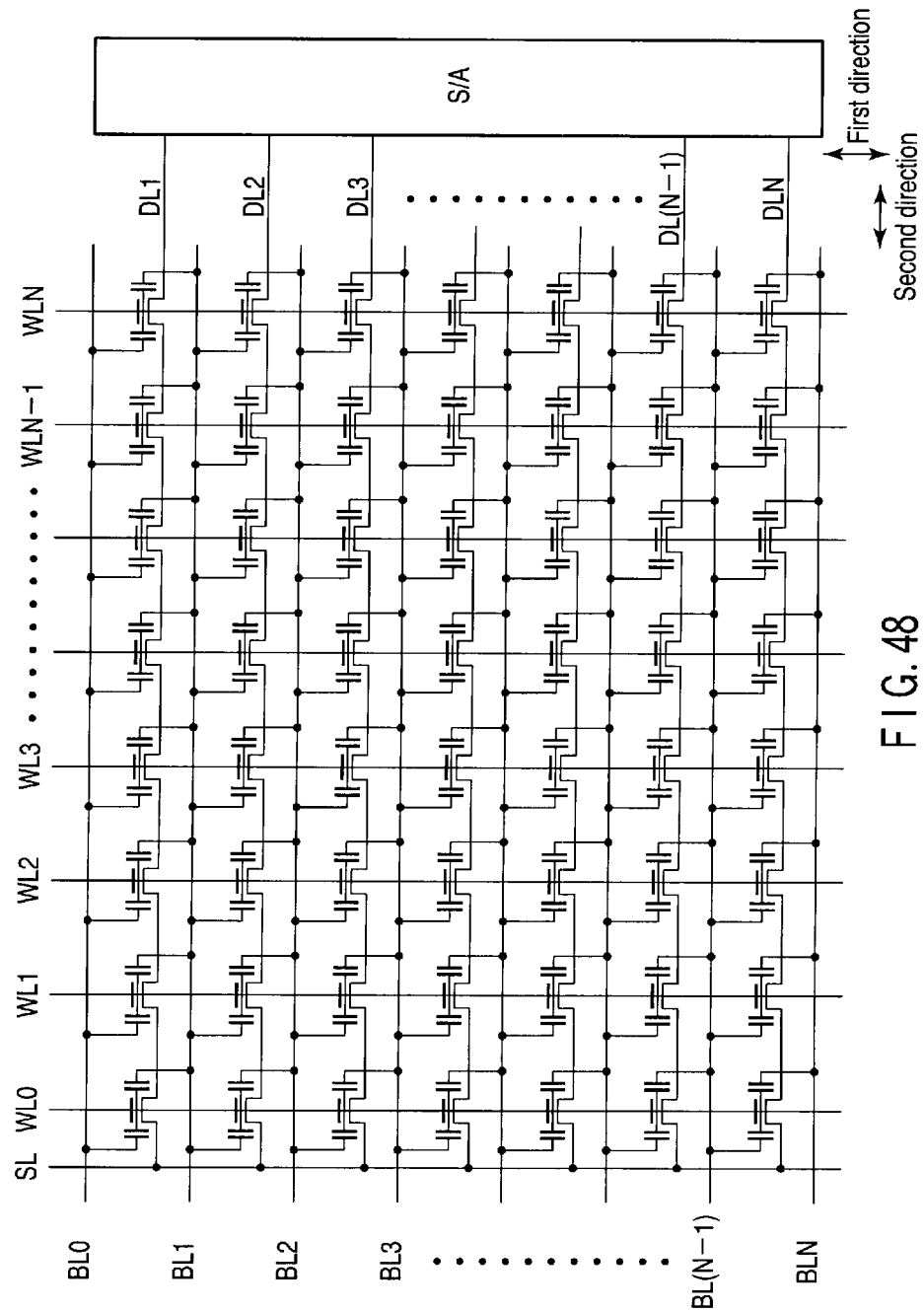
FIG. 48 is a circuit diagram showing a memory cell array according to the invention.

FIG. 48 is a circuit diagram of a memory cell array of the multi-dot flash memory in the present invention drawn by using the equivalent circuit in FIG. 47.

In the present example, (N+1) word lines WL0, WL1, , , , , WLN and (N+1) word lines BL0, BL1, , , , , BLN are arranged on the memory cell array. N data lines DL1, DL2, , , , , DLN connect the drain region at one end of N NAND rows and a sense amplifier (S/A).

As described above, programming/erasing of a multi-dot flash memory according to the present invention is performed by random access. Reading is characterized in that a plurality of memory cells connected to one word line WLi are read simultaneously and a plurality of memory cells in a NAND row are accessed one by one.

A multi-dot flash memory according to the present invention has, as described above, both properties of a NAND flash memory and those of a NOR flash memory and at the same time, embodies a new architecture different from both.

(2) Second Embodiment

FIG. 49 is a bird's-eye view showing a memory cell array of a multi-dot flash memory. FIG. 50 is a sectional view in the first direction of the memory cell array in FIG. 49.

The second embodiment is characterized in that the word lines WL, . . . are arranged directly on the bit lines BL, . . . without control gates. That is, the word lines WL, . . . are arranged on the floating gates FG, . . . via inter-electrode insulating films. Otherwise, the cell structure is the same as that in the first embodiment (FIGS. 13 and 14).

In a multi-dot flash memory having the structure described above, as shown in FIG. 50, charges can be injected/discharged into/from the floating gate FG by controlling the gate voltage VG applied to the word line WL, the voltage V1 applied to the left bit line BL (L), and the voltage V2 applied to the right bit line BL (R).

Size relations among these voltages are assumed to be, for example, (a) V2 (positive voltage)>V1 (negative voltage), VG>0 V and (b) V1 (positive voltage)>V2 (negative voltage), VG>0 V. The case of (a) will be described below.

Figure 51:
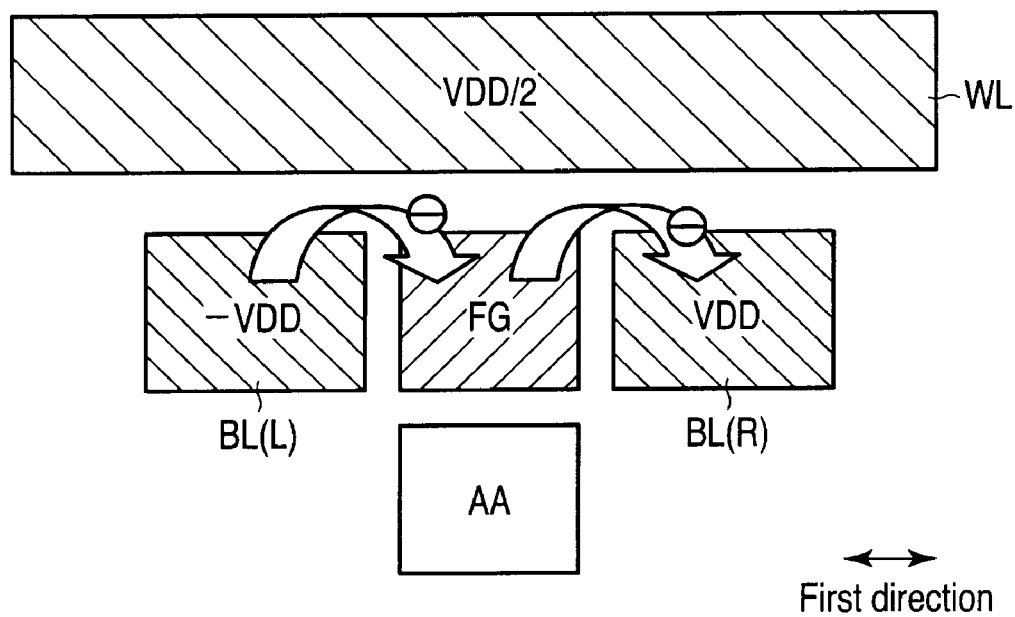

More specifically, as shown in FIG. 51, VG=VDD/2, V1=−VDD, and V2=VDD are set for programming, where VDD is a supply voltage. In this case, electrons are injected from the left bit line BL (L) into the floating gate FG and also a portion thereof is discharged from the floating gate FG into the right bit line BL (R).

Figure 52A:
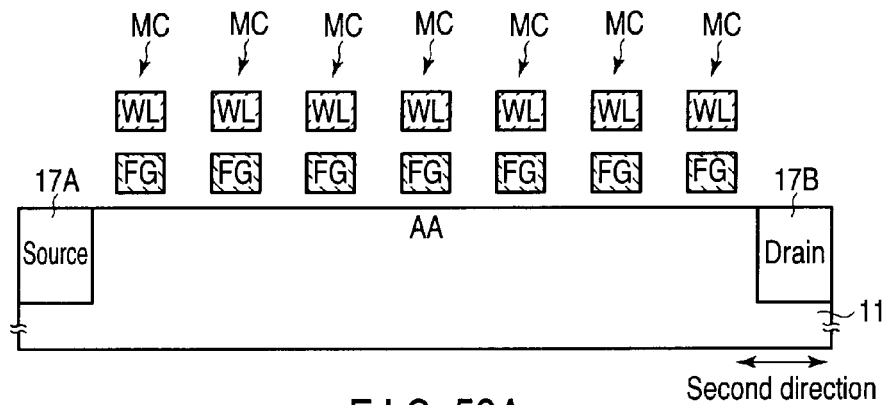
FIGS. 52A to 52C are diagrams, each showing a modification of a device structure in the second embodiment.
Figure 52B:
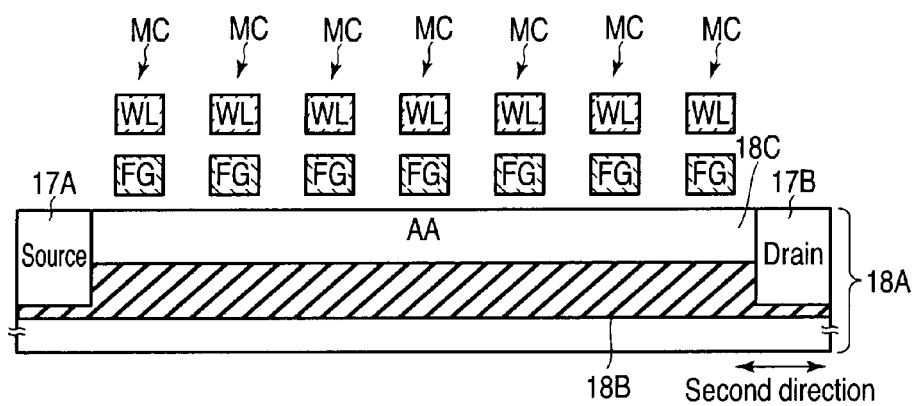
Figure 52C:
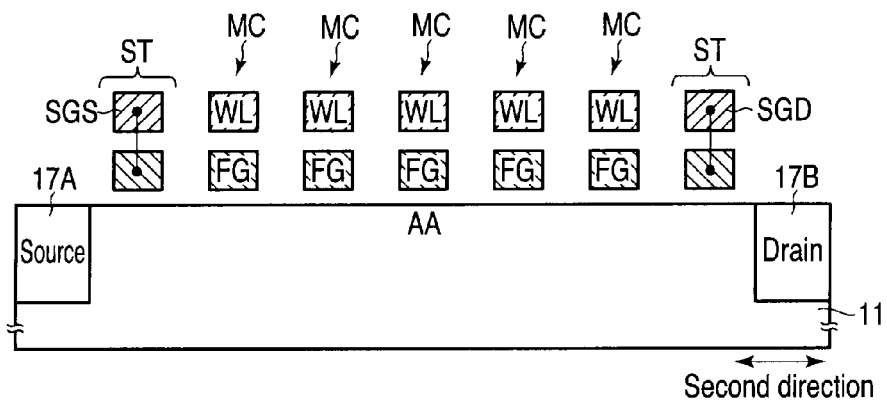

FIGS. 52A to 52C each show a cross section of the multi-dot flash memory in the second direction.

FIG. 52A is an example in which the semiconductor substrate (for example, a silicon substrate) 11 is made the active area AA and FIG. 52B is an example in which the semiconductor layer 18C on the insulating layer 18B in the SOI substrate 18A is made the active area AA.

FIG. 52C is a modification of the cell structure of the FIG. 52A and is an example in which the select gate transistor ST is arranged between a NAND row (memory cells MC) and the source/drain diffusion layers (Source/Drain) 17A, 17B.

FIGS. 53 and 54 are other examples in which a word line itself is used as a control gate.

The width of the active area AA and that of the bit line BL are the same as those shown in FIGS. 44 and 45. FIGS. 53 and 54 correspond to FIGS. 44 and 45, respectively.

The resistance of the bit lines BL, . . . can be made lower by broadening the width of the bit lines BL, . . . . Also, by broadening the pitch of the bit lines BL, . . . , the width of the active area AA in the first direction is enabled to have degrees of freedom.

While a contribution is made to facilitate manufacturing processes by broadening the width of the active area AA in the first direction, an off-leak increases if the width is broadened too much because control over the active area AA by charges stored in the floating gate FG becomes weaker.

Thus, the optimal width of the active area AA in the first direction is determined by trading off manufacturing processes against off-leaks.

Structurally, the width of the active area AA in the first direction needs to be made narrower than that between the center of the bit line BL present on the left side of the floating gate FG and the center of the bit line BL present on the right side thereof.

Moreover, manufacturing processes can be simplified by using the word line WL itself as a control gate without providing the control gate CG individually on the floating gate FG.

The programming method, erasing method, and reading method are the same as those in the first embodiment and therefore, descriptions thereof are omitted here.

In addition, modifications described in the first embodiment can also be implemented in the second embodiment.

(3) Third Embodiment

FIGS. 55 and 56 are bird's eye views showing a memory cell array of a multi-dot flash memory.

The third embodiment is characterized in that the cell structure in the first embodiment and that in the second embodiment are made three-dimensional.

That is, in FIG. 55, cell structures (FIG. 13) in the first embodiment are stacked in a third direction, which is a direction perpendicular to the surface of the semiconductor substrate. In FIG. 56, cell structures (FIG. 49) in the second embodiment are stacked in the third direction, which is a direction perpendicular to the surface of the semiconductor substrate.

To realize such structures, for example, active areas need to be formed from a semiconductor layer of the SOI substrate. The semiconductor layer should be a polysilicon layer or a single crystal silicon layer created by recrystallizing a polysilicon layer.

More specifically, a first memory cell array, which is the lowest, is formed on the SOI substrate, a first insulating layer is formed thereon, and a semiconductor layer, which is to be an active area of a second memory cell array, is formed on the first insulating layer. A third memory cell array and subsequent ones may be formed like the second memory cell array.

Thus, making a multi-dot flash memory three-dimensional is achieved to realize a further increase in memory capacity.

(4) Fourth Embodiment

The fourth embodiment relates to a decode circuit for programming, erasing, and reading.

FIG. 57 shows an example of a peripheral circuit for driving a three-dimensional memory cell array in the third embodiment.

A plurality of stacked memory cell arrays ARRAY 1, , , , , ARRAY M−1, and ARRAY M are arranged on a semiconductor substrate (for example, an SOI substrate) 20. The structure of the plurality of memory cell arrays ARRAY 1, , , , , ARRAY M−1, and ARRAY M is the same as that in the third embodiment.

Word line decoders 21A and 21B, a bit line decoder 22, a data line decoder 23, and a memory cell array switching circuit (Layer Exchanger) 24 are also arranged as peripheral circuits on the semiconductor substrate 20.

The word line decoder 21A is arranged at one end of the memory cell arrays ARRAY 1 , , , , ARRAY M−1, and ARRAY M in the first direction and the word line decoder 21B is arranged at the other end of the memory cell arrays ARRAY 1, , , , , ARRAY M−1, and ARRAY M in the first direction. The word line decoders 21A and 21B drive word lines for programming, erasing, and reading.

The bit line decoder 22 is arranged at one end of the memory cell arrays ARRAY 1, , , , , ARRAY M−1, and ARRAY M in the second direction and the data line decoder 23 is arranged at the other end of the memory cell arrays ARRAY 1, , , , , ARRAY M−1, and ARRAY M in the second direction.

The bit line decoder 22 drives bit lines for programming and erasing. The data line decoder 23 drives data lines for reading.

The memory cell array switching circuit 24 is connected to each of the memory cell arrays ARRAY 1, , , , , ARRAY M−1, and ARRAY M.

Figure 58:
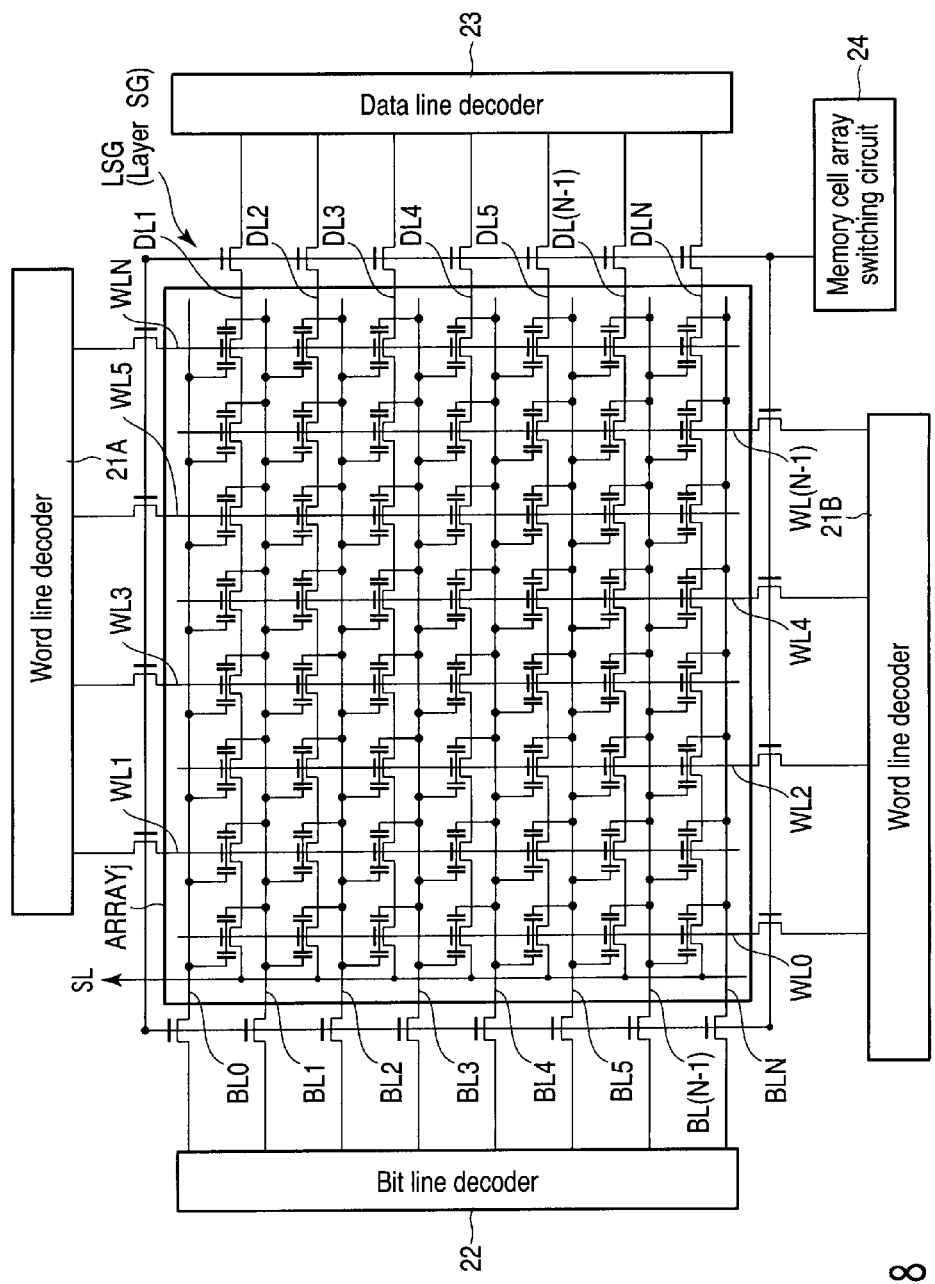
FIG. 58 is a diagram showing a memory cell array and peripheral circuits.

FIG. 58 shows one of a plurality of memory cell arrays in FIG. 57.

A layer select gate transistor LSG (Layer SG) for selecting a memory cell array ARRAYj is connected between the word line WL and the word line decoder 21A, 21B in the memory cell array ARRAYj, between the bit line BL and the bit line decoder 22 in the memory cell array ARRAYj, and between the drain region of the NAND row and the data line decoder 23 in the memory cell array ARRAYj.

On/off of the layer select gate transistor LSG is controlled by the memory cell array switching circuit 24.

The layer select gate transistor LSG is turned on when the memory cell array ARRAYj is selected, and the layer select gate transistor LSG is turned off when the memory cell array ARRAYj is not selected.

For example, one or a plurality of memory cell arrays among the plurality of memory cell arrays ARRAY 1, , , , , ARRAY M−1, and ARRAY M stacked on the semiconductor substrate 20 in FIG. 57 is selected in accordance with each mode of programming/erasing/reading.

Figure 59:
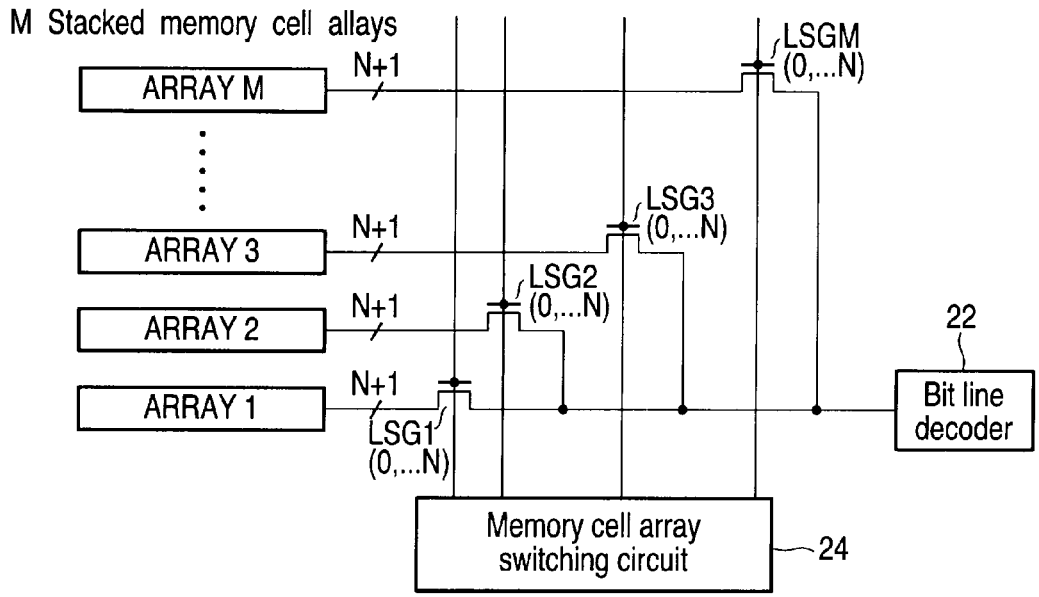
FIGS. 59 to 62 are diagrams, each showing a switching method for a memory cell array.

FIG. 59 shows layer select gate transistors between the bit line decoder and memory cell arrays.

Each of the plurality of memory cell arrays ARRAY 1, ARRAY M−1, and ARRAY M has, for example, as shown in FIGS. 48 and 58, (N+1) bit lines. LSGM (0, . . . N) means (N+1) layer select gate transistors in the M-th memory cell array ARRAY M.

M is a natural number equal to 2 or greater and N is a natural number.

Figure 60:
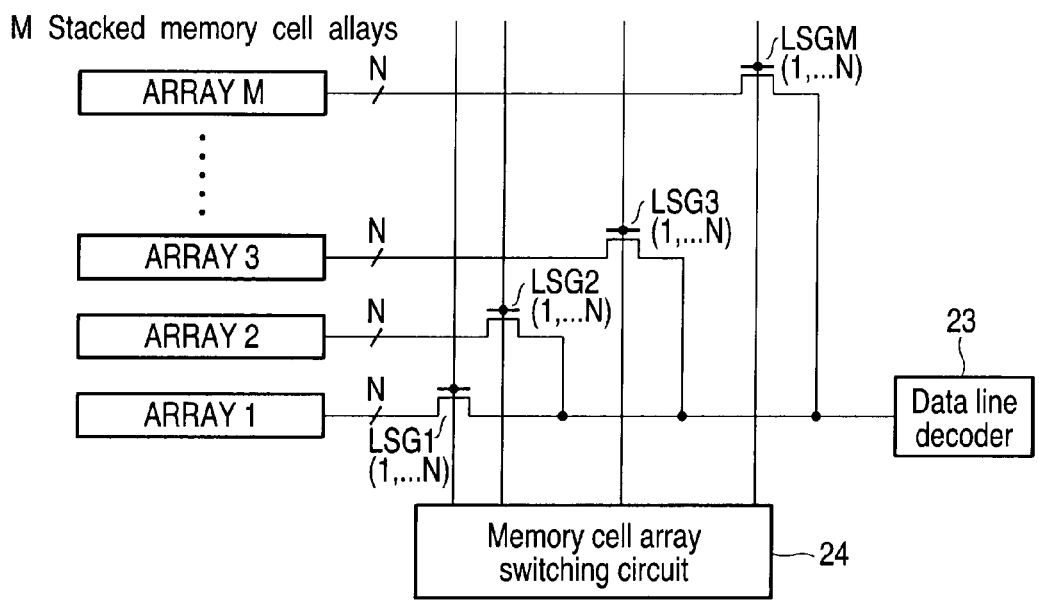

FIG. 60 shows layer select gate transistors between the data line decoder and memory cell arrays.

Each of the plurality of memory cell arrays ARRAY 1, , , , , ARRAY M−1, and ARRAY M has, for example, as shown in FIGS. 48 and 58, N data lines. LSGM (1, . . . N) means N layer select gate transistors in the M-th memory cell array ARRAY M.

M is a natural number equal to 2 or greater and N is a natural number.

Figure 61:
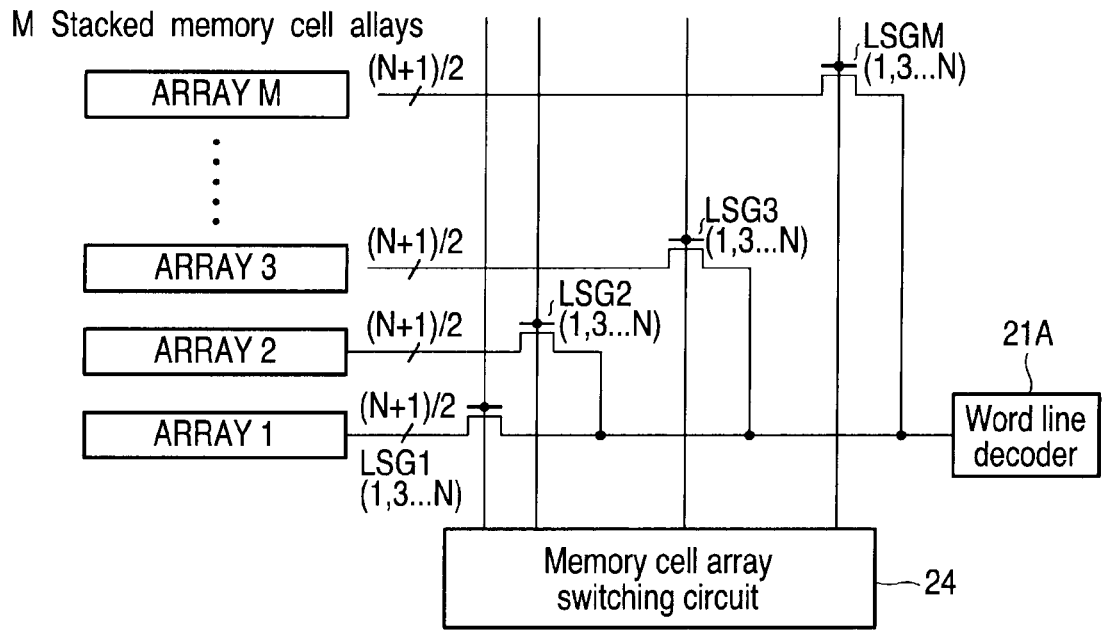
Figure 62:
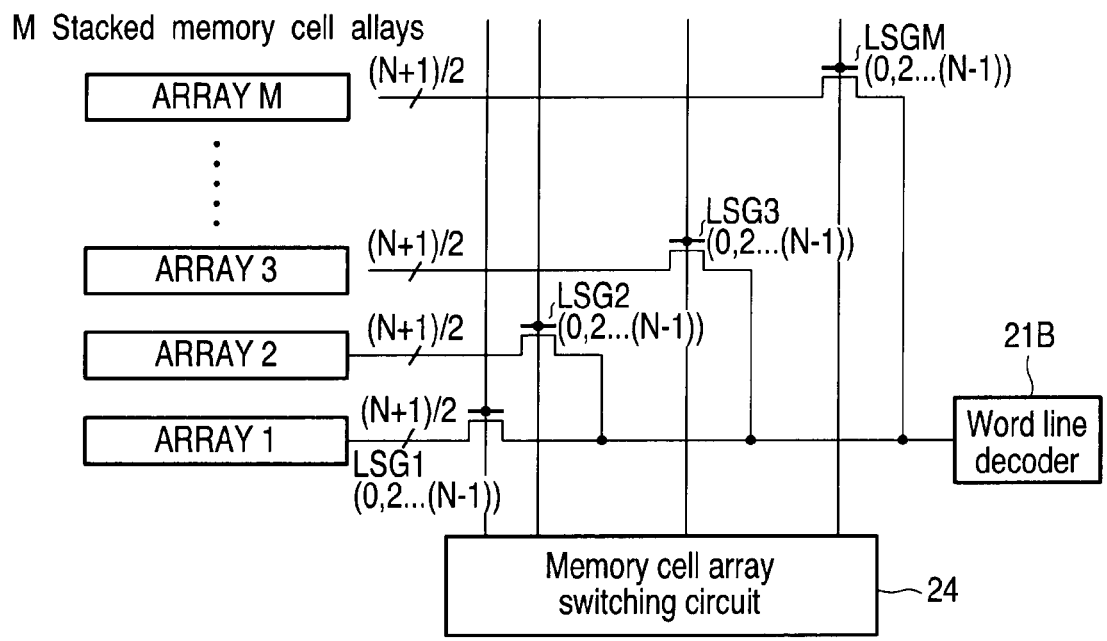

FIGS. 61 and 62 show layer select gate transistors between the word line decoder and memory cell arrays.

Each of the plurality of memory cell arrays ARRAY 1, , , , , ARRAY M−1, and ARRAY M has, for example, as shown in FIGS. 48 and 58, (N+1) word lines. The (N+1) word lines are divided, as shown in FIG. 58, into two groups, one of which is connected to the word line decoder 21A and the other to the word line decoder 21B.

LSGM (1, 3, . . . N) in FIG. 61 means [(N+1)/2] layer select gate transistors connected to the word line decoder 21A in the M-th memory cell array ARRAY M. LSGM (0, 2, . . . N−1) in FIG. 62 means [(N+1)/2] layer select gate transistors connected to the word line decoder 21B in the M-th memory cell array ARRAY M.

M is a natural number equal to 2 or greater and N is an odd number.

(5) Fifth Embodiment

The fifth embodiment relates to voltage conditions. In the present embodiment, simulation results about voltage conditions for programming are shown.

Figure 63:
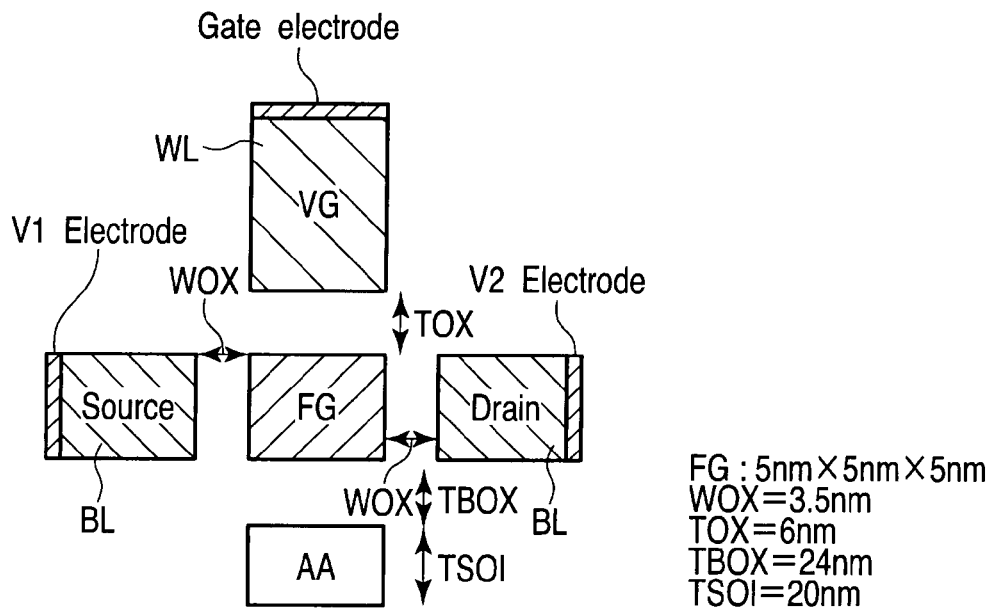
FIG. 63 is a diagram showing a sample used for simulation.

FIG. 63 is a sectional view of a sample.

It is assumed that the active area AA has a thickness TSOI of 20 nm, the gate insulating film has a thickness TBOX of 24 nm, the tunnel insulating film between the bit line BL and the floating gate FG has a thickness WOX of 3.5 nm, and the inter-electrode insulating film has a thickness TOX of 6 nm. Also, the floating gate FG is assumed to be a cube having the size of 5 nm×5 nm×5 nm.

The active area AA is formed from single crystal silicon, the gate insulating film, tunnel insulating film, and inter-electrode insulating film are each formed from silicon oxide, and the floating gate is formed from polysilicon.

Here, the bit line BL (L) present on the left side of the floating gate FG is defined as the source (Source) and the bit line BL (R) present on the right side is defined as the drain (Drain).

FIGS. 64 to 67 show simulation results by the sample shown in FIG. 63.

Figure 64:
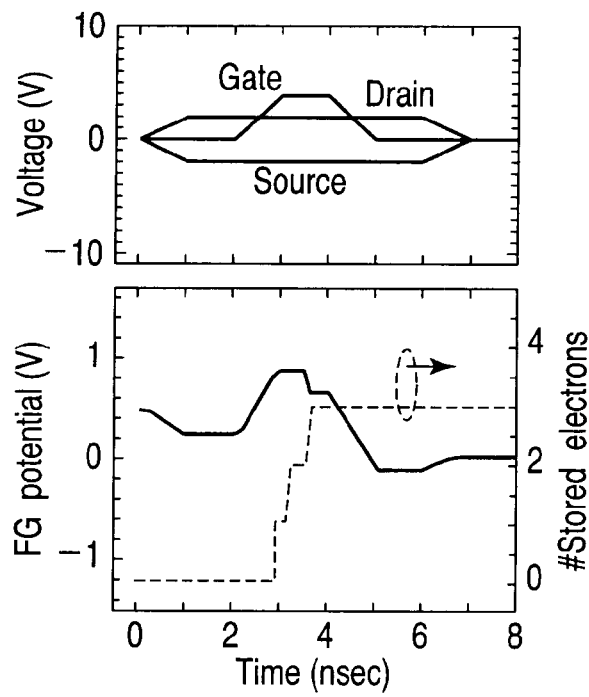

The simulation in FIG. 64 shows a calculation result when −2 V is applied to the source (Source), +2 V to the drain (Drain), and +4 V to the gate (Gate).

The number of electrons injected into the floating gate FG is three and a potential shift ΔVFB of the floating gate FG is about 0.5 V, that is, a threshold shift ΔVth in terms of gate voltage is about 0.6 V.

The simulation in FIG. 65 shows a calculation result when −3 V is applied to the source (Source), +3 V to the drain (Drain), and +2 V, +4 V, +6 V, and +8 V to the gate (Gate).

The number of electrons injected into the floating gate FG is always five regardless of the gate voltage and the potential shift ΔVFB of the floating gate FG is about 1.2 V, that is, the threshold shift ΔVth in terms of gate voltage is about 1.5 V.

Figure 66A:
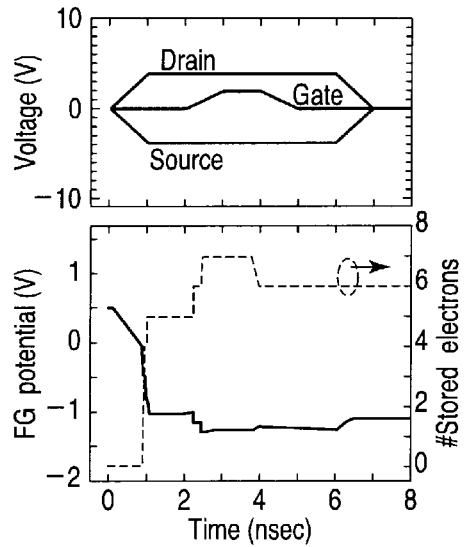
Figure 66B:
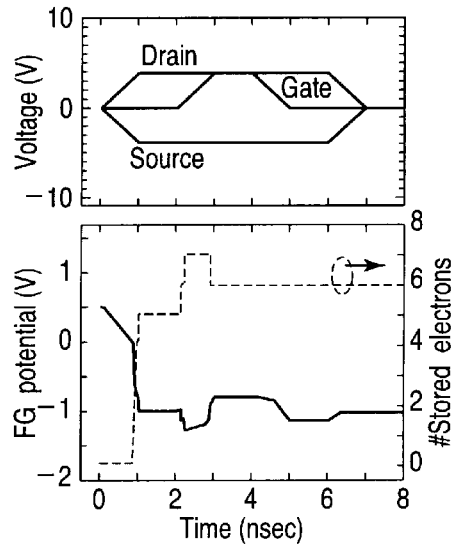

The simulation in FIG. 66 shows a calculation result when −4 V is applied to the source (Source), +4 V to the drain (Drain), and +2 V and +4 V to the gate (Gate).

The number of electrons injected into the floating gate FG is always six regardless of the gate voltage and the potential shift ΔVFB of the floating gate FG is about 1.5 V, that is, the threshold shift ΔVth in terms of gate voltage is about 2.0 V.

Figure 67A:
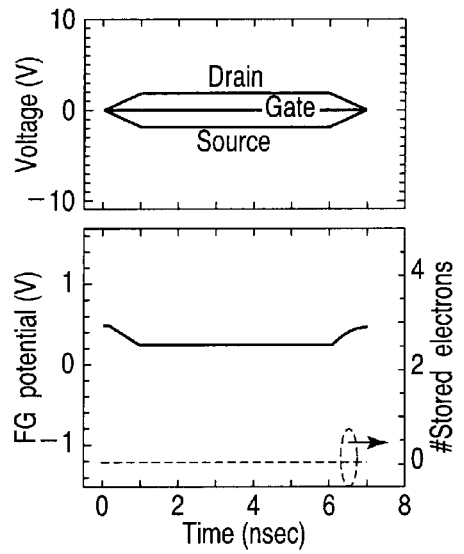
Figure 67B:
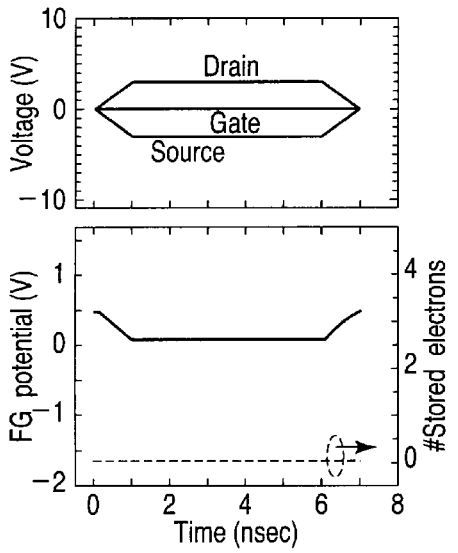

Thus, in a multi-dot flash memory according to the present invention, the number of electrons injected into the floating gate FG and the threshold shift remain unchanged even if the gate voltage fluctuates. If the gate voltage is 0 V, as shown in FIG. 67, electrons are naturally not injected into the floating gate FG.

This represents a fact that, rather than having no sensitivity to the gate voltage, a multi-dot flash memory according to the present invention is not affected by fluctuations in gate voltage.

Incidentally, regarding thermal fluctuations, room temperature corresponds to a potential difference of 0.026 V and 80° C. to that of 0.033 V. Thus, for example, the fact that the threshold shift does not change with respect to the amount of change in gate voltage of Δ2 V (±1 V) means that a multi-dot flash memory according to the present invention is not subject to thermal fluctuations.

FIG. 68 summarizes simulation results.

In contrast to the gate voltage, sensitivity developed by change in source/drain voltage is evident. The threshold shift per electron is about 0.2 V for the source/drain voltage ±2 V, about 0.3 V for the source/drain voltage ±3 V, and about 0.3 V for the source/drain voltage ±4 V.

This result indicates that each threshold shift value per electron is sufficiently larger than thermal energy at room temperature and 80° C. It is also clear from this fact that a multi-dot flash memory according to the present invention is not subject to thermal fluctuations.

Thus, when a single electron effect becomes noticeable, thermal fluctuations can be ignored. As is also evident from FIG. 68, multiple values can be introduced by adjusting the source/drain voltage.

One more thing evident from FIG. 68 is that a difference between the number of electrons (three) in the floating gate when the source/drain voltage is ±2 V and that of electrons (five) in the floating gate when the source/drain voltage is ±3 V is only two. That is, if fluctuations in voltage applied to each electrode are ±0.5 or less when multiple values can be introduced, no error in control of each electron occurs. This is a very advantageous property for realizing multiple values.

As described above, the permissible range of fluctuations in source/drain voltage is ±0.5 V and that of fluctuations in gate voltage is ±1 V. The fact that the permissible range of a fluctuation of word lines to which the gate voltage is applied is wider than that of fluctuations of bit lines to which the source/drain voltage is applied is one of the advantageous features of the application concerned, for the reasons given below.

As is evident from FIGS. 13 and 49, while the word lines WL, . . . are arranged mutually adjacent to each other via an insulating film, at least a three-layer structure of an insulating film—floating gate FG—insulating film is arranged between the bit lines BL, . . . .

This means that the capacity between bit lines is vastly smaller than that between word lines. Generally, fluctuations in voltage applied between two conductive wires can be made smaller as the capacity between the two conductive wires becomes smaller. That is, fluctuations in voltage of the bit lines BL, . . . whose permissible range of fluctuations is narrow can be made smaller.

Regarding the capacity between word lines, for example, as shown in FIG. 21, the capacity can be made smaller by broadening the space between the word lines WL, . . . .

(6) Sixth Embodiment

The sixth embodiment relates to a method of manufacturing a multi-dot flash memory according to the present invention.

The manufacturing method described here realizes a structure in which the layout shown in FIG. 39, that is, a memory cell array is blocked and a select gate transistor is connected to a NAND row.

FIGS. 69A to 69I show a method of manufacturing a multi-dot flash memory.

First, as shown in FIG. 69A, a first oxide film 31 is formed on a P-type silicon substrate (P-sub) 30. Also, as shown in FIG. 69B, an opening is formed in the first oxide film 31 where a select gate transistor is formed.

Next, as shown in FIG. 69C, a first amorphous silicon (1st a-Si) 32 is deposited onto the P-type silicon substrate 30 and the first oxide film 31 and, as shown in FIG. 69D, solid phase epitaxial growth (L-SPE) of the first amorphous silicon 32 is allowed in a lateral direction.

Moreover, as shown in FIG. 69E, the first amorphous silicon is crystallized to form a silicon film 32'. Subsequently, as shown in FIG. 69F, a second oxide film 33 is formed on the silicon film 32' and an opening is formed in the second oxide film 33 where a bit line contact is formed.

Next, as shown in FIG. 69G, a second amorphous silicon (2nd a-Si) 34 is deposited onto the silicon film 32' and the second oxide film 33 and, as shown in FIG. 69H, solid phase epitaxial growth (L-SPE) of the second amorphous silicon 34 is allowed in the lateral direction. Also, as shown in FIG. 69I, the second amorphous silicon is crystallized to form a silicon film 34'.

Here, in FIG. 69I, "BC" is an area in which a bit line contact is formed, "ST" is an area in which a select gate transistor is formed, and "MC" is an area in which a memory cell is formed.

A structure (double SOI structure) in which the two silicon films 32' and 34' are stacked via an insulating film is accomplished by the above processes.

Using this double SOI structure, a multi-dot flash memory according to the present invention is formed.

FIG. 70A is a bird's eye view extracting a periphery of a bit line contact in the double SOI structure in FIG. 69I.

FIG. 70A is different from FIG. 69I in that a P-type diffusion layer 35 is present in the silicon film 32' in a area in which a select gate transistor is formed and an N-type diffusion layer 36 is present in the silicon film 32' in a area in which a bit line contact is formed.

The P-type diffusion layer 35 becomes a channel area of the select gate transistor and the N-type diffusion layer 36 becomes a drain diffusion layer in a NAND row. The P-type diffusion layer 35 and the N-type diffusion layer 36 can be formed, for example, by performing ion implantation after the silicon film 32' is formed.

Subsequently, as shown in FIG. 70B, a photoresist of a line & space structure is formed and the silicon film 34' is etched by using the photoresist as a mask to form the silicon film 34' in the line & space structure extending in the first direction. Then, the photoresist is removed.

Next, as shown in FIG. 70C, a space between the silicon films 34' in the line & space structure is filled with an insulating film 37 by the CVD method and further, the insulating film 37 is polished by the CMP method until the upper surface of the insulating film 37 matches that of the silicon film 34'.

Moreover, as shown in FIG. 70D, a photoresist of a line & space structure is formed and the insulating film 37, the silicon film 34', the second oxide film 33, and the silicon film 32' are sequentially etched by using the photoresist as a mask.

As a result, the active areas AA, . . . in the line & space structure formed from the silicon film 32' and extending in the second direction are formed. In addition, the floating gates FG, . . . are formed above the active areas AA, . . . via the second oxide film (gate insulating film) 33.

In the bit line contact area BC, the N-type diffusion layer 36 in the silicon film 32' and the silicon film 34' are in contact.

Then, the photoresist is removed.

Figure 71A:
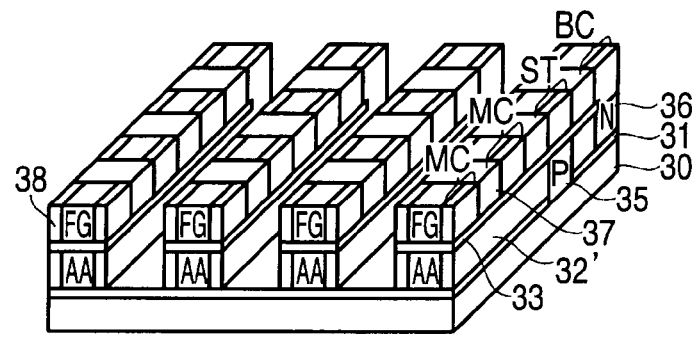

Next, as shown in FIG. 71A, a sidewall thermal oxide film 38 is formed on sidewalls of the active areas AA, . . . and the floating gates FG, . . . by the thermal oxidization method. The sidewall thermal oxide film 38 becomes a tunnel insulating film to be used for programming and erasing.

Figure 71B:
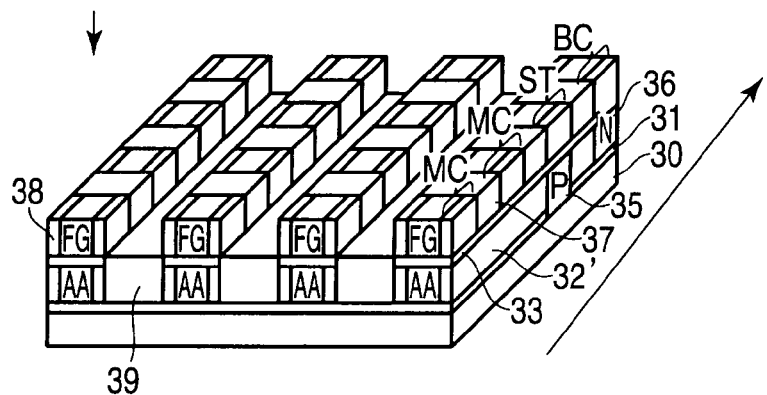

Also, as shown in FIG. 71B, a space between the active areas AA, . . . is filled with an insulating film 39.

Figure 71C:
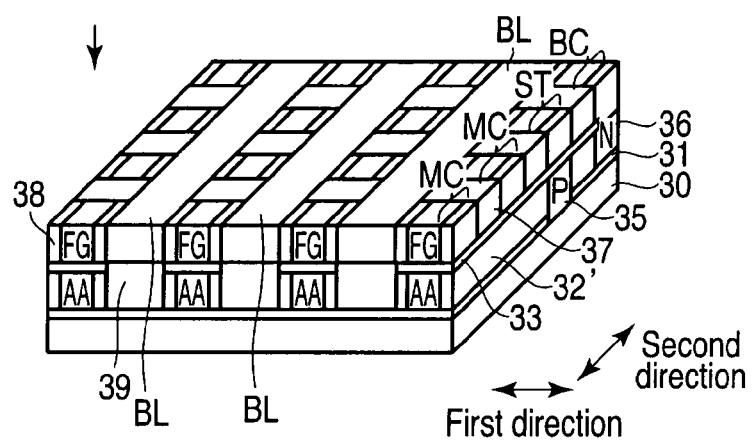

Subsequently, as shown in FIG. 71C, a space between the floating gates FG, . . . is filled with a conductive material by the CVD method and further, the conductive material is polished by the CMP method until the upper surface of the conductive material matches that of the floating gates FG, . . . .

As a result, the bit lines BL, . . . extending in the second directions are formed in the spaces between the floating gates FG, . . . .

Figures 71D, 71E, 71F:
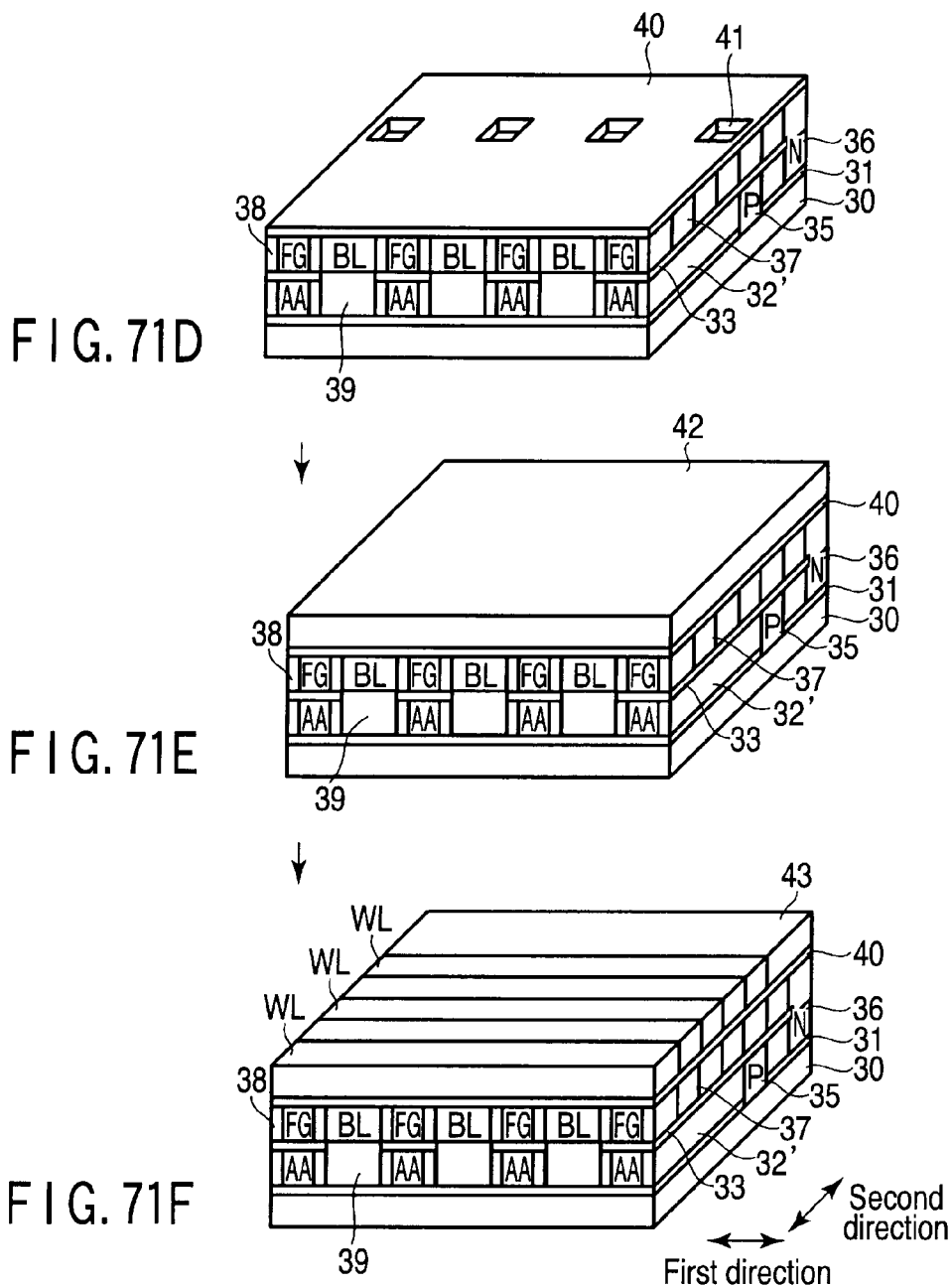

Next, as shown in FIG. 71D, an inter-electrode insulating film 40 is formed on the floating gates FG, . . . and the bit lines BL, . . . . Also, a portion of the inter-electrode insulating film 40 in an area in which a select gate transistor is formed is removed to form an opening 41.

Subsequently, as shown in FIG. 71E, a conductive material 42 is formed on the inter-electrode insulating film 40 by the CVD method.

Also, as shown in FIG. 71F, a photoresist of a line & space structure is formed and the conductive material 42 shown in FIG. 71E is etched by using the photoresist as a mask to form the word lines WL, . . . in the line & space structure extending in the first direction. Then, the photoresist is removed.

Also, a space between the word lines WL, . . . is filled with an insulating film 43 by the CVD method and further, the insulating film 43 is polished by the CMP method until the upper surface of the insulating film 43 matches that of the word lines WL, . . . .

Lastly, as shown in FIG. 72, an inter-electrode (not shown) is formed on the word lines WL, . . . and the word lines WL, . . . and further, a bit line contact 44 is formed which is electrically connected to the N-type diffusion layer (drain diffusion layer) 36 via the silicon film 34'.

Here, the bit line contact 44 is electrically connected, for example, to the conductive wire CL in FIG. 39. The word "bit line contact" is made to correspond to the NAND flash memory and is not a contact to a bit line in a multi-dot flash memory according to the present invention.

FIG. 73 shows a sectional view of a device structure accomplished by the above manufacturing method. The source side of the NAND row is omitted in FIG. 73.

As is evident from FIG. 73, the cross section along the second direction (the direction in which bit lines extend) of the multi-dot flash memory according to the present invention is almost the same as that of a NAND flash memory. That is, development costs can be maintained at a low level by applying technology for manufacturing the NAND flash memory.

In the above manufacturing method, materials of insulating films and conductive films can suitably be selected in consideration of device specifications and the like. Moreover, materials of nitride films or oxynitride films may also be used instead of those of oxide films.

Regarding structures, modifications such as forming a polysilicon layer to be a control gate immediately below word lines and forming word lines in a three-dimensional hound's-tooth check as shown in FIGS. 20 and 21 may easily be thought out from the above manufacturing method.

A floating gate need not be a silicon dot. A floating gate may be obtained by forming silicide, metal, non-metal and the like into a dot shape. If the dot size is 30 nm×30 nm×30 nm or less, a multi-dot flash memory can be realized based on the principle specific to the present invention.

Further, the size of a floating gate is preferably 20 nm×20 nm×20 nm or less if the single electron effect against fluctuations as described in the fifth embodiment should be utilized. By utilizing the single electron effect, a multi-dot flash memory resistant to fluctuations can be provided.

A new architecture (FIGS. 48 and 58) proposed in the present invention can still be realized even if the size exceeds 20 nm×20 nm×20 nm where the single electron effect cannot be utilized.

The select gate transistor can be omitted, but it is preferable in that case to adopt the SOI structure to make a semiconductor layer on an insulating layer thinner than a depth of a source/drain diffusion layer.

Examples of the present invention are not limited to the above embodiments and the present invention can be embodied by modifying each component without departing from the spirit thereof. Moreover, various inventions can be produced by suitably combining a plurality of components disclosed by the above embodiments. For example, some components may be deleted from all components disclosed by the above embodiments or components from different embodiments may be combined.

The present invention brings great industrial advantages to fast randomly programmable file memories, fast downloadable portable terminals, fast downloadable portable players, semiconductor memories for broadcast equipment, drive recorders, home video, large-capacity buffer memories for communication, semiconductor memories for security cameras, and the like.

What is claimed is:

1. A multi-dot flash memory comprising:
an active area;
a floating gate on the active area via a gate insulating film and having a first side and a second side facing each other in a first direction;
a word line on the floating gate via an inter-electrode insulating film;
a first bit line on the first side of the floating gate via a first tunnel insulating film and extending in a second direction intersecting the first direction; and
a second bit line on the second side of the floating gate via a second tunnel insulating film and extending in the second direction, wherein
the active area has a width in the first direction narrower than that between a center of the first bit line and a center of the second bit line.

2. The memory of claim 1, further comprising a control gate arranged between the floating gate and the word line.

3. The memory of claim 1, wherein the word line functions also as the control gate.

4. The memory of claim 1, wherein the active area extends in the second direction and has source/drain layers at ends thereof.

5. The memory of claim 1, wherein electrons are charged into the floating gate from the first bit line and discharged from the floating gate into the second bit line.

6. The memory of claim 1, wherein electrons are charged into the floating gate and discharged from the floating gate by applying a voltage to between the first and second bit lines and then applying a gate voltage to the word line.

7. The memory of claim 1, wherein electrons are charged into the floating gate by applying a negative voltage to the first bit line and a positive voltage to the second bit line and the word line.

8. The memory of claim 1, wherein electrons are discharged from the floating gate by applying a negative voltage to the first bit line and the word line and a positive voltage to the second bit line.

9. The memory of claim 1, wherein an amount of charges in the floating gate is detected while a reading voltage that determines on/off is applied to the word line.

10. The memory of claim 1, wherein the floating gate has a size of 20 nm×20 nm×20 nm or less.

11. The memory of claim 1, wherein the first tunnel insulating film is used as a tunnel insulating film for programming and the second tunnel insulating film is used as a tunnel insulating film for erasing.

12. A multi-dot flash memory comprising:
active areas arranged by being aligned in a first direction and extending in a second direction intersecting the first direction;
source/drain layers arranged at ends in the second direction of the active areas;
floating gates on the active areas via a gate insulating film and arrayed in the first and second directions;
word lines on the floating gates via an inter-electrode insulating film and extending in the first direction; and
bit lines arranged by being aligned in the first direction, extending in the second direction, and arranged between the floating gates via a tunnel insulating film, wherein
the bit lines and the floating gates are arranged alternately in the first direction.

13. The memory of claim 12, further comprising control gates arranged between the floating gates and the word lines.

14. The memory of claim 12, wherein the word lines function also as the control gate.

15. The memory of claim 12, wherein the active areas are formed of a semiconductor layer on an insulating layer in an SOI substrate.

16. The memory of claim 12, wherein the floating gates aligned in the second direction is a portion of memory cells constituting a NAND row.

17. The memory of claim 16, wherein a select gate transistor is arranged between the NAND row and the source/drain layer.

18. A multi-dot flash memory comprising:
memory cell arrays stacked on a semiconductor substrate;
a peripheral circuit formed in the semiconductor substrate; and
a memory cell array switching circuit formed in the semiconductor substrate to electrically connect a memory cell array selected from the memory cell arrays to the peripheral circuit, wherein
each of the memory cell arrays includes:
active areas arranged by being aligned in a first direction and extending in a second direction intersecting the first direction;
source/drain layers arranged at ends in the second direction of the active areas;
floating gates on the active areas via a gate insulating film and arranged in the first and second directions like an array;
word lines on the floating gates via an inter-electrode insulating film and extending in the first direction; and
bit lines arranged by being aligned in the first direction, extending in the second direction, and arranged between the floating gates via a tunnel insulating film, and
the bit lines and the floating gates are arranged alternately in the first direction.

* * * * *